US008243402B2

(12) United States Patent  (10) Patent No.: US 8,243,402 B2
Benoit et al. (45) Date of Patent: *Aug. 14, 2012

(54) PLUG TAIL SYSTEMS

(75) Inventors: John Benoit, Montpelier, VT (US);
Richard Weeks, Little York, NY (US);
Gerald R. Savicki, Canastota, NY (US)

(73) Assignee: Pass and Seymour, Inc., Syracuse, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 13/029,846

(22) Filed: Feb. 17, 2011

(65) Prior Publication Data

US 2011/0222195 A1 Sep. 15, 2011

Related U.S. Application Data

(63) Continuation of application No. 12/861,618, filed on Aug. 23, 2010, which is a continuation of application No. 12/123,866, filed on May 20, 2008, now Pat. No. 7,780,470, which is a continuation-in-part of application No. 11/531,812, filed on Sep. 14, 2006, now Pat. No. 7,713,084, which is a continuation-in-part of application No. 11/274,817, filed on Nov. 15, 2005, now Pat. No. 7,407,410, which is a continuation-in-part of application No. 11/032,420, filed on Jan. 10, 2005, now Pat. No. 7,189,110, which is a continuation of application No. 10/680,797, filed on Oct. 7, 2003, now Pat. No. 6,994,585.

(51) Int. Cl.
*H02H 3/00* (2006.01)
(52) U.S. Cl. .......................................... 361/42
(58) Field of Classification Search ...................... 361/42
See application file for complete search history.

(56) References Cited

U.S. PATENT DOCUMENTS 2,433,917 A 1/1948 McCartney
2,895,119 A 7/1959 Montgomery, Jr.
(Continued)

OTHER PUBLICATIONS

Richter et al., Practical Electrical Wiring, 1993, 16th Edition, McGraw-Hill, U.S.; pp. 137-139, 176-177, 507-510.

(Continued)

*Primary Examiner* — Stephen W Jackson
(74) *Attorney, Agent, or Firm* — Daniel P. Malley; Bond Schoeneck & King

(57) ABSTRACT

The present invention is directed to an electrical wiring system for use in an AC electrical power distribution circuit including at least one first AC power conductor disposed between an upstream AC power element and a device box and at least one second AC power conductor disposed between the device box and a downstream AC power element. The at least one first AC power conductor and the at least one second AC power conductor are routed into an interior portion of the device box and accessible via a front open face of the device box. The system includes a connector device including a connector housing having a plurality of connector contacts disposed therein. The plurality of connector contacts are coupled to termination structures configured to couple the at least one first AC power conductor and the at least one second AC power conductor to corresponding contacts of the plurality of connector contacts. An electrical wiring device includes a device housing having a front portion and a rear portion. The front portion includes at least one user-accessible control element disposed thereon. The at least one user-accessible control element is coupled to an electrical switch mechanism disposed in the device housing and coupled to a plurality of device contacts. The plurality of device contacts are accessible by way of a device connection arrangement formed in the rear portion of the device housing. The plurality of device contacts are configured to mate with the plurality of connector contacts when the connector device is coupled to the device connection arrangement.

36 Claims, 49 Drawing Sheets

U.S. PATENT DOCUMENTS

| | | | |
|---|---|---|---|
| 3,156,761 | A | 11/1964 | Schinske |
| 3,192,499 | A | 6/1965 | West |
| 3,369,211 | A | 2/1968 | Sundquist |
| 3,641,472 | A | 2/1972 | Phillips, Jr. |
| 3,746,923 | A | 7/1973 | Spira et al. |
| 3,798,506 | A | 3/1974 | English |
| 3,879,101 | A | 4/1975 | McKissic |
| 3,952,244 | A | 4/1976 | Spear |
| 3,967,195 | A | 6/1976 | Averitt et al. |
| 3,975,074 | A | 8/1976 | Fuller |
| 3,975,075 | A | 8/1976 | Mason |
| 4,008,940 | A | 2/1977 | Foley |
| 4,015,201 | A | 3/1977 | Chaffee |
| 4,034,284 | A | 7/1977 | Peplow et al. |
| 4,082,995 | A | 4/1978 | Rhude |
| 4,105,968 | A | 8/1978 | Mobley et al. |
| 4,118,690 | A | 10/1978 | Paynton |
| 4,127,807 | A | 11/1978 | Peplow et al. |
| 4,152,639 | A | 5/1979 | Chaffee |
| 4,203,638 | A | 5/1980 | Tansi |
| 4,217,619 | A | 8/1980 | Tibolla |
| 4,273,957 | A | 6/1981 | Kolling, Jr. |
| 4,280,092 | A | 7/1981 | Wells, Jr. et al. |
| 4,329,678 | A | 5/1982 | Hatfield |
| 4,477,141 | A | 10/1984 | Hardesty |
| 4,485,282 | A | 11/1984 | Lee |
| 4,725,249 | A | 2/1988 | Blackwood et al. |
| 4,725,429 | A | 2/1988 | Scott et al. |
| 4,842,551 | A | 6/1989 | Heimann |
| 4,865,556 | A | 9/1989 | Campbell et al. |
| 4,880,950 | A | 11/1989 | Carson et al. |
| 4,924,349 | A | 5/1990 | Buehler et al. |
| 4,939,383 | A | 7/1990 | Tucker et al. |
| RE33,504 | E | 12/1990 | Yuhasz et al. |
| 4,988,840 | A | 1/1991 | Carson et al. |
| 5,006,075 | A | 4/1991 | Bowden, Jr. |
| 5,015,203 | A | 5/1991 | Furrow |
| 5,117,122 | A | 5/1992 | Hogarth et al. |
| 5,146,385 | A | 9/1992 | Misencik |
| 5,178,555 | A | 1/1993 | Kilpatrick et al. |
| 5,224,009 | A | 6/1993 | Misencik |
| 5,262,678 | A | 11/1993 | Flowers et al. |
| 5,266,039 | A | 11/1993 | Boyer et al. |
| 5,281,154 | A | 1/1994 | Comerci et al. |
| 5,285,163 | A | 2/1994 | Liotta |
| 5,297,973 | A | 3/1994 | Gorman |
| 5,359,231 | A | 10/1994 | Flowers et al. |
| 5,456,373 | A | 10/1995 | Ford |
| 5,472,350 | A | 12/1995 | Mehta |
| 5,582,522 | A | 12/1996 | Johnson |
| 5,625,285 | A | 4/1997 | Virgilio |
| 5,642,052 | A | 6/1997 | Earle |
| 5,654,857 | A | 8/1997 | Gershen |
| 5,785,551 | A | 7/1998 | Libby |
| 5,839,908 | A | 11/1998 | Bonilla et al. |
| 5,876,243 | A | 3/1999 | Sangawa |
| 5,964,618 | A | 10/1999 | McCarthy |
| 6,005,308 | A | 12/1999 | Bryde et al. |
| 6,028,268 | A | 2/2000 | Stark et al. |
| 6,045,374 | A | 4/2000 | Candeloro |
| 6,054,849 | A | 4/2000 | Collier et al. |
| 6,072,317 | A | 6/2000 | Mackenzie |
| 6,156,971 | A | 12/2000 | May |
| 6,218,844 | B1 | 4/2001 | Wong et al. |
| 6,259,351 | B1 | 7/2001 | Radosavljevic et al. |
| 6,309,248 | B1 | 10/2001 | King |
| 6,323,652 | B1 | 11/2001 | Collier et al. |
| 6,341,981 | B1 | 1/2002 | Gorman |
| 6,376,770 | B1 | 4/2002 | Hyde |
| 6,377,427 | B1 | 4/2002 | Haun et al. |
| 6,457,988 | B1 | 10/2002 | Andersen |
| 6,494,728 | B1 | 12/2002 | Gorman |
| 6,563,049 | B2 | 5/2003 | May |
| 6,657,144 | B2 | 12/2003 | Savicki, Jr. et al. |
| 6,692,284 | B1 | 2/2004 | Koh |
| 6,753,471 | B2 | 6/2004 | Johnson et al. |
| 6,767,245 | B2 | 7/2004 | King |
| 6,774,307 | B2 | 8/2004 | Kruse et al. |
| 6,814,611 | B1 | 11/2004 | Torres |
| 6,843,680 | B2 | 1/2005 | Gorman |
| 6,870,099 | B1 | 3/2005 | Schultz et al. |
| 6,884,111 | B2 | 4/2005 | Gorman |
| 6,939,179 | B1 | 9/2005 | Kieffer, Jr. et al. |
| 6,982,558 | B2 | 1/2006 | Bryndzia et al. |
| 6,994,585 | B2 | 2/2006 | Benoit et al. |
| 7,052,313 | B2 | 5/2006 | Gorman |
| 7,057,401 | B2 | 6/2006 | Blades |
| 7,068,038 | B2 | 6/2006 | Mason et al. |
| 7,091,723 | B2 | 8/2006 | Simmons et al. |
| 7,195,517 | B1 | 3/2007 | Savicki, Jr. |
| 7,199,587 | B2 | 4/2007 | Hurwicz |
| 7,259,567 | B2 | 8/2007 | Sears et al. |
| 7,265,291 | B1 | 9/2007 | Gorman |
| 7,332,683 | B2 | 2/2008 | Gorman |
| 7,367,121 | B1 | 5/2008 | Gorman |
| 7,762,838 | B2 | 7/2010 | Gorman |
| 7,780,470 | B2 * | 8/2010 | Benoit et al. ............ 439/535 |
| 2002/0052139 | A1 | 5/2002 | Gorman |
| 2002/0055301 | A1 | 5/2002 | Gorman |
| 2005/0006124 | A1 | 1/2005 | Kruse et al. |
| 2005/0250377 | A1 | 11/2005 | Gorman |
| 2005/0250378 | A1 | 11/2005 | Gorman |
| 2005/0272305 | A1 | 12/2005 | Gorman |
| 2007/0072487 | A1 | 3/2007 | Gorman |
| 2008/0020632 | A1 | 1/2008 | Gorman |
| 2008/0235943 | A1 | 10/2008 | Gorman |
| 2010/0218374 | A1 | 9/2010 | Gorman |
| 2010/0218969 | A1 | 9/2010 | Purves et al. |

OTHER PUBLICATIONS

Bryant Wiring Device Catalog BDB-1506, May 1994, pp. C12, D12, D16, F2 and F5.

Leviton Wiring Device Catalog, D-200, 1978, Little Neck, NY, pp. C1, T9, T12.

Pass & Seymour Plug Tail Wiring Devices Brochure; Apr. 2004.

First Alert, User's Manual for Smoke and Fire Alarms, Jul. 2004; Mexico, pp. 1-6.

Earley et al., NEC 1999 National Electrical Code Handbook, NFPA, 8th ed. (1999) pp. v-vii, 2, 69-70 and 98.

BRK Electronics, User's Manual—Smoke Alarms Jun. 2000.

T. Engdahl, Telephone Ringing Circuits, 1997, www.tkk.fi/misc/electronics/circuits/telephone.sub.--ringer.html.

P&S PlugTail Installation—Speed Comparison Video, Pass & Seymour website (www.passandseymour.com/plugtail/video.cfm, Jun. 2007.

BRK Electronics (First Alert), Model SC612013—User—s Manual for AC Powered Smoke and Carbon Monoxide Alarm with Batter Back-Up and Silence Feature, 2001.

National Electrical Code Handbook; Article 314, 314.17-314.20; Outlet, Device Pull, and Junction Boxes; Conduit Bodies, Fittings; and Handhole Enclosures; 2005; p. 327.

* cited by examiner

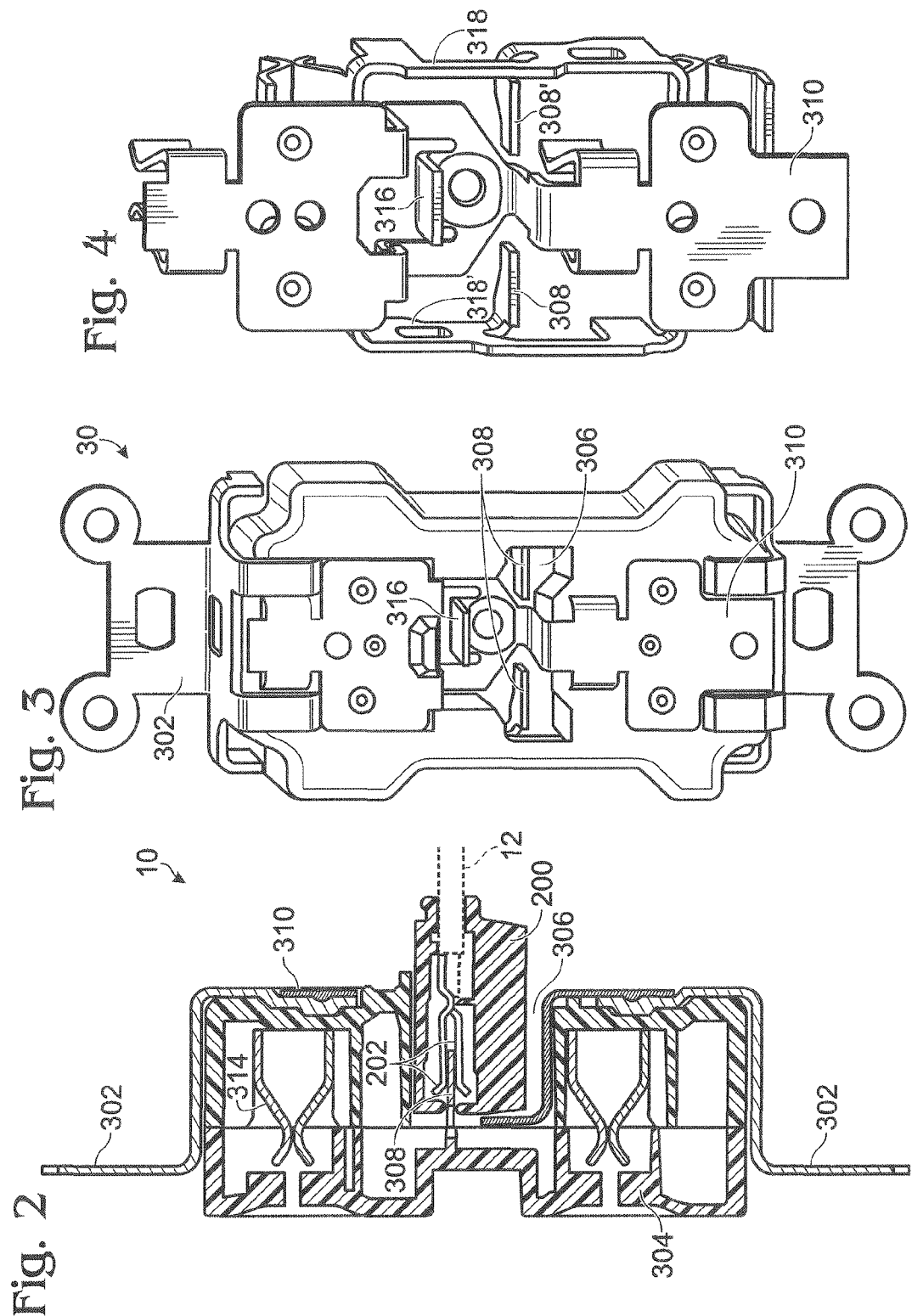

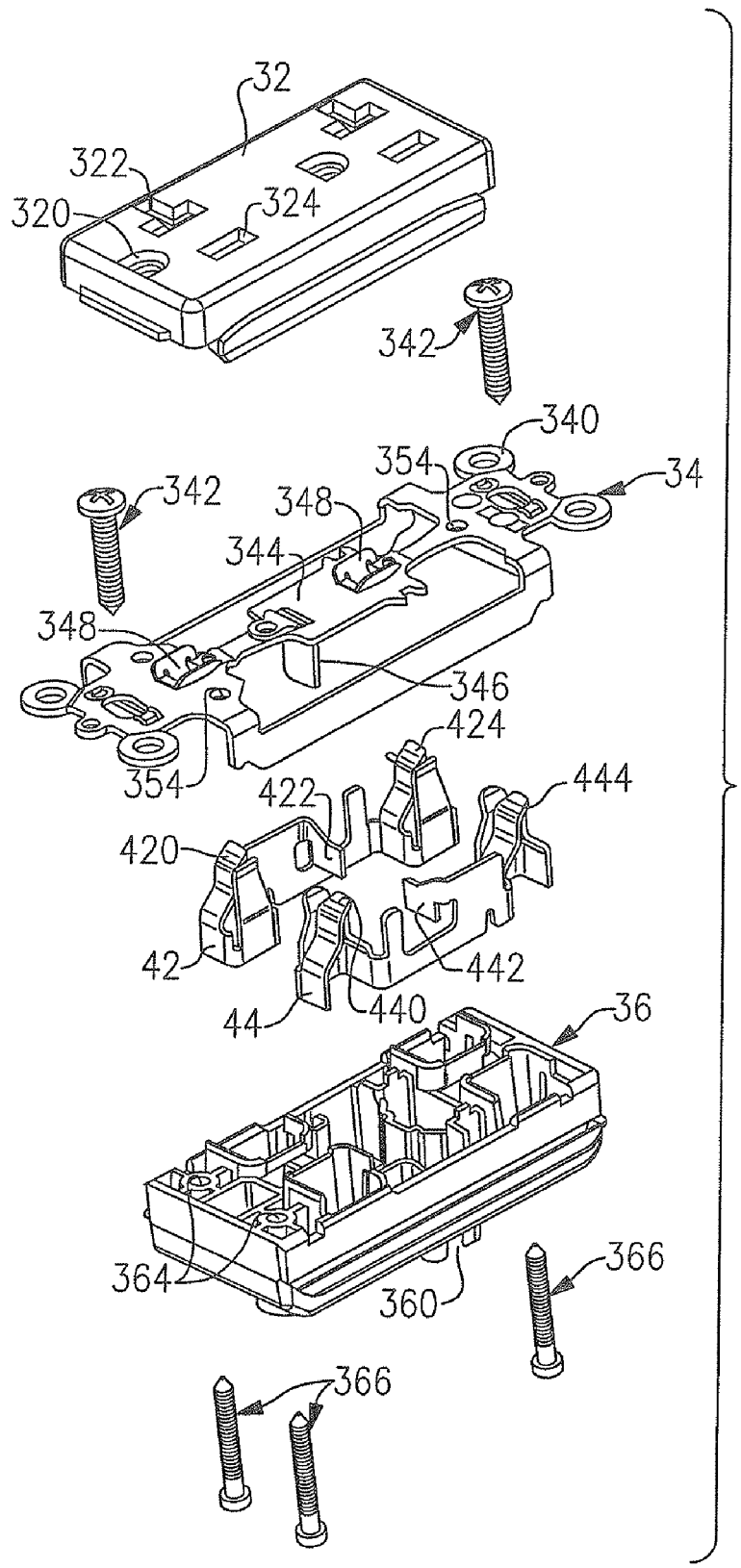

Figure 54
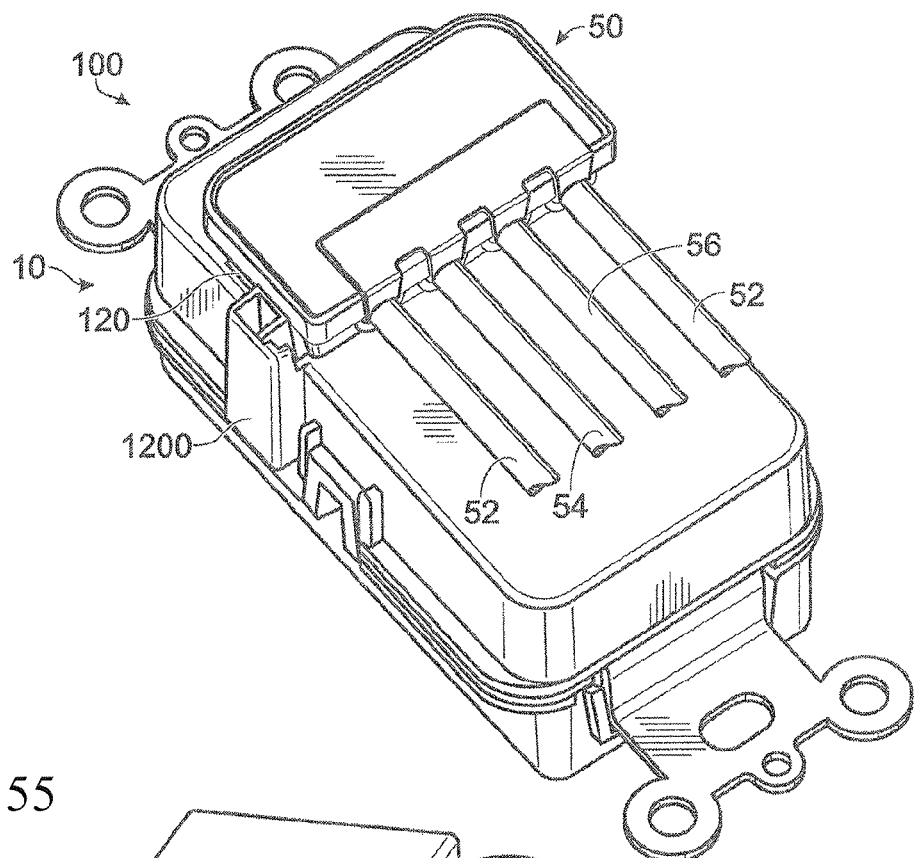
Figure 55
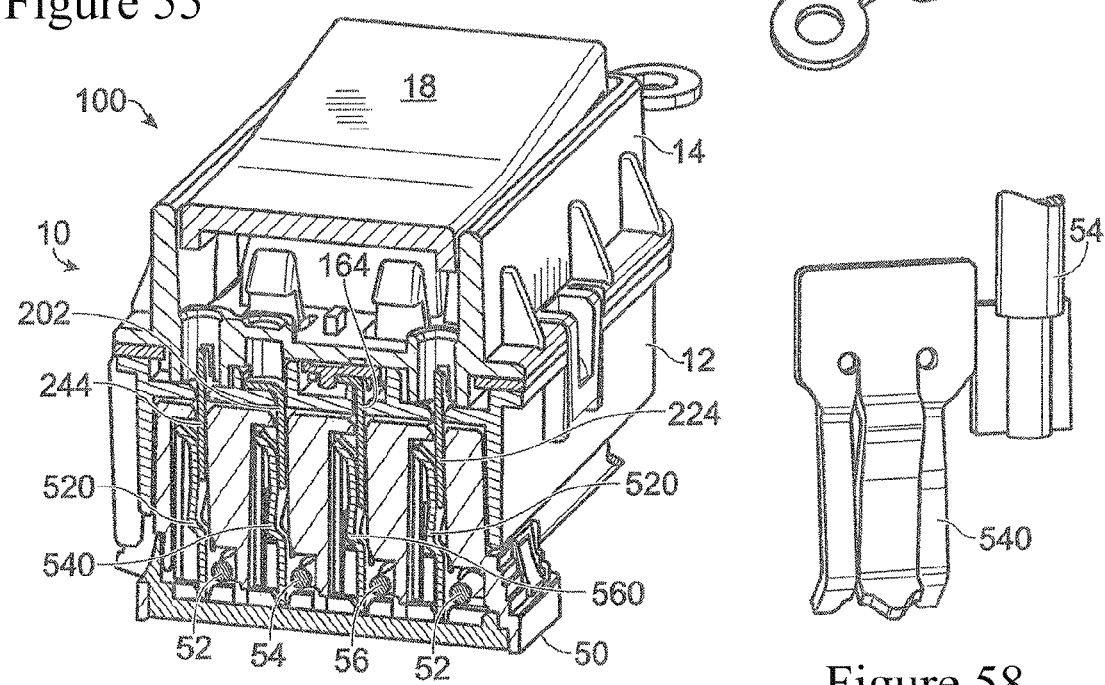
Figure 58

PLUG TAIL SYSTEMS

CROSS-REFERENCE TO RELATED APPLICATIONS

This is a continuation of U.S. patent application Ser. No. 12/861,618 filed on Aug. 23, 2010, which is a continuation of U.S. patent application Ser. No. 12/123,866 filed on May 20, 2008, which is a continuation-in-part of U.S. patent application Ser. No. 11/531,812 filed on Sep. 14, 2006, which is a continuation-in-part application of U.S. patent application Ser. No. 11/274,817 filed on Nov. 15, 2005 and U.S. patent application Ser. No. 11/032,420 filed on Jan. 10, 2005, both of which are continuation applications of U.S. patent application Ser. No. 10/680,797 filed on Oct. 7, 2003, the contents of which are relied upon and incorporated herein by reference in their entirety, and the benefit of priority under 35 U.S.C. §120 is hereby claimed.

BACKGROUND OF THE INVENTION

1. Field of the Invention

The present invention relates generally to electrical circuit installation, and particularly to electrical switching systems with features facilitating rapid and safe installation.

2. Technical Background

Installing electrical circuits in buildings and/or other structures is typically labor intensive, time-consuming, and a process that requires electricians of various skill levels. As a result the installation process is expensive. The first phase of the installation is commonly referred to as the "rough-in" phase wherein a plurality of AC electric power transmitting wires are disposed between an AC power distribution point and the device box. An AC power distribution point refers to a distribution panel, a junction box or the like. In new construction, either conduit or armored cable is disposed through out the structure in accordance with the building plans. Junction boxes are installed at appropriate locations, and brackets and metal device boxes are installed throughout the structure where electrical service is desired. Junction boxes, of course, are employed to house the connection point, or junction, of several conductors. Metal device boxes are used to accommodate electrical wiring devices. For example, the types of electrical wiring devices may include, but are not limited to, receptacles, switches, dimmers, GFCIs, AFCIs, transient voltage surge suppressors (TVSS), protective devices, timer devices, sensors of various types including occupancy sensors, thermostats, lighting fixtures, and/or combinations thereof. After the boxes are placed, the electrical wires are pulled through the conduits and all of the circuits are bonded. At this point, the leads from the electrical wires extend from the boxes and are visible and accessible for the next phase of the installation process.

In reference to the term plurality of wires, or plurality of AC electric power conducting wires, or the like, it is noted that a conduit or an electrical cable may include two to five conductive wires depending on the type of service being installed. In a two wire distribution system electrical power is typically conducted, e.g., to a load using a hot (black) wire and a neutral (white) wire. In 240 VAC distribution systems, two hot wires are employed. In a structure that requires high power, the most common way of distributing that power is by employing the three-phase power system. As those of ordinary skill in the art recognize, five wires are employed. Three phase power includes three "hot" or "live" wires. Each of these wires transmits electrical power that is 120 degrees out of phase with the other two hot wires. The other two wires are the neutral conductor and the ground wire. Three phase power typically comes from the power utility via four wires: the three-phase wires, and the neutral. If the current flowing through each of the phases is equal, no current will flow through the neutral. The neutral wire is typically connected to the building ground at the structure's main distribution panel. The five wire cable is distributed from the central panel. As mentioned above, some of the circuits in the structure are designed to provide power to grounded equipment. These circuits may employ three wires, a line conductor (hot wire), a neutral conductor, and a ground. Some circuits may only employ two wires, the line conductor and the neutral conductor.

Referring back to the installation process, after the "rough-in" phase has been completed, the electrical wiring devices are terminated, i.e., they are electrically connected to the wire leads. This part of the installation process is the most costly and time consuming. A journeyman electrician must perform, or supervise, the connection of each wiring device in the structure. In this process, each electrical wire must be stripped and terminated to the device. What is needed is an efficient, labor-saving, and cost effective means for terminating the electrical wires and coupling them to the individual devices. Further, when the process involves the installation of electrical light switches, the electrical wiring and the light fixtures are in place before the switching devices are installed. Thus, the contractor cannot use the previously installed lighting and instead must rely on temporary lighting while the work proceeds. What is also needed, is a safe and reliable way of taking advantage of the installed electrical wiring and lighting even before the light switches themselves have been installed.

SUMMARY OF THE INVENTION

The present invention addresses the needs described above by providing an efficient, labor-saving, and cost effective means for terminating the electrical wires and coupling them to the individual switching devices. The present invention addresses the problems described above. The present invention is directed to an electrical wiring system that simplifies the installation process. Further, the present invention provides an efficient system and method for terminating electrical devices. The system and method is cost-effective because it eliminates many of the labor intensive practices that are currently in use. In addition, it includes a full line of wiring devices such as outlet receptacles, GFCIs, AFCIs, TVSS devices, light switches, etc. Moreover, the present invention provides a safe and reliable way of taking advantage of the installed electrical wiring and lighting even before the light switches themselves have been installed.

One aspect of the present invention is directed to an electrical wiring system configured to be connected to a plurality of AC electric power conducting wires disposed between an AC power distribution point and a device box. The plurality of AC electric power conducting wires is accessible from an open front face of a device box after a rough-in installation phase. The system comprises a plug connector assembly including a connector housing having a predetermined form factor, the plug connector housing including a plurality of plug connector contacts connected to a plurality of termination wire segments. Each termination wire segment of the plurality of termination wire segments include a first wire segment portion coupled to a corresponding plug contact of the plurality of plug contacts and a second unterminated wire segment portion extending from the connector housing. Each second unterminated wire segment portion of the plurality of termination wire segments are configured to be terminated to a corresponding one of the plurality of AC electric power transmitting wires after the rough-in installation phase. An electrical wiring device comprises a device housing including a cover member and at least one back body member. The cover member including a front major surface having at least one set of receptacle openings disposed therein. The at least one back body member includes a rear major surface having an opening disposed in a portion thereof to form a power input receptacle configured to accommodate the plug connector housing. The at least one back body member also includes a seating portion such that a planar region is formed between the seating portion and the rear major surface. The planar region is substantially parallel to the rear major surface. The at least one back body member further includes at least one AC circuit compartment substantially disposed in planar region. A ground strap assembly includes a mounting portion configured for attachment of the electrical wiring device to the device box. The seating portion accommodates at least a portion of the mounting portion. The ground strap assembly further comprises at least one output ground contact and an input ground contact. An AC circuit assembly is substantially disposed in the at least one AC circuit compartment and configured to detect at least one fault condition. The AC circuit assembly is coupled to a plurality of input contacts, including the input ground contact, which are disposed in the power input receptacle and a plurality of output contacts, including the at least one output ground contact, are accessible via the at least one set of receptacle openings. The plurality of power input contacts are configured to mate with the plurality of plug connector contacts when the connector housing is inserted into the power input receptacle such that electrical continuity is established between the AC power distribution point and the plurality of output contacts in a first state, the electrical continuity being interrupted in a second state.

In another aspect, the present invention is directed to an electrical wiring system configured to be connected to a plurality of AC electric power conducting wires disposed between an AC power distribution point and a device box. The plurality of AC electric power conducting wires is accessible from an open front face of a device box after a rough-in installation phase. The system comprises a plug connector assembly including a connector housing having a predetermined form factor, the plug connector housing including a plurality of plug connector contacts connected to a plurality of termination wire segments. Each termination wire segment of the plurality of termination wire segments include a first wire segment portion coupled to a corresponding plug contact of the plurality of plug contacts and a second unterminated wire segment portion extending from the connector housing. Each second unterminated wire segment portion of the plurality of termination wire segments are configured to be terminated to a corresponding one of the plurality of AC electric power transmitting wires after the rough-in installation phase. An electrical wiring device comprises a device housing including a cover member and at least one back body member. The cover member includes a front major surface having at least one set of receptacle openings disposed therein. The at least one back body member includes a rear major surface having a portion thereof arranged to form a power input receptacle in accordance with the predetermined form factor and configured to accommodate the plug connector housing. The at least one back body member also includes a seating portion such that a planar region is substantially disposed between the seating portion and the rear major surface. The planar region is substantially parallel to the rear major surface. The at least one back body member further includes at least one AC circuit compartment substantially disposed in the planar region. A ground strap assembly includes a mounting portion configured for attachment of the electrical wiring device to the device box. The seating portion accommodates at least a portion of the mounting portion. The ground strap assembly further comprises at least one output ground contact and an input ground contact. An AC circuit assembly is substantially disposed in the at least one AC circuit compartment. The AC circuit assembly is coupled to a plurality of input contacts including the input ground contact being disposed in the power input receptacle and a plurality of output contacts including the at least one output ground contact being accessible via the at least one set of receptacle openings. The plurality of input contacts and the plurality of output contacts are substantially disposed in the planar region. The plurality of power input contacts are configured to mate with the plurality of plug connector contacts when the connector housing is inserted into the power input receptacle such that electrical continuity is established between the AC power distribution point and the plurality of output contacts in a first state and AC power is propagated from the plurality of power input contacts to the plurality of power output contacts, the electrical continuity being interrupted in a second state.

In yet another aspect, the present invention is directed to An electrical wiring system configured to be connected to a plurality of AC electric power conducting wires disposed between an AC power distribution point and a device box. The plurality of AC electric power conducting wires is accessible from an open front face of a device box after a rough-in installation phase. The system comprises a connector assembly including a connector housing having a predetermined form factor, the connector housing including a plurality of plug connector contacts connected to a plurality of termination wire segments. Each termination wire segment of the plurality of termination wire segments include a first wire segment portion coupled to a corresponding plug contact of the plurality of plug contacts and a second unterminated wire segment portion extending from the connector housing. Each second unterminated wire segment portion of the plurality of termination wire segments are configured to be terminated to a corresponding one of the plurality of AC electric power transmitting wires after the rough-in installation phase. An electrical wiring device comprises a device housing including a cover member and at least one back body member. The cover member includes a front major surface having at least one set of receptacle openings disposed therein. The at least one back body member includes a rear major surface having a portion thereof arranged in accordance with the predetermined form factor to form a power input receptor to mate with the connector housing. The at least one back body member also includes a seating portion such that a planar region is substantially disposed between the seating portion and the rear major surface. The planar region is substantially parallel to the rear major surface. The at least one back body member further includes at least one AC circuit compartment substantially disposed in the planar region. A ground strap assembly includes a mounting portion configured to attach the electrical wiring device to the device box. The seating portion accommodates at least a portion of the ground strap assembly. The ground strap assembly further comprises at least one output ground contact and an input ground contact. An AC circuit assembly is substantially disposed in the at least one AC circuit compartment and configured to detect at least one fault condition. The AC circuit assembly is coupled to a plurality of input contacts including the input ground contact being disposed in the power input receptacle and a plurality of output contacts including the at least one output ground contact being accessible via the at least one set of receptacle openings. The plurality of input contacts is configured to mate with the plurality of plug connector contacts when the connector housing is mated with the power input receptor such that electrical continuity is established between the AC power distribution point and the plurality of output contacts in a reset state; the electrical continuity being interrupted in a tripped state.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 2 is a cross-sectional view of the electrical wiring system depicted in FIG. 1B;

FIG. 3 is a back view of the wiring device depicted in FIG. 1A and FIG. 1, showing a power input receptacle;

FIG. 4 is a detail view illustrating the construction of the receptacle depicted in FIG. 3;

FIG. 18 is an exploded view of a wiring device in accordance with a first embodiment of the present invention;

FIG. 54 is a perspective view of an electrical wiring system of the present invention featuring the rocker switch depicted in FIG. 50;

FIG. 55 is a latitudinal cross-section of the system depicted in FIG. 54 at a first end thereof;

FIG. 58 is perspective view of a plug device contact for the plug device depicted in FIG. 44;

DETAILED DESCRIPTION

Figure 1A:
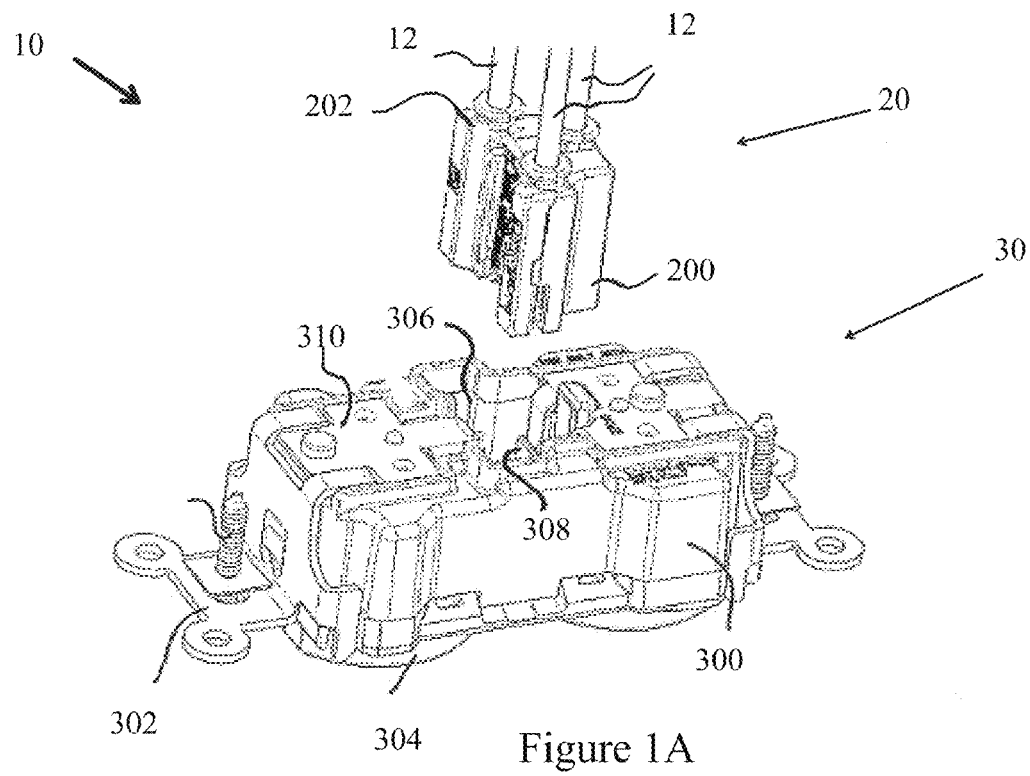
FIGS. 1A and 1B are perspective views of the electrical wiring system in accordance with the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the system of the present invention is shown in FIG. 1, and is designated generally throughout by reference numeral 10 or reference numeral 100.

The present invention is directed to an electrical wiring system for use in an AC electrical power distribution circuit that includes one or more AC power conductors disposed between an upstream AC power element and a device box and one or more AC power conductors disposed between the device box and a downstream AC power element. The "upstream" AC power conductors and the "downstream" AC power conductors are routed into an interior portion of the device box and accessible via a front open face of the device box. The upstream AC power element referred to above may be the circuit breaker panel, an AC distribution point, an electrical wiring device or another electrical wiring system of the type described herein. The downstream AC power element may be an electrical load, an electrical wiring device or another electrical wiring system of the type described previously.

Figure 1B:
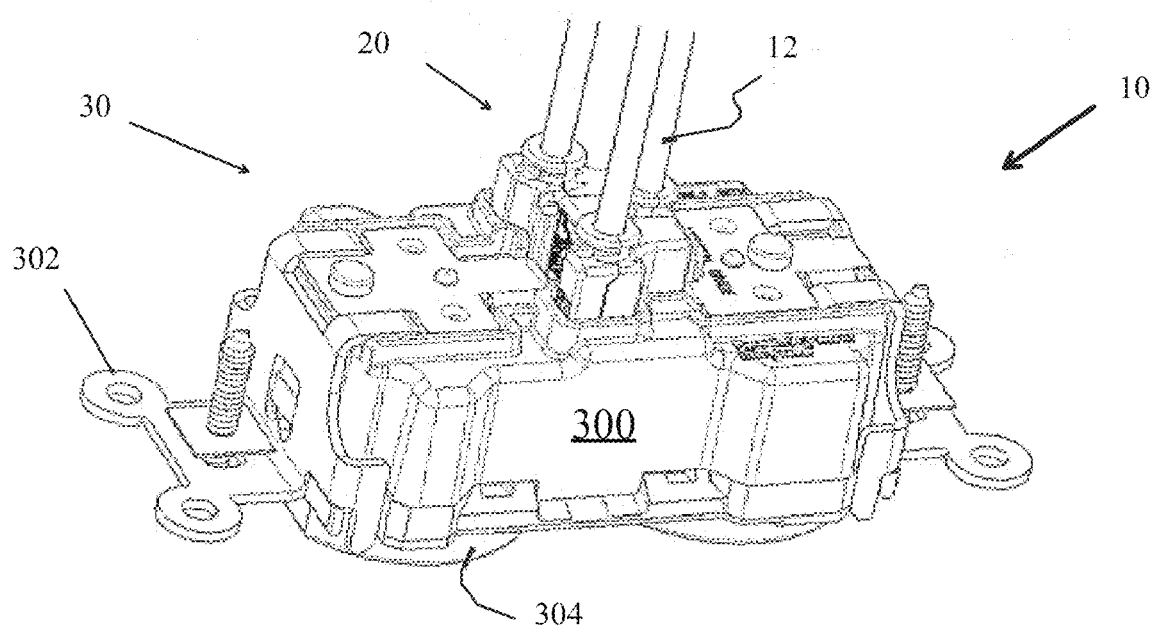

As embodied herein, and depicted in FIGS. 1A and 1B, perspective views of the electrical wiring system 10 in accordance with the present invention are disclosed. Referring to FIG. 1A, electrical wiring system 10 includes plug connector 20 which mates with electrical wiring device 30. Electrical power conductor wires 12 are terminated at plug 20. Plug 20 includes a housing 200 and contacts 202, which are disposed within body 200. In the embodiment shown, connector contacts 202 are female contacts designed to accept male contacts disposed within wiring device 30. In one embodiment, housing 200 is formed from injection molded plastic, polycarbonate, or other polymer based materials. Connector contacts 202 are typically fabricated using a copper alloy material. Those of ordinary skill in the art will recognize that any suitable material may employed in fabricating plug connector 20.

Electrical wiring device 30 includes a body 300, strap element 302, cover 304, power input receptacle 306, receptacle contacts 308, ground chassis 310, and mounting screws 312. In this embodiment, receptacle contact 308 is a male contact that is configured to mate with plug contact 202. Body 300 and cover 304 are injection molded components, again, using materials such as polymers, polycarbonate, or nylon materials. Contacts 308 are fabricated using copper alloy materials. Strap 302 may be fabricated using a copper alloy or by using plated steel. Ground chassis 310 is fabricated using a copper alloy. Because the embodiment shown is a 3-wire system that includes ground, ground chassis 310 includes a male contact tab that mates with one of the female contacts in plug 20.

In the example depicted in FIG. 1A and FIG. 1B, three wires are shown being terminated by plug 20. However, those of ordinary skill in the art will recognize that the present invention should not be construed as being limited to the embodiment shown. The present invention may be configured to accommodate 2 wire systems and three-phase (5 wires) systems, as well as the 3-wire system shown. Further, system 10 of the present invention may be adapted to a wiring system that employs more than 5 wires. While wires are shown being terminated by a single plug 20, those of ordinary skill in the art will recognize that the present invention may be configured to terminate the wires separately or in combination, within a plurality of plugs.

Referring to FIG. 2, a cross-sectional view of the electrical wiring system depicted in FIG. 1B is disclosed. Plug connector housing 200 fits within input receptacle 306. As such, male contact 308 is shown as being inserted between female contacts 202. FIG. 2 also shows power output receptacle 314, which is configured to receive the blade contacts from a plug. When plug 20 is installed in device 30, electrical continuity is established between the plurality of wires 12 and the wiring device. Thus, when wires 12 are energized, power is supplied to output receptacles 314. Those of ordinary skill in the art will recognize that while the example of FIGS. 1A and 1B shown a wiring device that provides output receptacles 314, the present invention may be practiced with any suitable type of wiring device. For example, wiring device 30 may include a switch, a dimmer switch, a GFCI, a transient voltage surge suppressor (TVSS), a timer mechanism, an occupancy sensor or other type of sensor, a thermostat, a night light, a lighting fixture, or a device that includes a combination of the above.

Figure 5:
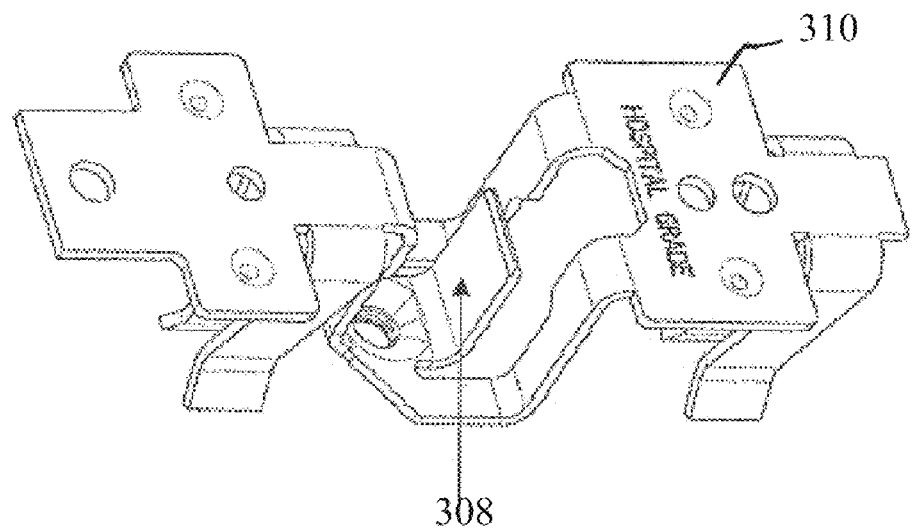
FIG. 5 is a detail view of the wiring device ground chassis in accordance with the present invention.
Figure 6:
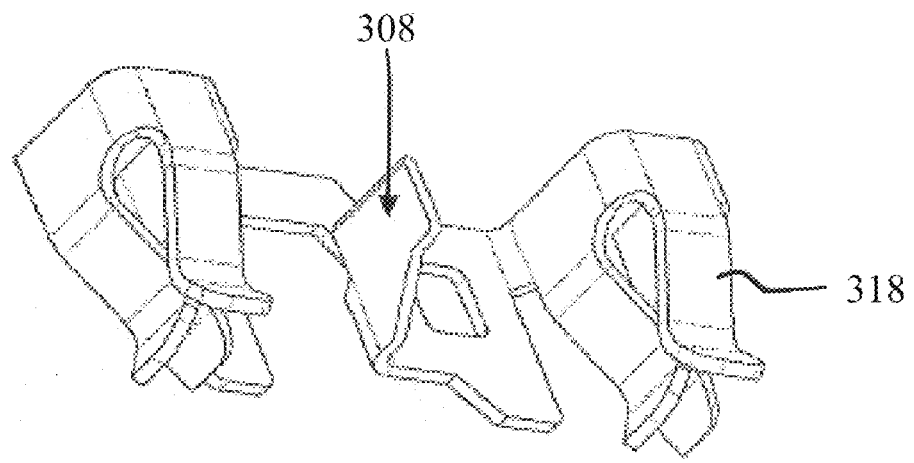
FIG. 6 is a detail view of an electrical contact body employed in the wiring device receptacle in accordance with the present invention.

Referring to FIG. 3, a back view of the wiring device depicted in FIG. 1A and FIG. 1 is disclosed. As shown, receptacle 306 is shaped to accommodate plug connector 20. Receptacle 306 includes male contacts 308 and ground contact 316. Referring to FIG. 4, a detail view illustrating the construction of receptacle 316 is shown. Essentially, the contacts within receptacle 306 are formed by three metallic bodies disposed within molded body 300 (see FIG. 1A). As discussed above, ground chassis 310 includes ground contact 316. Contact body 318 includes contact 308 and supporting structure. Contact body 318' is a minor image of contact body 318, and includes contact 308'. During fabrication, ground chassis 310 is inserted into a first side of molded body 300, and contact bodies 318, 318' are inserted into the opposing side of body 300, such that contacts 318, 318', and 316 from an integrated set of male contacts suitable for female plug connector 20. FIG. 5 is a detail view showing ground chassis 310 in isolation. FIG. 6 is a detail view of electrical contact body 318 in isolation.

Figure 7:
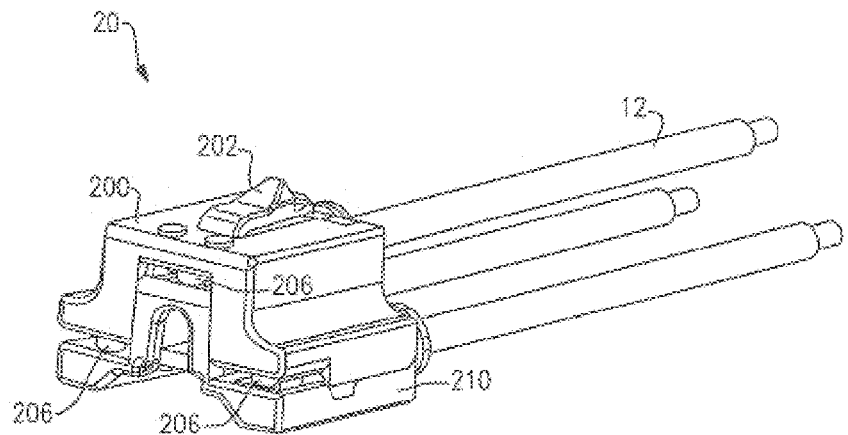
FIG. 7 is a perspective view of the plug connector in accordance with a first embodiment of the present invention.

As embodied herein and depicted in FIG. 7, perspective view of plug connector 20 in accordance with a first embodiment of the present invention is disclosed. Plug connector 20 includes upper housing 200 and lower housing 210. Upper housing 200 is snapped onto lower housing 210 to thereby enclose and terminate wires 12 in plug connector 20. Upper housing 200 includes latch mechanism 204. When plug connector 20 is inserted into receptacle 306, latch mechanism 204 prevents plug 20 from being pulled out of receptacle 306. Latch mechanism 204 is configured to meet Underwriter's Laboratory (UL) standards for a locking connector.

In this case, UL requires that a static pull test of 201b be applied to the connector for one minute. During the test, plug connector 20 may not separate from receptacle 30.

During operation, latch mechanism 204 flexes upon insertion of plug connector 20. The flexure latch mechanism 204 relaxes to a non-flexed position upon successful locking of plug connector 20 to receptacle 306, and emits an audible snapping sound or visual indication that locking has been achieved. Flexible latch mechanism 204 may also be configured to be accessible to the finger or to a tool when plug connector 20 is locked to receptacle 306. In this embodiment, when latch mechanism 204 is accessed and manually flexed manually, or by the tool, plug connector 20 can be removed from receptacle 306. The flexure is oriented in a direction opposite to the insertion direction in order to meet requirements in Underwriters Laboratories (UL) standards. In another embodiment, plug connector 20 can be locked into receptacle 306 using screws or any number of fastening means familiar to those skilled in the art.

Figure 8:
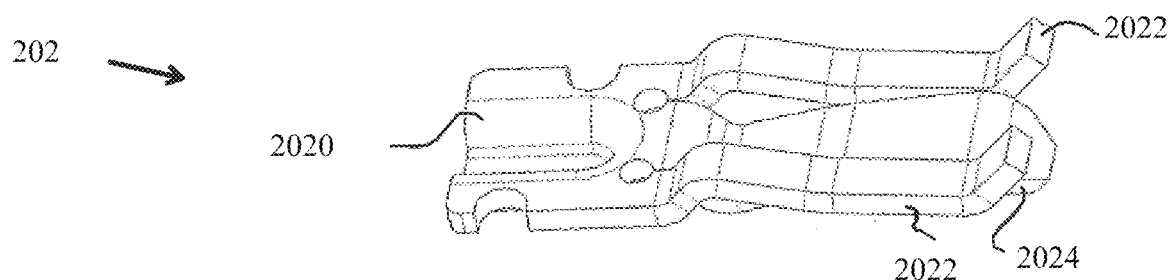
FIG. 8 is a is a detail view of the electrical contacts employed in the plug connector depicted in FIG. 7.

Referring to FIG. 8, a detail view of female electrical contact 202 is depicted. Each contact 202 includes a wire seat portion 2020. Wire seat 2020 accommodates the wire conductor when wire 12 is bonded to contact 202 during termination. Contact 202 also includes two exterior spring contact members 2022, and an interior spring contact member 2024. As those of ordinary skill in the art will appreciate, when male receptacle contacts 308 are inserted, the exterior spring contact members 2022 separate from the interior spring contact member 2024, holding contact 308 firmly therebetween.

Figure 9:
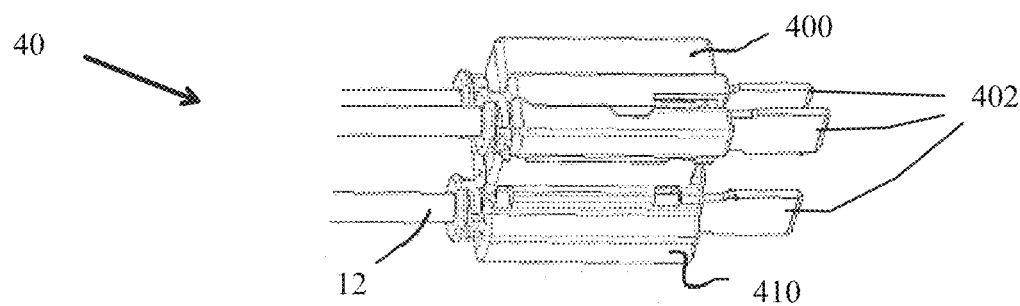
FIG. 9 is a perspective view of the plug connector in accordance with a second embodiment of the present invention.

As embodied herein and depicted in FIG. 9, a perspective view of the plug connector 40 is accordance with a second embodiment of the present invention is disclosed. Plug connector includes upper housing 400 which is mated to lower housing 410. In this embodiment, the female contacts are replaced by male contacts 402. As a result, receptacle 306, disposed in wiring device 30 (not shown), includes female contacts.

Figure 10:
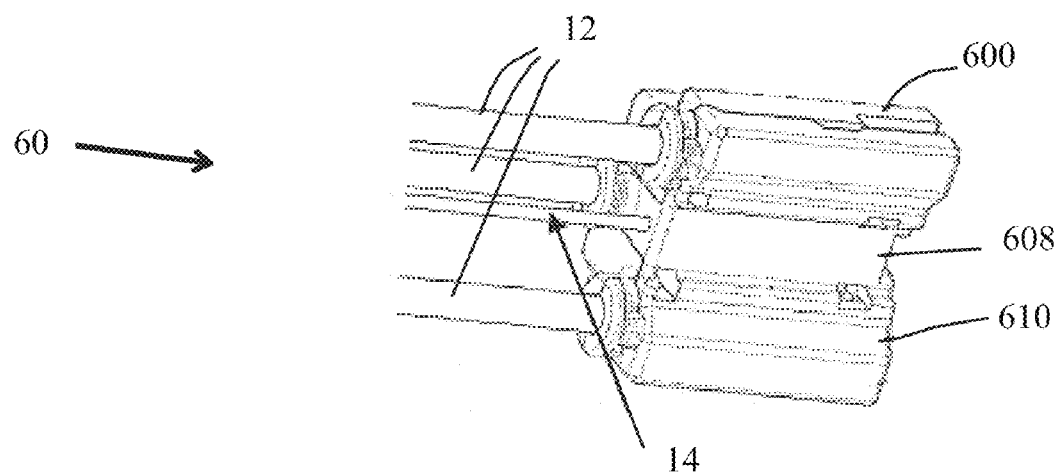
FIG. 10 is a perspective view of the plug connector in accordance with a third embodiment of the present invention.

As embodied herein and depicted in FIG. 10, a perspective view of plug connector 60 is accordance with a third embodiment of the present invention is disclosed. Like the other embodiments, plug connector 60 includes upper housing 600 and lower housing 610. However, this embodiment includes an additional contact that accommodates communications wire 14. Communications wire 14 transmits wiring device 30 status data, such as a detected fault condition, to a receiver disposed in the structure. Obviously, connector 60 mates to a wiring device 30 that includes a sensor and a transmitter. With respect to the transmitter employed by device 30, any suitable system may be employed, including optical, acoustic, or RF transmitters. For example, wiring device 30 may include an RF tag that transmits a fault detect code in the presence of a fault condition.

Figure 11:
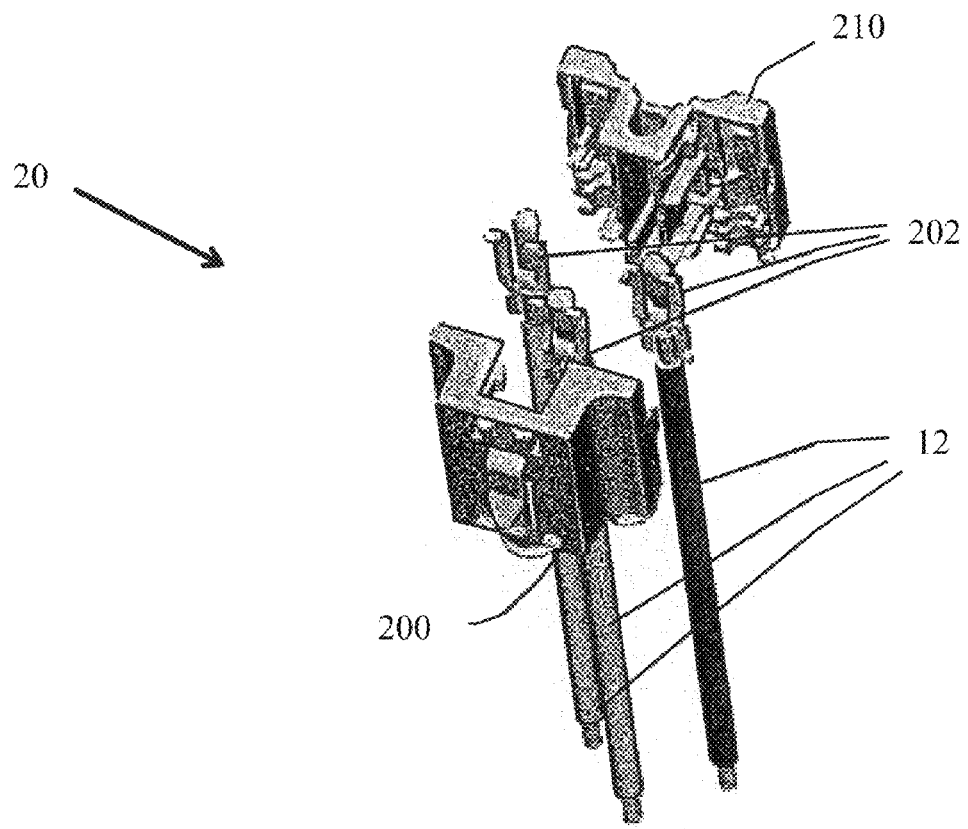
FIG. 11 is an exploded view of the plug connector depicted in FIG. 7, illustrating a first method for terminating the plug connector.

Referring to FIG. 11, an exploded view of the plug connector depicted in FIG. 7. FIG. 11 illustrates a first method for terminating plug connector 20 to wire 12. After each wire 12 is stripped, it is placed in seat 2020 (See FIG. 8), and bonded to the contact. Each contact 202 is disposed in upper housing 200. Subsequently, lower housing 210 is snapped into place to thereby secure contacts 202. In an alternate embodiment, contacts 202 are disposed in either upper housing 200 or in lower housing 210. Each contact 202 includes a blade element. The blade element is configured to displace insulation disposed on wire 12 when lower housing 210 is snapped onto upper housing 200. The blade element contacts the conductor after the insulation is displaced, such that electrical continuity is established between wire 12 and contact 202.

Figure 12:
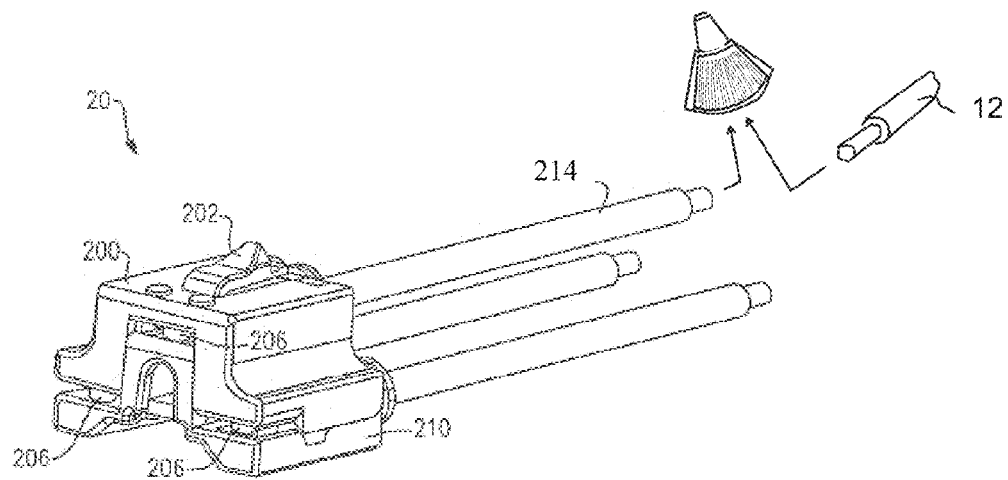
FIG. 12 is a perspective view of the plug connector depicted in FIG. 7, illustrating a second method for terminating the plug connector.

Referring to FIG. 12, a perspective view of plug connector 20 is shown, illustrating a second method for terminating wires 12 to plug connector 20. In this embodiment, plug 20 is equipped with leads 214 which are terminated to contacts 202 at the factory. During wire 12 termination, wire-nut 212 is essentially screwed onto stripped wire 12.

Figure 13:
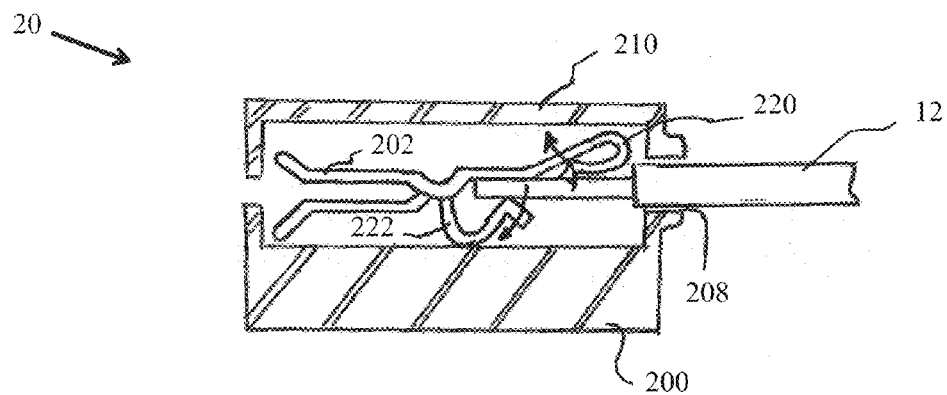
FIG. 13 is a perspective view of the plug connector depicted in FIG. 7, illustrating a third method for terminating the plug connector.

Referring to FIG. 13, a perspective view of plug connector 20 is shown, illustrating a third method for terminating wires 12 to plug connector 20. In this embodiment, each contact 202 in plug 20 is equipped with spring 220 and spring 222, which are configured to press one against the other before wire installation. When wire 12 is inserted into opening 208, spring 220 separates from spring 222. Spring 222 actuates trigger mechanism 224 which includes a metallic saw-tooth mechanism 206. Mechanism 206 bites into wire 12, securing it in place.

As those of ordinary skill in the art will recognize, the present invention is ideally suited for installing electrical wiring in any structure. During any installation, after the wires are placed between the breaker location to the device box location, i.e., the location wherein the electrical device 30 is to be installed; wires 12 may be terminated to plug connector 20 using any of the methods described above. Subsequently, plug connector 20 is inserted into receptacle 306 of wiring device 30, to thereby establish electrical continuity between the electrical wiring device and the plurality of wires.

Figure 14:
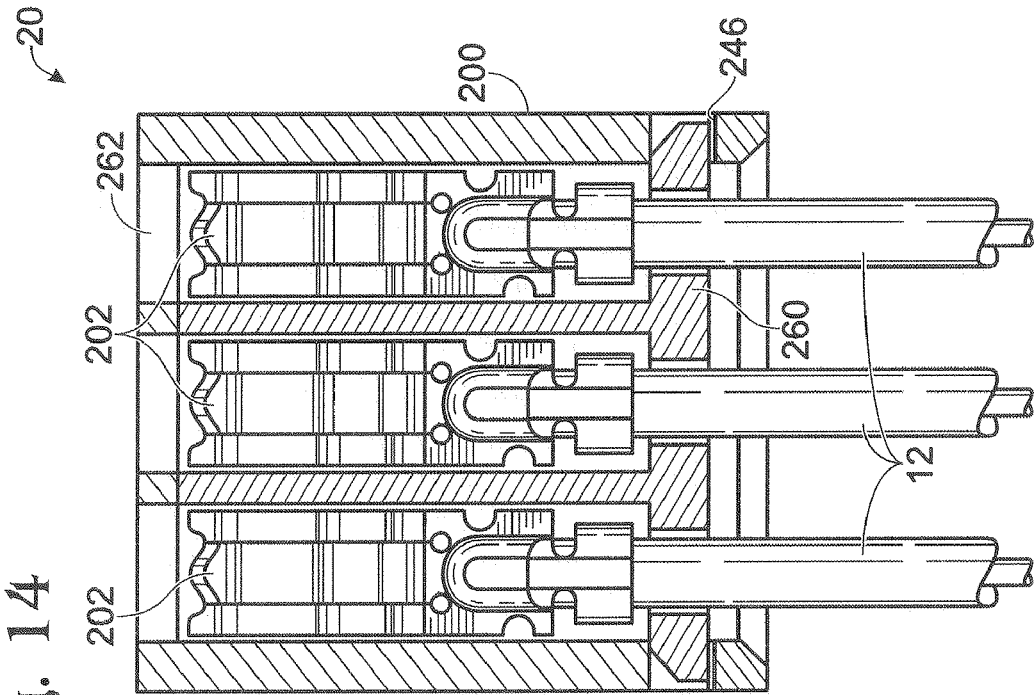
FIG. 14 is a cross-sectional view of the plug connector in accordance with an alternate embodiment of the present invention.

Referring to FIG. 14, a cross-sectional view of the plug connector 20 in accordance with an alternate embodiment of the present invention is disclosed. In this embodiment, plug connector 20 is arranged with plug contacts 202 adjacent one to the other within housing 200. Thus, contact openings 262 are likewise adjacent one to the other. Contact support member 260 is inserted into opening 264 of housing 200, to support contacts 202, which are terminated on wires 12.

Figure 15:
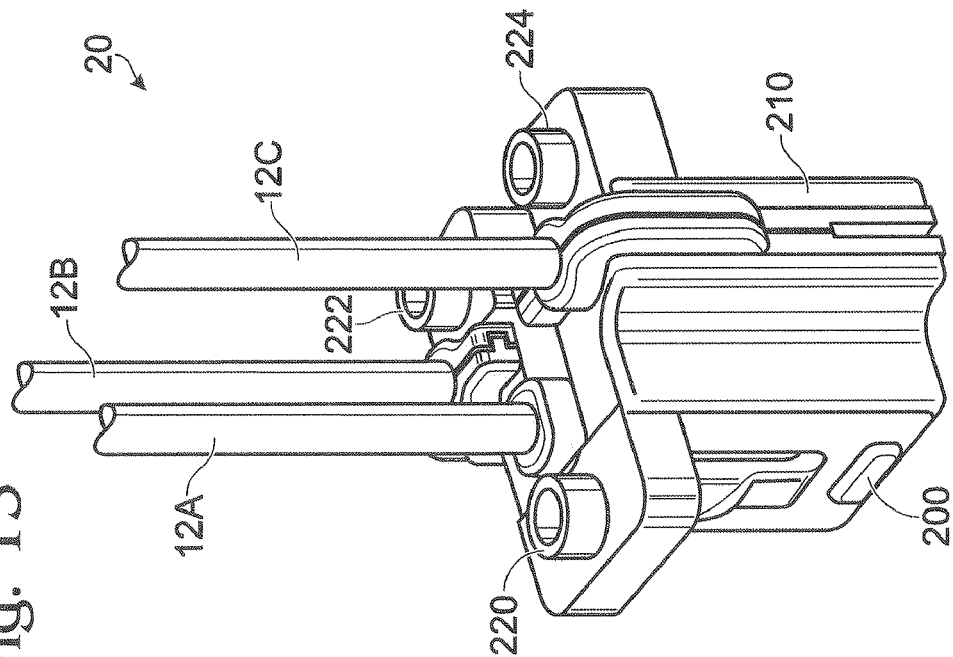
FIG. 15 is a perspective view of a feed-through plug connector in accordance with an embodiment of the invention.

Referring to FIG. 15, a perspective view of a feed-through plug connector in accordance with an embodiment of the invention. As those of ordinary skill in the art will understand, often receptacles are daisy chained by way of feed through wires. In this embodiment, there is electrical connectivity between wire 12A and wire terminal 226, wire 2B and wire terminal 228, and wire 12C and wire terminal 230. Those of ordinary skill in the art will recognize that a feed through wire may be connected to terminal 226, 228, or 230 by any suitable means. For example, the feed-through wire may be connected to the wire terminal in a pre-assembled manner, such as that shown in FIG. 7. Terminals 226, 228, and 230 may be configured as wire-nut terminals, as show in FIG. 12. Further, the method described in FIG. 13 may also be used to terminate feed-through wires to terminals 226, 228, and 230. Terminals 226, 228 and 230 can be included in connector plug 20. Alternatively, terminals 226, 228 and 230 can be in a second connector plug 20' that attaches to a receptacle 306' electrically coupled to wires 12A, 12B and 12C (not shown). Wires 12A, 12B, and 12C may couple electricity to wiring device 30 either through connector plug 20 or some alternate means such as screw terminals. In addition, connector plugs 20 and 20' may be configured so as to not be interchangeable.

Figure 16:
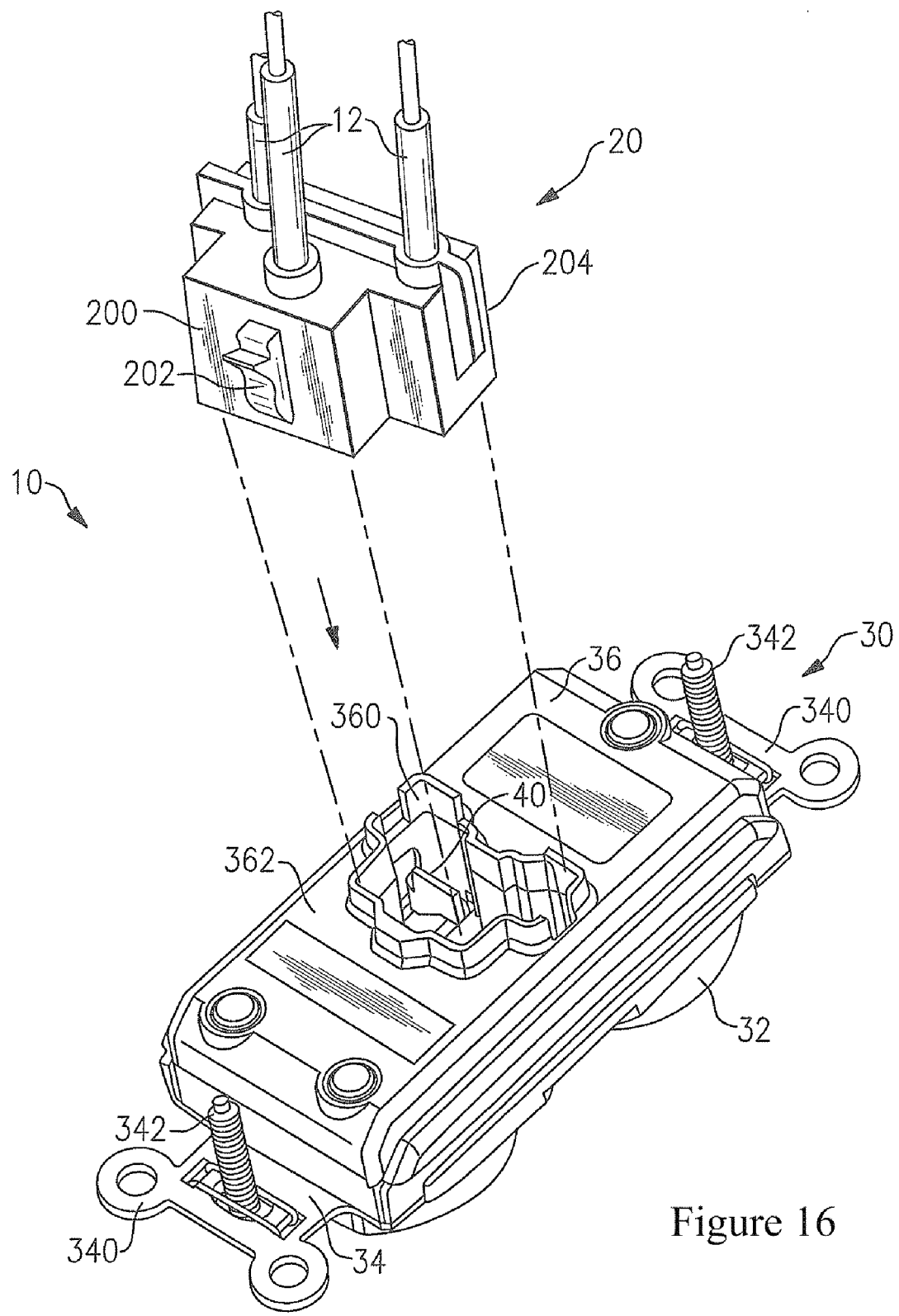
FIG. 16 is a perspective view of an electrical wiring system in accordance with an embodiment of the present invention.

As embodied herein, and depicted in FIG. 16, a perspective view of an electrical wiring system in accordance with an embodiment of the present invention is disclosed. As noted above, the wiring system 10 includes plug connector 20 and wiring device 30. The plug connector includes a body member 200 that has contacts disposed therein (not shown in this view). Each plug contact is terminated to one of the plurality of wires 12. Body 200 includes a latch member 202 configured to hold the plug connector in-place within the body 36 of wiring device 30. Wiring device 30 includes a cover 32, a body 36, and a generally planar ground strap 34 that is disposed between cover 32 and body 36. As shown, the planar ground strap includes a proximal mounting yoke 340 and a distal mounting yoke 340 disposed on opposing ends of ground strap 34. Mounting screws 342 are employed to mount the wiring device to a structure. Referring back to body member 36, a receptacle 360 in formed in the major rear surface 362. A portion of the wiring device contact assembly 40 is accessible via the receptacle 360. Indeed, receptacle 360 is configured to accept the plug connector 20. The wiring device contacts 40 are configured to mate with the plurality of plug contacts (not shown in this view) when the plug connector 20 is inserted into the receptacle 360.

Figure 17:
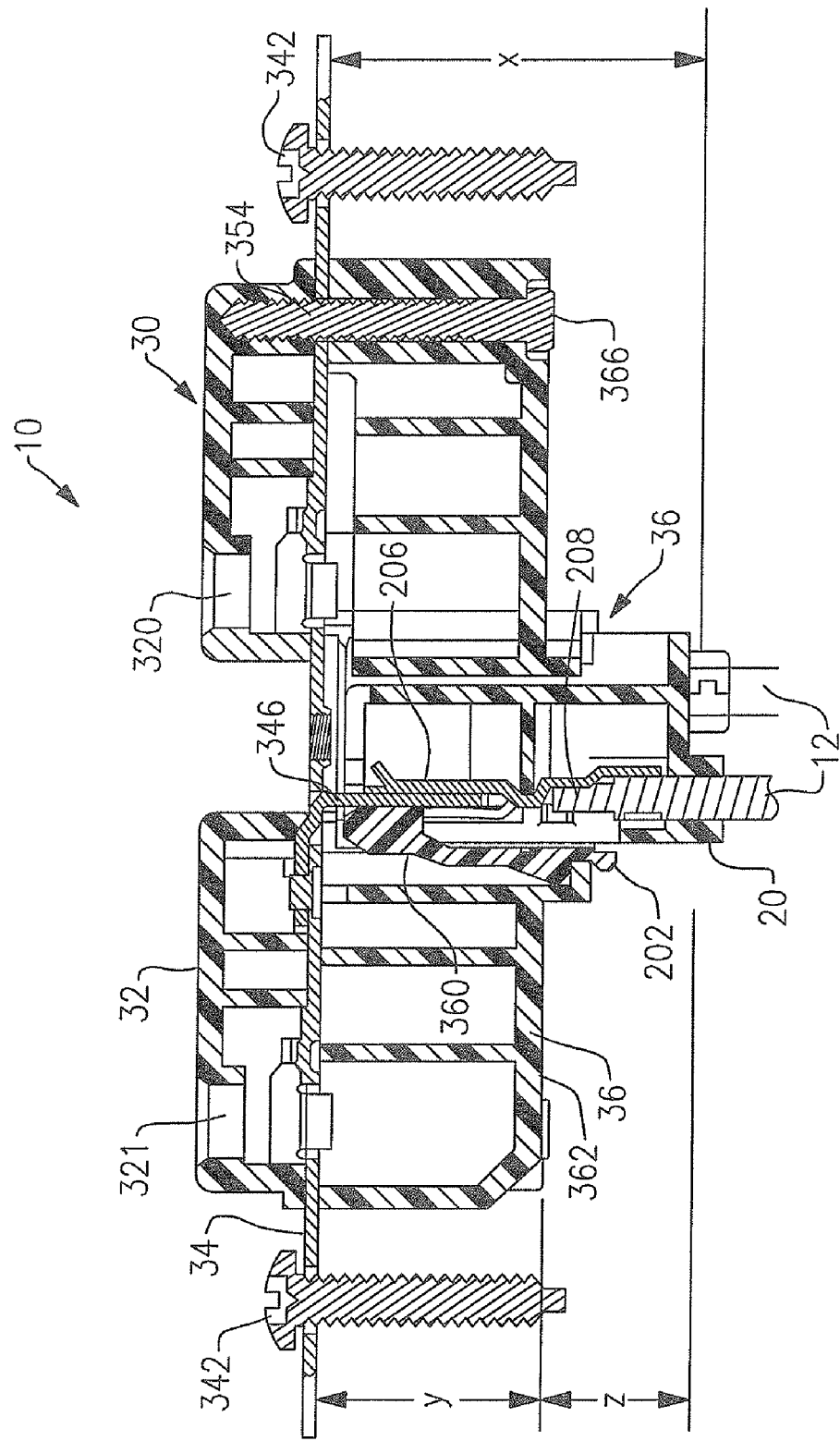
FIG. 17 is a cross-sectional view of the electrical wiring system shown in FIG. 16 with the plug connector inserted into the receptacle.

FIG. 17 is a cross-sectional view of the electrical wiring system 10 shown in FIG. 16 with the plug connector inserted into the receptacle. Cover 32, ground strap 34, and body member 36 are joined together as a single unit 30 by inserting screws 366 into holes 364 disposed in body member 36. Screws 366 pass through the holes 354 disposed in ground strap 34 and are tightened by screw threads disposed in cover 32.

In FIG. 17, plug connector 20 is inserted into receptacle 360. Plug body 200 fits snugly into receptacle 360. When fully inserted, latch member 202 prevents plug body 200 from disengaging receptacle 360. In the interior portion of plug body 200, wires 12 are connected to plug contacts 206 at termination point 208. The plug contact depicted in FIG. 17 is a ground contact that is engaged with receptacle ground contact 346. In one embodiment of the present invention, there is electrical continuity between wire 12, contact 206, device contact 346, and ground strap 34. In another embodiment, device ground contact 346 is electrically isolated from ground strap 34. Accordingly, there is only electrical continuity between wire 12, contact 206, and device ground contact 346.

FIG. 17 provides three dimensions. Dimension "x" is a variable dimension from the back of ground strap 34 to the bottom of plug connector 20. The value of dimension "x" is largely dependent on dimension "y", which is the distance from the back of strap 34 to the rear major surface 362 of body 36. Dimension "z" is the distance that a fully inserted plug connector 20 extends from the major rear surface 362 of body 36. Referring back to dimension "y", the distance from the back of strap 34 to the rear major surface 362 of body 36 may vary depending on the functionality of the wiring device 10. If wiring device 10 only includes user accessible receptacles 320, then "y" may equal approximately 0.635". However, in certain instances "y" may be as great as 2.50". In certain embodiments, "z" is approximately 0.436". The thickness of cover member 32 is typically 0.358". A typical thickness of ground strap 34 is approximately 0.042". As noted above, body member 36 may be altered to accommodate any number of electrical wiring devices. Examples of such devices include, but are not limited to, electrical receptacles, various types of switches, ground fault circuit interrupters (GFCIs), and/or arc fault circuit interrupters (AFCIs).

Referring to FIG. 18, an exploded view of a wiring device in accordance with a first embodiment of the present invention is disclosed. As shown, ground strap 34 is generally planar in nature and includes an aperture on either side of central portion 344 to accommodate neutral contact assembly 42 and hot contact assembly 44. Neutral contact assembly 42 includes user accessible contacts 420 and 424. Neutral contacts 420, 424 are aligned with user accessible neutral blade receptacle 322 in cover 32. Contact 422 is configured to mate with the plug neutral contacts disposed in plug connector 20. Similarly, hot contacts 440, 444 are aligned with user accessible hot blade receptacle 324 in cover 32. Contact 442 is configured to mate with the plug hot contacts disposed in plug connector 20. Note also that planar ground strap 34 includes a ground blade 346 that is configured to mate with the ground contacts disposed in plug connector 20. Cover 32 also includes ground blade receptacle openings 320. Openings 320 are aligned with ground contacts 348 disposed on ground strap 34. As noted above, the wiring device 10 is joined together by screws 366, which are inserted through holes 364 in the body member 36 and holes 354 disposed in ground strap 34. Cover member 32 includes screw threads that accommodate screws 366.

Figure 19A:
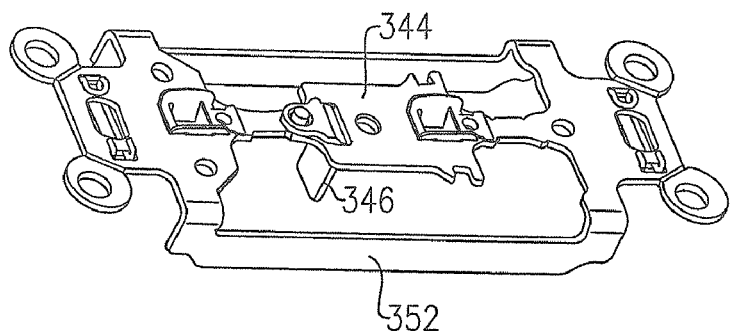
FIG. 19A is a detail view of the ground strap assembly shown in FIG. 18.
Figure 19B:
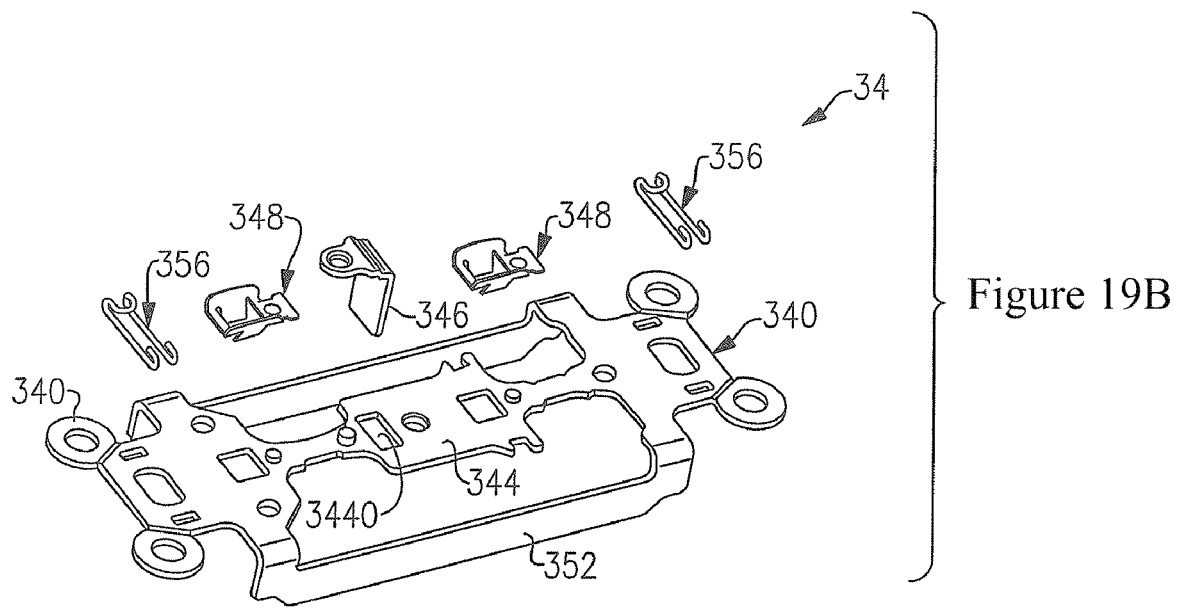
FIG. 19B is an exploded view of the ground strap assembly shown in FIG. 19A.

FIG. 19A is a detail view of the ground strap assembly shown in FIG. 18. FIG. 19B is an exploded view of the ground strap assembly 34 shown in FIG. 19A. Ground strap 34 includes a two mounting yokes 340 that are disposed at a proximal end of the ground strap and a distal end of the ground strap. The mounting yokes are connected along a central axis of the ground strap by central portion 344. The mounting yokes and central portion 344 are disposed in a single plane, i.e., these elements are coplanar. Ground contact 346 is riveted to central portion 344 and is configured to extend through hole 3440 into receptacle 360. Ground contacts 348 are riveted to ground strap 34 on either side of central portion 344. These contacts are aligned with user accessible ground blade apertures formed in cover member 32.

Ground strap 34 also includes two lateral support members 352 that rigidly interconnect the two mounting yokes 340. As shown, the lateral support members 352 are substantially parallel one to the other and disposed along a lateral side portion of the body member perimeter.

Figure 20:
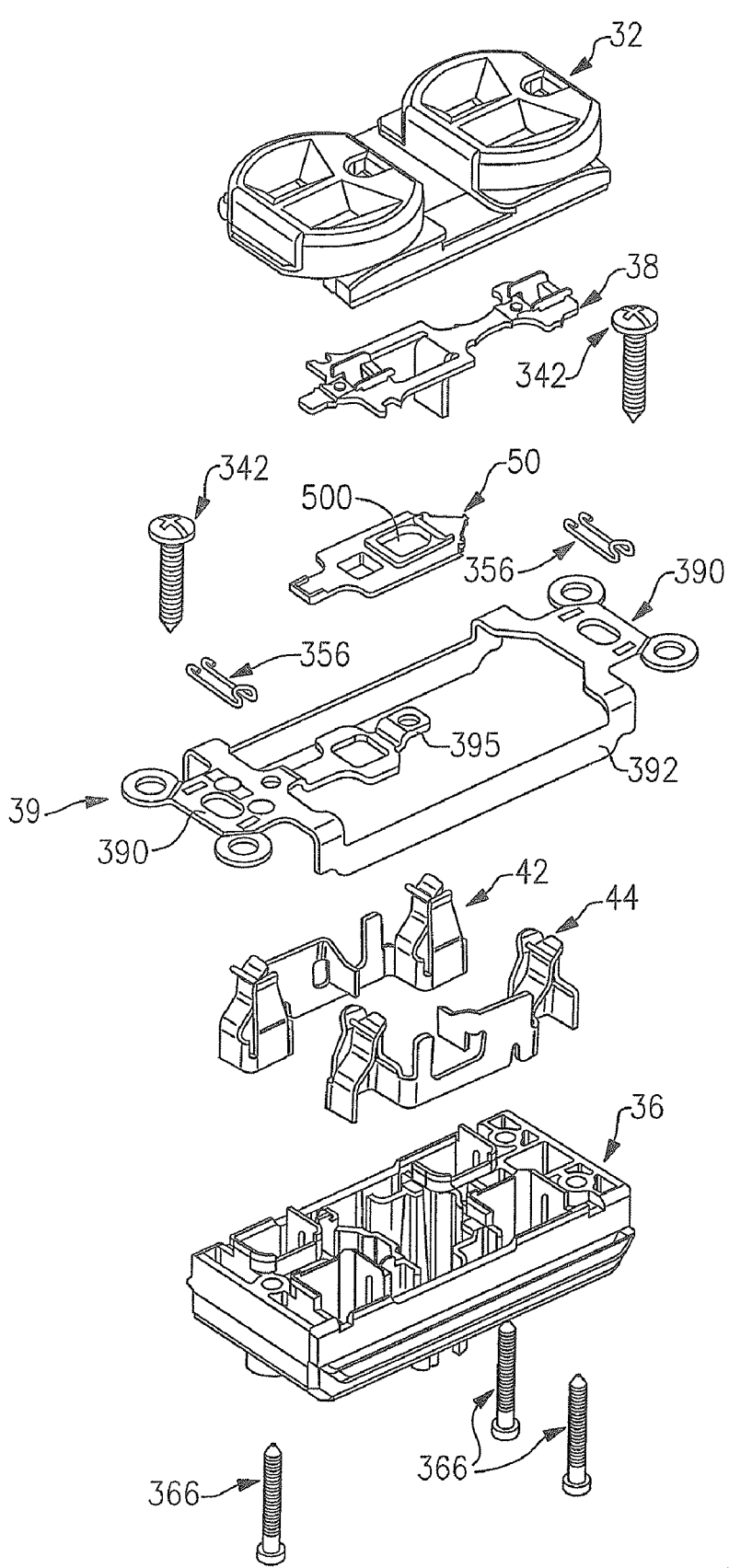
FIG. 20 is an exploded view of a wiring device in accordance with a second embodiment of the present invention.

As embodied herein and depicted in FIG. 20, an exploded view of a wiring device 10 in accordance with a second embodiment of the present invention is disclosed. Of interest in this embodiment is modified ground strap 39, ground plate 38, and insulator member 50. With regard to ground strap 39, the central portion 395 does not interconnect the proximal and distal mounting yokes 390. However, ground strap 39 includes lateral support members 392. Support members 392 are identical to those previously described. Instead of riveting the ground contacts to the ground strap as described in the first embodiment, an isolated ground plate 38 is provided. To provide electrical isolation, insulator member 50 is disposed between the ground plate 38 and the ground strap 39. Accordingly, the mounting yokes 390 are grounded to the conduit system, whereas equipment ground is directly connected to the neutral at the service entrance, by way of an insulated equipment ground conductor. In essence, the conduit grounding system is electrically isolated from the grounding circuit. This arrangement eliminates the EMI propagating in the conduit system. As such, a relatively noise free grounding path is provided, resulting in improved electronic equipment operation.

Figure 21:
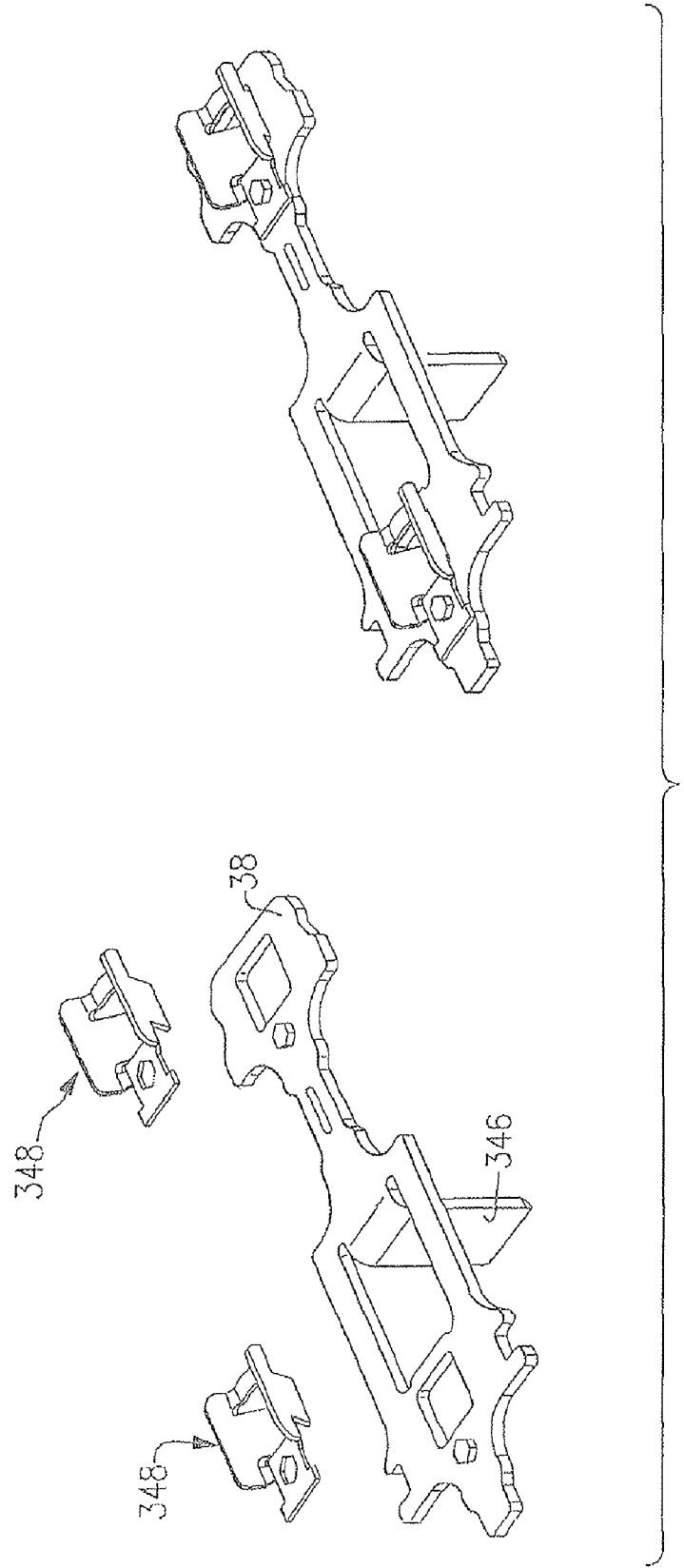
FIG. 21 is a detail view of the isolated ground plate shown in FIG. 20.

FIG. 21 is a detail view of the isolated ground plate shown in FIG. 20. This detail view highlights the fact that user accessible ground contacts 346, 348 are riveted to ground plate 38, instead of to the ground strap 39.

Figure 22:
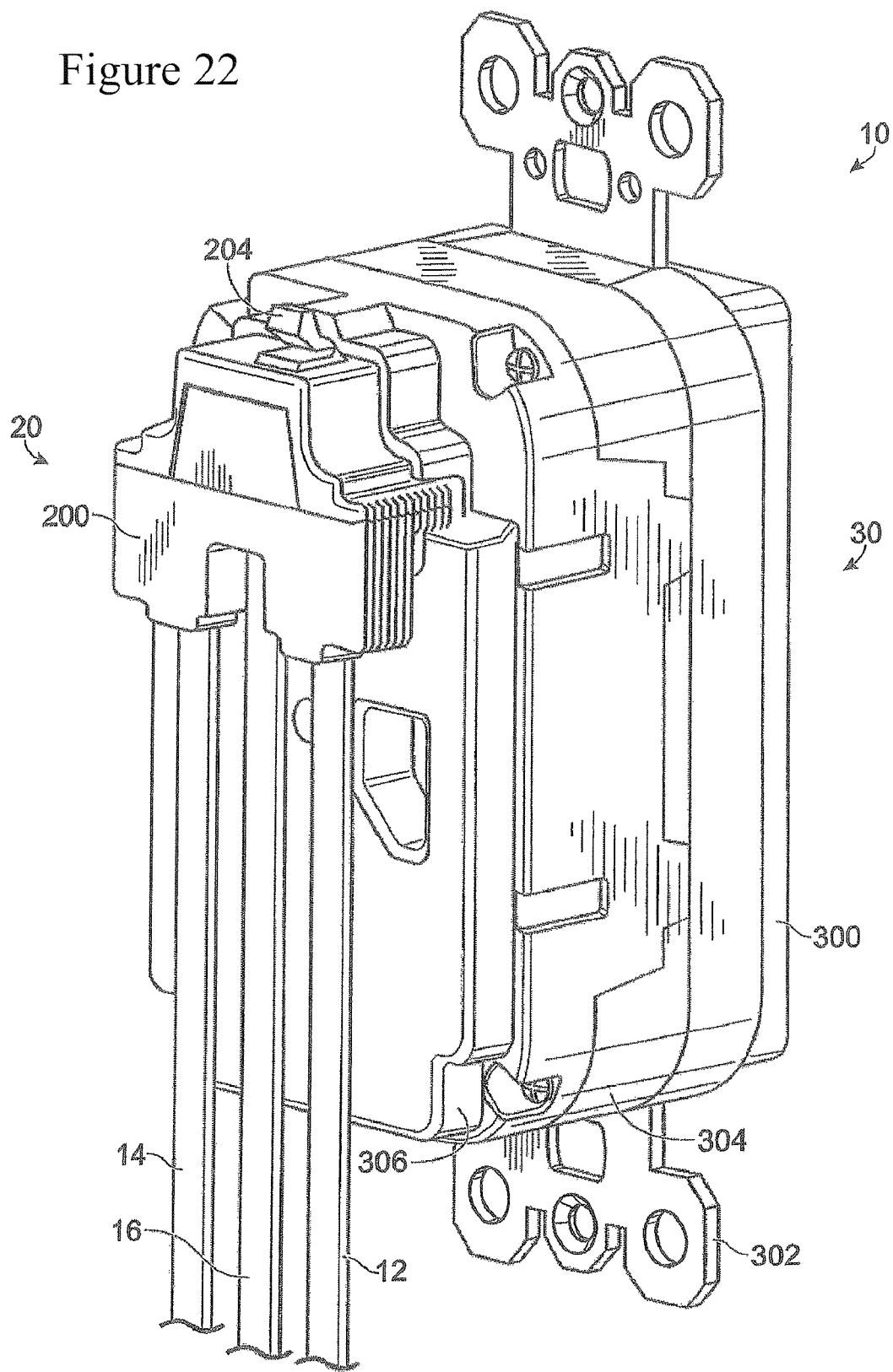
FIG. 22 is a perspective view of an electrical wiring system in accordance with a first embodiment of the present invention.

As embodied herein, and depicted in FIG. 22, a perspective view of an electrical wiring system 10 in accordance with a first embodiment of the present invention is disclosed. System 10 includes a plug connector 20 that mates with electrical wiring device 30. Electrical power conductor wires (12, 14, and 16) are terminated at plug 20. The present invention may be configured to accommodate 2 wire systems and three-phase (5-wire) systems, as well as the 3-wire system shown. Further, system 10 of the present invention may be adapted to a wiring system that employs more than 5 wires. When plug 20 is installed in device 30, electrical continuity is established between the plurality of wires (12, 14, and 16) and the wiring device 30. One feature of the present invention is that it includes no external terminal connections. Power is provided to device 30 via plug connector 20. Service, depending on the nature of the device, is provided to the user via the front face.

The exterior portion of wiring device 30 includes a cover 300, a separator portion 304, and a body member 306. A strap 302 is disposed between the cover 300 and the separator 304. Body 306, separator 304 and cover 300 are injection molded components, again, using materials such as polymers, polycarbonate, or nylon materials. The contacts (3160, 3180, 3200—see FIG. 23) are fabricated using copper alloy materials. They may be plated with an electrically conductive material such as a tin alloy. Strap 302 may be fabricated using polymer, polycarbonate or nylon materials, a copper alloy or plated steel. When an electrically conductive material is used, strap 302 serves to ground an electrically conductive outlet box or mounting surface to the wiring device. When an electrically non-conductive material is used, the strap may be integral to body 306, separator 304, or cover 300.

Plug 20 includes a housing 200 and connector contacts (which are disposed within body 200 and therefore not shown in the Figure). In the embodiment shown, connector contacts 202 are female contacts designed to accept male contacts disposed within wiring device 30. However, those of ordinary skill in the art will understand that system 10 may be designed the other way around, i.e., with male plug contacts and female device contacts.

In the embodiment depicted in FIG. 22, plug connector 20 features a novel 90° design. The electrical power conductors (12, 14, and 16) enter the plug connector at an angle of approximately 90° relative to the orientation of the contacts. This feature reduces the width dimension of the plug connector, allowing installation of the device in a greater variety of wiring boxes. By way of example, an elongated wiring box, commonly referred to as "raceway" restricts the width dimension of the device to less than about 1.70 inches. In one embodiment of the present invention, the width dimension (depth behind the strap to the rearward surface of the plug connector) is 1.52 inches. The conductors (12, 14, and 16) closely parallel the back surface of body member 306 in this embodiment.

Figure 23:
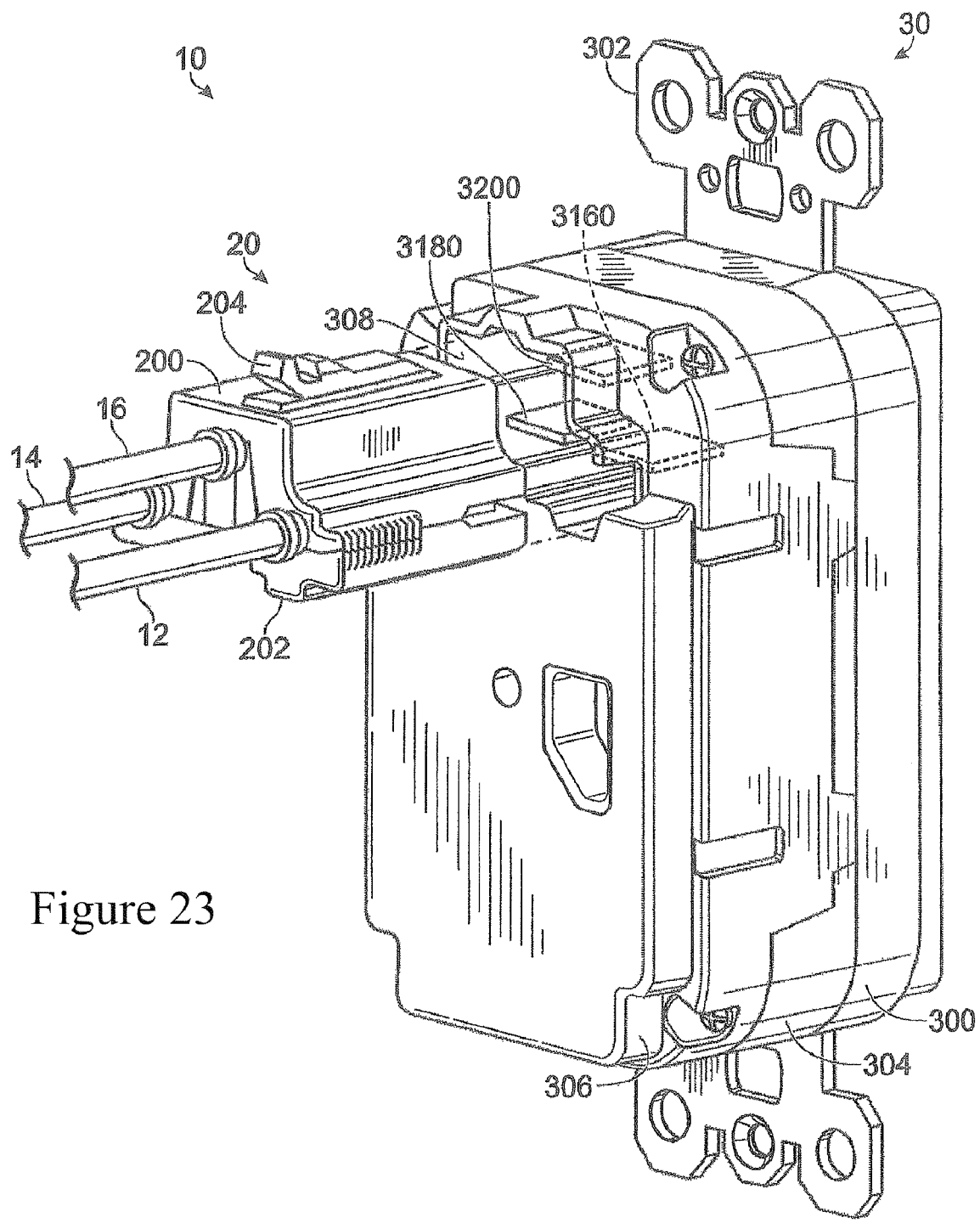
FIG. 23 is a perspective view of an electrical wiring system in accordance with a second embodiment of the present invention.

Referring to FIG. 23, a perspective view of an electrical wiring system in accordance with a second embodiment of the present invention is disclosed. In this embodiment, plug connector 20 aligns the conductors (12, 14, and 16) with the contacts disposed therein. The wiring device 30 is identical to the device depicted in FIG. 22. FIG. 23 also provides a rear-view of wiring device 30. Body member 306 includes a rear-receptacle 308 formed therein. Receptacle 308 is shaped to accommodate plug connector 20. Receptacle 308 includes hot line receptacle blade 3160, neutral line receptacle blade 3180, and ground receptacle blade 3200. Of course, each male contact blade mates with a corresponding female contact mechanism in plug connector 20. Housing 200 includes latch mechanism 204. When plug connector 20 is inserted into receptacle 308, latch mechanism 204 prevents plug 20 from being pulled out of receptacle 308.

Latch mechanism 204 is configured to meet Underwriter's Laboratories (UL) standards for a locking connector. In this case, UL requires that a static pull test of 20 pounds be applied to the connector for one minute. During the test, plug connector 20 may not separate from receptacle 308. During operation, latch mechanism 204 flexes upon insertion of plug connector 20. The flexure latch mechanism 204 relaxes to a non-flexed position upon successful locking of plug connector 20 to receptacle 308, and emits an audible snapping sound or visual indication that locking has been achieved. Flexible latch mechanism 204 may also be configured to be accessible to the finger or to a tool when plug connector 20 is locked to receptacle 308. In this embodiment, when latch mechanism 204 is accessed and flexed manually, or by the tool, plug connector 20 can be removed from receptacle 308. The flexure is oriented in a direction opposite to the insertion direction in order to meet requirements in Underwriters Laboratories (UL) standards. In another embodiment, plug connector 20 can be locked into receptacle 308 using screws or any number of fastening means familiar to those skilled in the art.

Those of ordinary skill in the art will recognize that any suitable materials may be employed in fabricating plug connector 20. In one embodiment, plug housing 200 is formed from injection molded plastic, polycarbonate, or other polymer based materials. The plug connector contacts may be fabricated using any suitable conductive material such as a copper alloy material. Plug connector housing 200 may be fabricated by coupling an upper housing to a lower housing, i.e., the upper housing is snapped onto lower housing to thereby enclose and terminate wires (12,14,16) in plug connector 20.

In one embodiment, the female electrical contacts disposed in plug connector 20 may include a wire seat portion that accommodates the wire conductor. The wire conductor (12, 14, and 16) is subsequently bonded to the seat portion. Each female contact also includes two exterior spring contact members and an interior spring contact member configured to hold the male contact blade therebetween. When the male receptacle contact blade (3160, 3180, 3200) are inserted, the exterior spring contact members separate from the interior spring contact member to receive and hold the male contact blade firmly therebetween. Reference is made to U.S. Pat. No. 6,994,585, which is incorporated herein by reference as though fully set forth in its entirety, for a more detailed explanation of the female contact arrangement described herein.

In an alternate embodiment of the present invention, the female contacts may be pre-disposed in either the upper portion or in the lower portion of housing 200. In this embodiment, each female contact is equipped with an insulation-displacement blade element. Of course, when the upper housing portion is snapped onto the lower housing portion, or vice-versa, the blade element cuts through and displaces the insulation on the wire (12,14,16) until electrical continuity is established between the wire (12,14,16) and the female contact. In yet another alternate embodiment of the present invention, the female contacts in plug 20 may be terminated to wire leads at the factory. The pre-terminated leads may be coupled to wires (12, 14, 16) using twist-on wire connectors. Reference is made to U.S. Pat. No. 6,994,585, which is incorporated herein by reference as though fully set forth in its entirety, for a more detailed explanation of the plug connector termination methods employed by the present invention.

Figure 24:
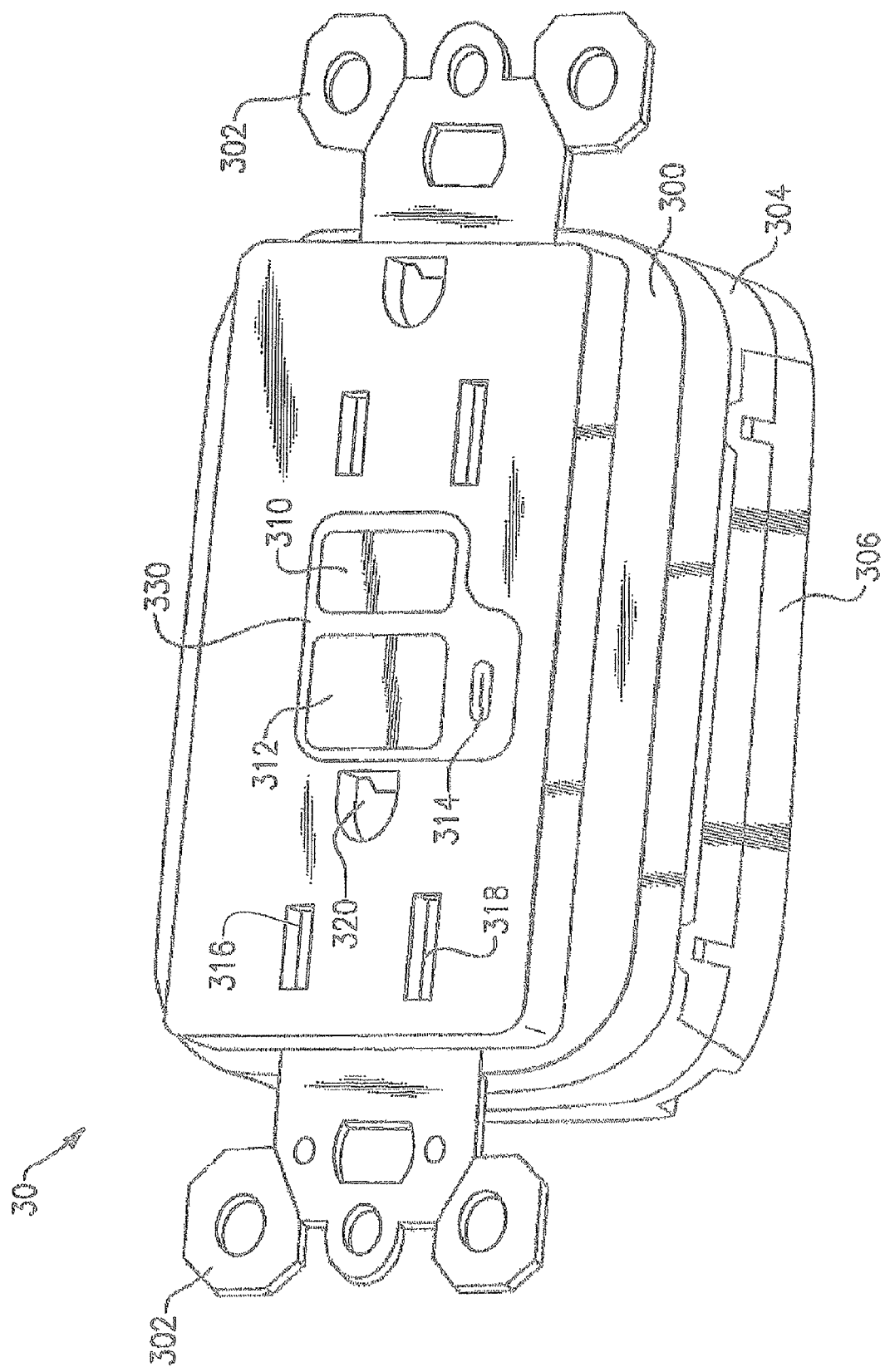
FIG. 24 is a top perspective view of the illustrating a cover member of the electrical wiring device in accordance with an embodiment of the present invention.

Referring to FIG. 24, a top perspective view of cover member 300 of the electrical wiring device 30 is disclosed. In one embodiment of the present invention, cover member 300 includes two user-accessible load receptacles, each having openings for a hot load contact 316, neutral load contact 318, and ground contact 320. An indented portion 330 is disposed in a central portion of cover 300. Indented portion 330 accommodates test button 310, reset button 312, and trip indicator 314. Trip indicator 314 is aligned with the reset button 312. When the indicator 314 is illuminated, the user is guided to the reset button 312. If the device has not reached an end-of-life condition, it will be reset when the reset button 312 is actuated, extinguishing the trip indicator light 314.

Figure 25:
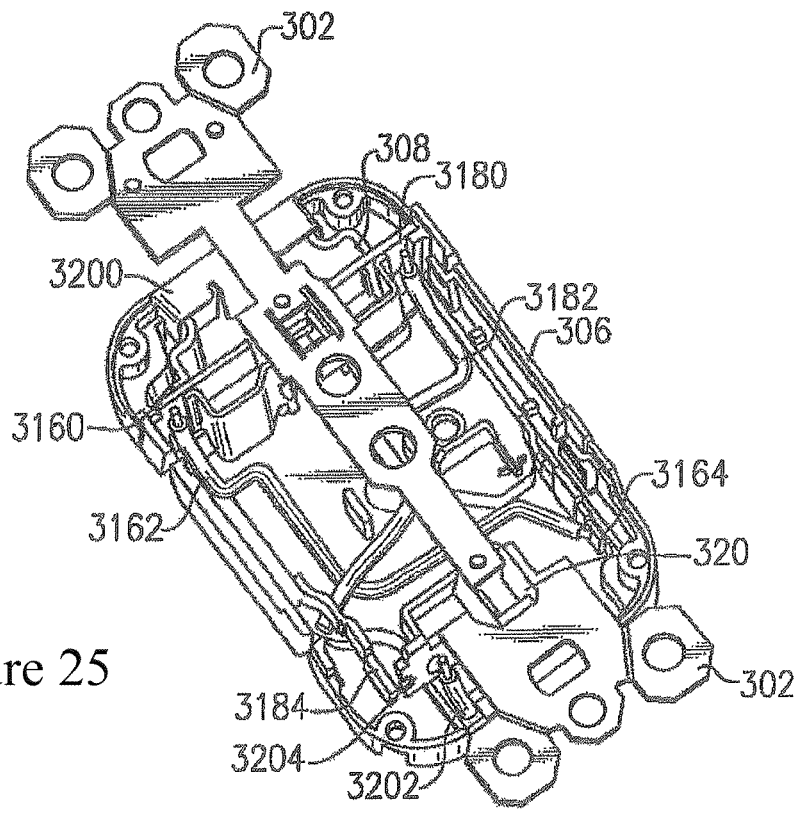
FIG. 25 is sectional view showing the rear body member of the electrical wiring device in accordance with an embodiment of the present invention.

Referring to FIG. 25, a sectional view showing the rear body member of the electrical wiring device 30 is shown. Receptacle opening 308 is disposed in one end of body member 306. The hot terminal 3164 and the neutral terminal 3184 are disposed in the other end of body member 306 on either side of ground strap 302. Receptacle opening 308 consists of a molded material that fixes the hot contact blade 3160, the neutral contact blade 3180, and the ground blade 3200 is a predetermined geometric relationship to facilitate mating with plug connector 20. The shape of molded opening 308 also conforms to the plug connector form factor.

Before any further discussion, it must be noted that the ground strap member 302 is not supported by body member 306. Strap member 302 is, in fact, inserted into separator member 304. Thus, in the view of FIG. 25, strap 302 is suspended a predetermined distance over the other components shown in the view. Strap 302 is shown in this manner to clearly illustrate the various power connections disposed in body member 306.

A hot conductor 3162 is bonded to terminal member 3164. The hot conductor 3162 extends diagonally toward hot receptacle contact blade 3160 and is bonded thereto. The hot receptacle contact blade 3160 is accessible to the rear portion of device 30 via receptacle opening 308. A neutral conductor 3182 is bonded to the neutral terminal member 3184 and extends diagonally toward neutral receptacle contact blade 3180. The neutral conductor 3182 is bonded to the neutral receptacle contact blade 3180 after it crosses over the hot conductor 3162 in the interior portion of body member 306. The neutral receptacle contact blade 3180 is accessible to the rear portion of device 30 via receptacle opening 308. The ground strap 302 includes a connection tab 3204 that is bonded to ground wire 3202. Ground wire 3202 is inserted through the separator 304 (not shown) and extends along the length of body member 306 until it is terminated at receptacle ground blade member 3200 disposed in receptacle opening 308. Ground strap 302 also includes ground contacts 320 in communication with openings disposed in cover member 300.

Figure 26:
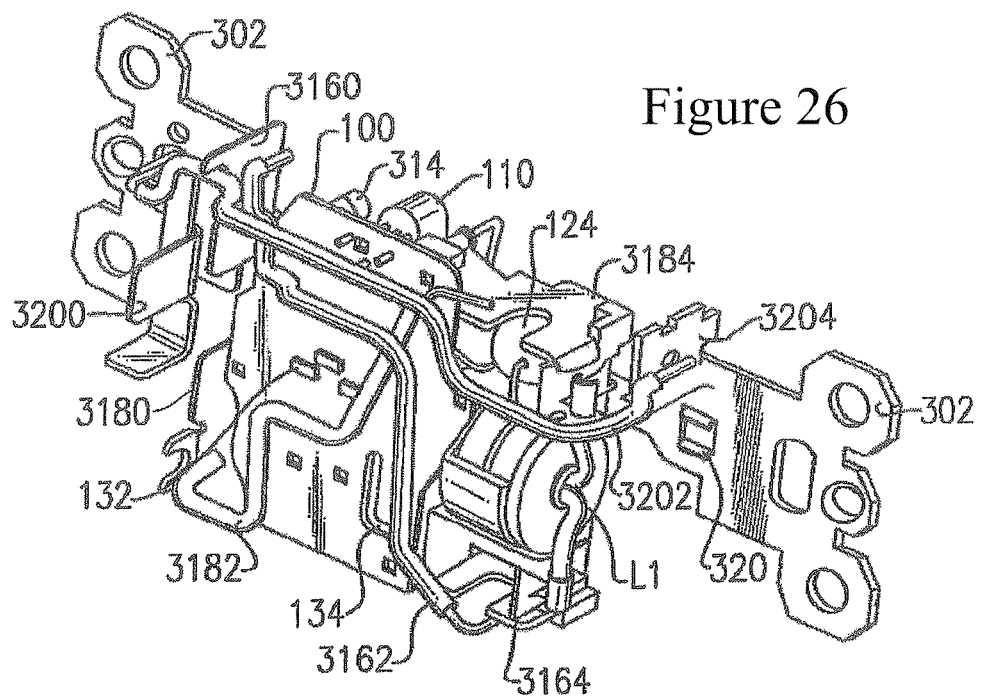
FIG. 26 is a detail view showing a rear portion of the printed circuit board assembly in accordance with an embodiment of the present invention.

FIG. 26 is a detail view showing a rear portion of the printed circuit board assembly. In particular, this view illustrates the compact spatial relationship of the ground strap 302, terminals (3164, 3184), and receptacle blades (3160, 3180, 3200) relative to PCB 100. The back side of PCB 100 includes several discrete components 132 disposed thereon. The discrete components 132 may include resistors, capacitors, semiconductors, and/or an integrated detector circuit. A cut-out 134 is formed in PCB 100 as a spark gap that isolates components from other circuitry. Other components such as SCR 110, MOV 124, and LED 314 are disposed on the opposite side of PCB 100. Toroid assembly L1 is disposed adjacent to PCB 100 on a side opposite the receptacle 308. All of the components shown in FIG. 26, with the exception of ground strap 302 are disposed between body member 306 and separator member 304.

Figure 27:
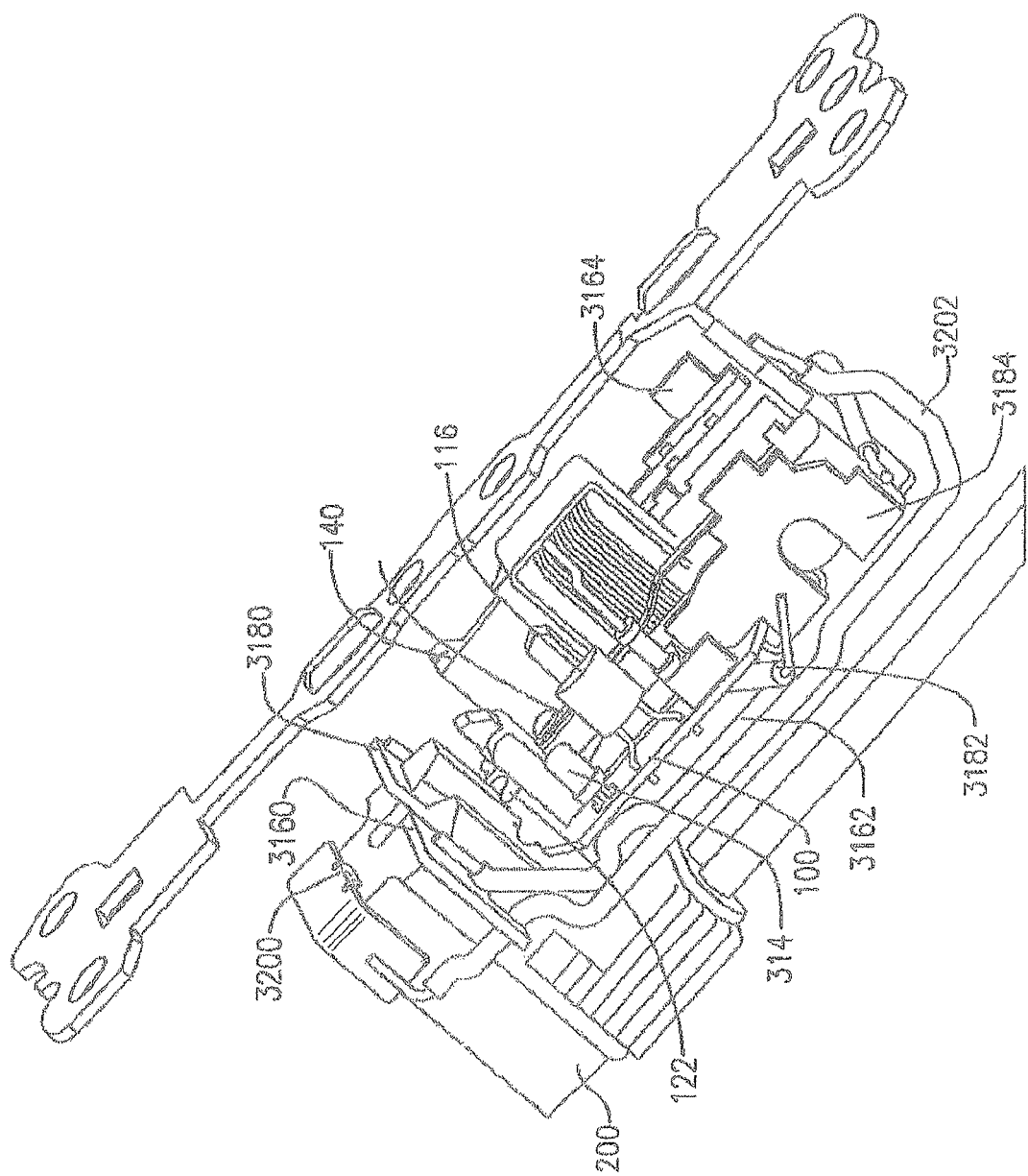
FIG. 27 is a detail side view of the printed circuit board assembly shown in FIG. 26.

FIG. 27 is a detail view showing a side view of the printed circuit board assembly depicted in FIG. 26. In this view, the back body 306, separator 304, and cover member 300 are omitted for clarity of illustration. In the discussion of FIG. 25, it was noted that strap 302 is disposed in the separator and therefore disposed a predetermined distance over the other components disposed on PCB 100. This arrangement is shown more clearly in the view provided by FIG. 27. PCB 100 includes SCR 110, solenoid 116, cantilevered interrupt structure 118, auxiliary switch mechanism 122, latch block 140

(also part of the circuit interrupter mechanism), and LED 314 disposed on one side of the PCB 100. Conductors 3162, 3182, and 3202 extend underneath PCB 100, between their respective terminal connections and their respective receptacle blade connections. At one end of PCB 100, MOV 124 and toroid assembly L1 (see FIG. 26) are nestled between hot line terminal 3164 and neutral line terminal 3184. At the far end of PCB 100, FIG. 6 shows plug connector 20 mated with the blade contacts (3160, 3180, and 3200) disposed in receptacle 308.

Those of ordinary skill in the art will understand that the aforementioned components disposed on PCB 100 implement a GFCI circuit. However, the present invention may be implemented using any suitable type of device including a transient voltage surge suppressor (TVSS), an arc fault circuit interrupter (AFCI), a timer mechanism, an occupancy sensor or other type of sensor, a thermostat, a night light, or a device that includes a combination of the above. Clearly, the form factor of cover member 300 will change accordingly.

Figure 28:
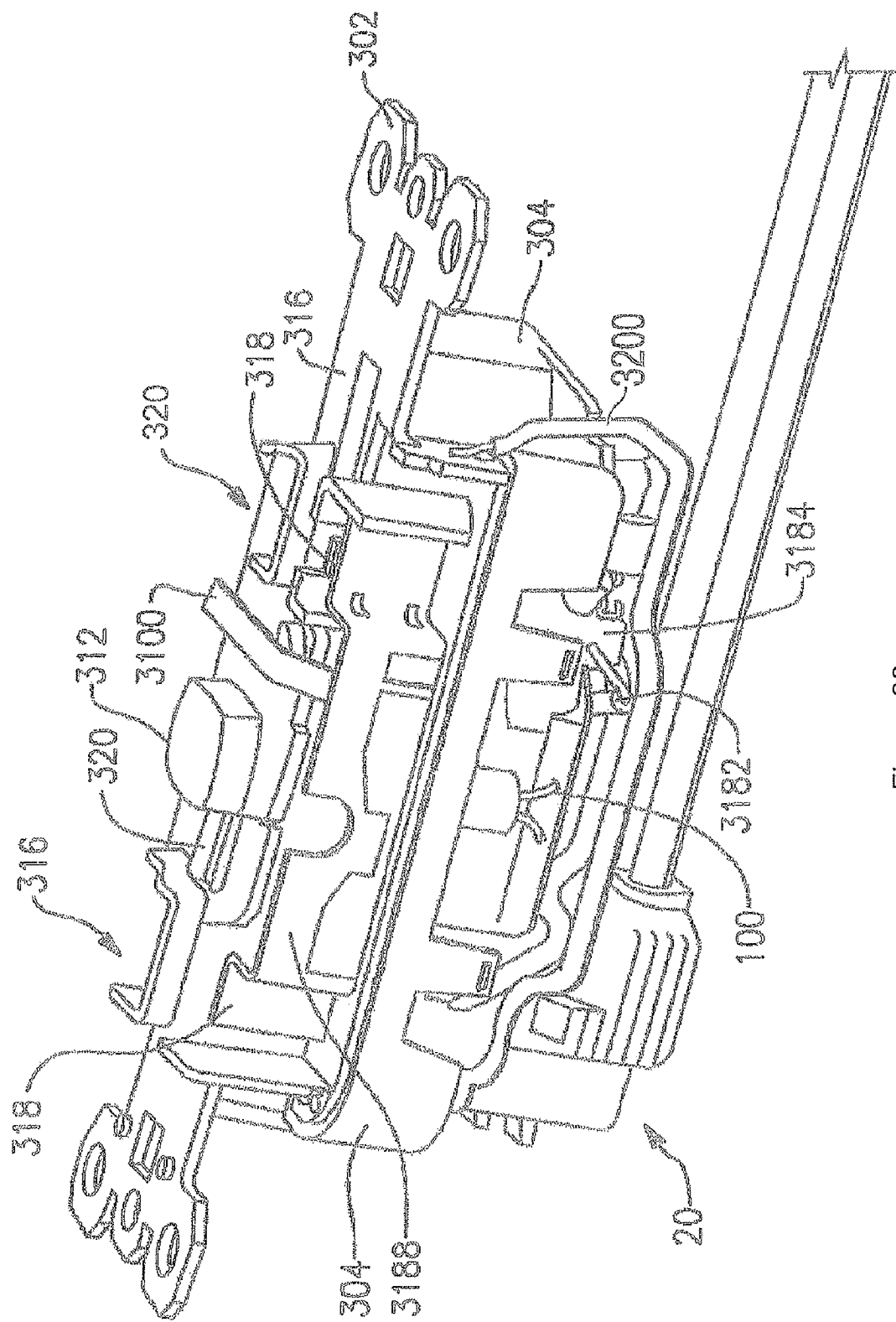
FIG. 28 is a detail side view of the printed circuit board assembly shown in FIG. 27 with the separator portion of the electrical wiring device.

FIG. 28 is a detail view illustrating the functionality of the separator portion 304. In fact, the main difference between FIG. 27 and FIG. 28 is the inclusion of separator member 304. PCB 100 has been discussed in detail above. What is of note is that separator member 304 accommodates and positions user accessible elements, such as the receptacle contact structures (318, 316), reset button 312, test switch 3100, and etc., between their respective positions on cover member 300 and their respective electrical connection with PCB 100. For example, user accessible neutral contact structure 3188 is inserted and disposed in a fixed position by separator 304 such that neutral face contacts 318 are in communication with the receptacle openings formed in cover member 300. At the same time, separator 304 ensures that electrical connectivity is established between the neutral contact structure 3188 and neutral line terminal 3184. The hot contact structure is the mirror image of the neutral contact structure. Thus, any discussion thereof would be duplicative. In any event, the aforementioned arrangement ensures that AC power provided by the plug 20/receptacle 308 connection is available to the user via the cover openings.

Figure 29:
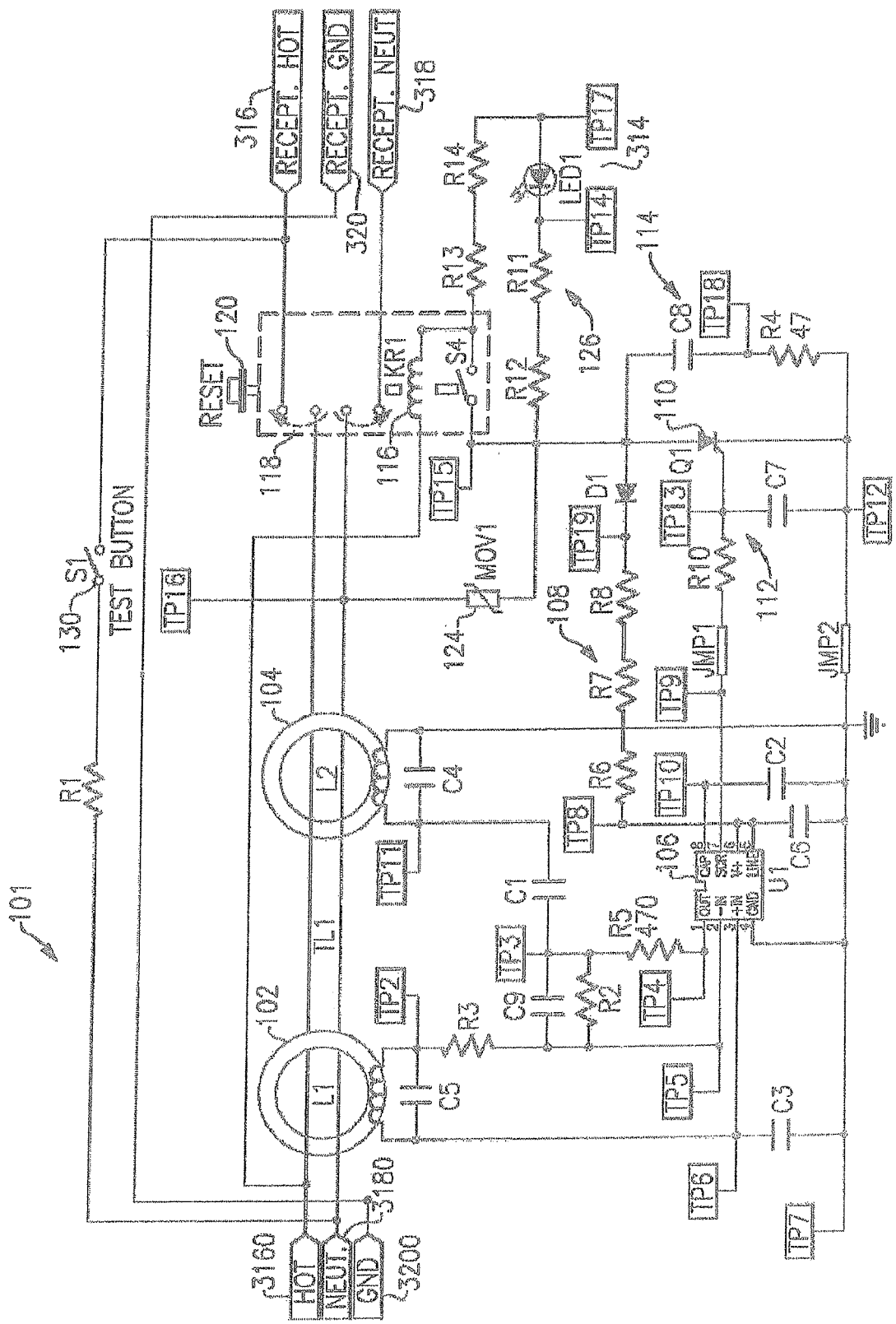
FIG. 29 is a schematic view of the protective circuit in accordance with an embodiment of the present invention.

As embodied herein and depicted in FIG. 29, a schematic view of the protective circuit employed in the electrical wiring device of the present invention is disclosed. Moving from left to right in the schematic, it is seen that GFCI 101 includes hot line receptacle blade 3160, neutral line receptacle blade 3180, and ground receptacle blade 3200. On the load side of device 10, there are a pair of user accessible receptacles, each including a hot receptacle terminal 316 and a neutral receptacle terminal 318. As noted above, there are no external terminal elements provided by device 30.

The ground fault circuitry includes a differential transformer 102 which is configured to sense load-side ground faults. Transformer 104 is configured as a grounded neutral transmitter and is employed to sense grounded-neutral fault conditions. Both transformers are disposed in toroid assembly L1. Both differential transformer 102 and grounded-neutral transformer 104 are coupled to detector integrated circuit 106. Detector 106 is powered by a power supply circuit 108 connected to pin $V^+$ on detector 106. The detector output, provided on output pin SCR, is connected to the control input of SCR 110. Filter 112, comprising resistor R10 and capacitor C7, low-pass filter the detector output signal. GFCI 101 also includes a snubber circuit 114 that includes resistor R4 and capacitor C8. Snubber circuit 114 prevents voltage transients from triggering SCR 110.

When SCR 110 is turned ON, solenoid 116 is energized, actuating circuit interrupter 118. Solenoid 116 remains energized for a time period that is typically less than about 25 milliseconds. Circuit interrupter 118 trips, resulting in the line terminals being disconnected from respective load terminals. After the fault condition has been eliminated, the circuit interrupter 118 may be reset by way of reset button 120. In one embodiment, the reset mechanism 120 is purely mechanical in nature and does not include any electrical contacts for test initiation.

It will be apparent to those of ordinary skill in the pertinent art that modifications and variations can be made to circuit interrupter of the present invention depending on contact structure implementation. For example, circuit interrupter 118 may be implemented using a cantilevered contact structure. The line terminals (3160, 3180) are electrically connected to the receptacle load terminals when the device 10 is reset. When in the tripped state, the line and receptacle contacts are disconnected from each of the other contacts.

GFCI 101 addresses certain end of life conditions by denying power to the load when the device is unable to function. As an example of an end-of-life condition, solenoid 116 is susceptible to burn-out if SCR 110 becomes shorted out, or is permanently turned ON. Solenoid 116 may burn out if it is energized for more than about 1 second. Once the solenoid 116 burns out, the circuit interrupter 118 is incapable of being tripped. Solenoid burn-out prevention is provided by auxiliary switch 122. Auxiliary switch 122 is configured to open when the circuit interrupter 118 is in the tripped position. If SCR 110 is shorted out, or permanently ON, auxiliary switch 122 ensures that solenoid 116 is not permanently connected to a current source. The user may attempt to reset the device 10 by depressing the reset button 120, but the circuit interrupter 118 will immediately trip in response to the current flowing through the solenoid 116. Because the trip mechanism 118 is coupled to the auxiliary switch 122, auxiliary switch 122 is opened before solenoid 116 burns out.

Another failure mode that is addressed by GFCI 101 relates to the end-of-life failure mode of movistor (MOV) 124. MOV 124 is disposed in series with auxiliary switch 122 and trip solenoid 116. This arrangement significantly reduces the probability of damage due to an over-current situation. When MOV 124 reaches end-of-life and shorts out, trip solenoid 116 is energized and auxiliary switch 122 is opened. As previously described, when auxiliary switch 122 opens, the flow of short circuit current is terminated before any damage to GFCI 101 ensues.

GFCI 101 also includes trip indication circuit 126. Trip indicator 126 is implemented by placing LED1 and series resistors (R11-R14) in parallel with auxiliary switch 122. LED1 is configured to emit a visual signal when circuit interrupter 118 and auxiliary switch 122 are in an open state (tripped).

GFCI 101 also includes a test circuit 128. The test circuit 128 is coupled between the line neutral terminal 3180 and the hot receptacle terminal 316. The test circuit includes a test button 130 disposed in series with test resistor R1.

Figure 30:
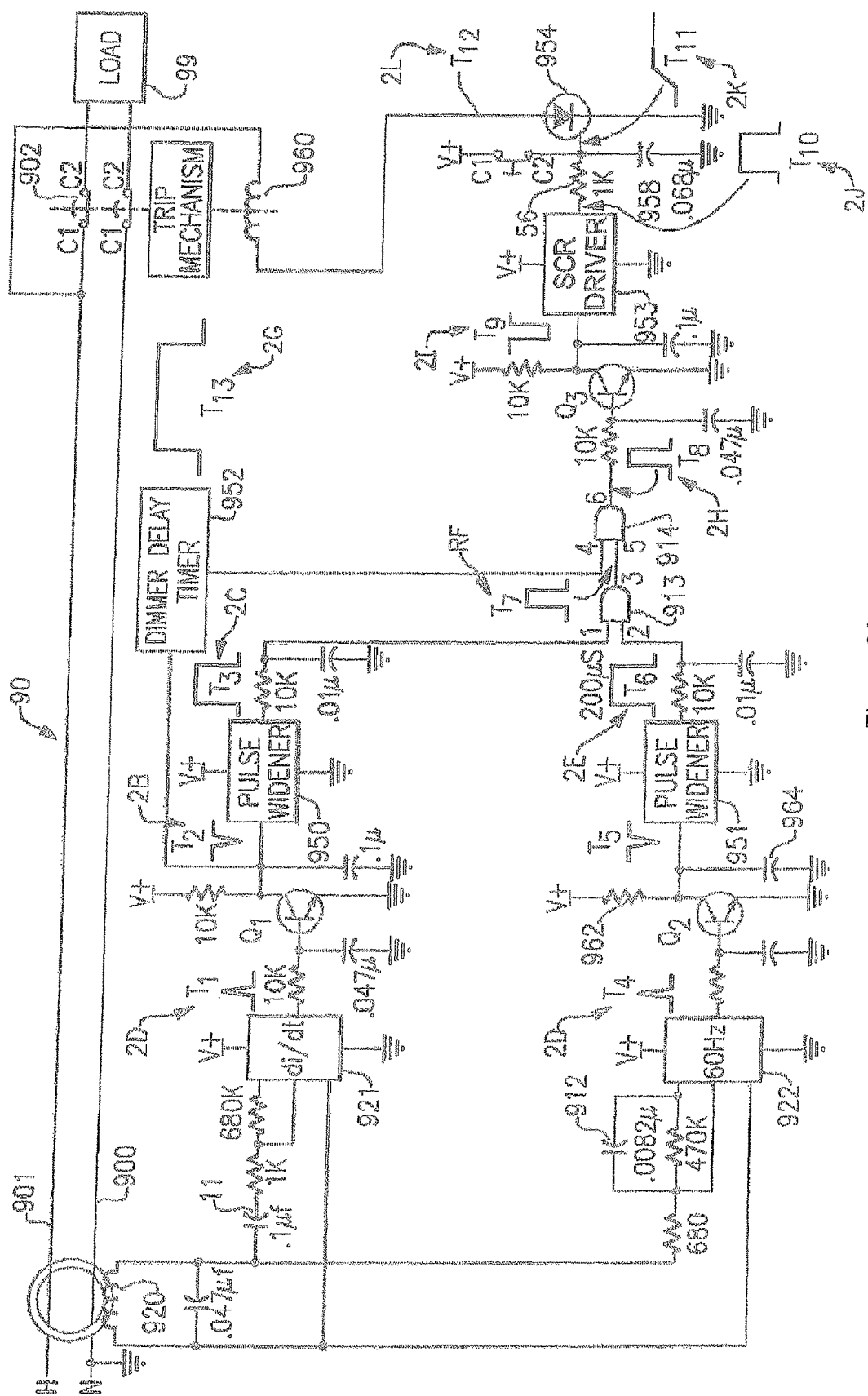
FIG. 30 is a schematic of an arc fault circuit interrupter (AFCI) in accordance with the present invention.

Referring to FIG. 30, a schematic of an arc fault circuit interrupter (AFCI) 90 in accordance with the present invention is shown. AFCI 90 is formed from components that are readily available and that can be easily integrated into an electrical receptacle. The circuit is designed so that it can be manufactured in the same form as ground fault circuit interrupter (GFCI) receptacle devices. AFCI 90 protects an electrical circuit and includes at least a neutral conductor 900 and a line conductor 901 connected to a power source (not shown). A ground conductor (not shown) is optionally present. AFCI 90 detects electrical arcs occurring between line conductor 901 and ground, neutral conductor 900 and ground should the power source be of reverse polarity, or line conductor 901 and neutral conductor 900.

A circuit interrupter 902 is connected in series with line conductor 901 between the power source and a load 99. This embodiment incorporates a first stage arc sensor 920, shown as a current transformer, which is configured to respond to the rate of change of neutral and/or line conductor current with respect to time. Sensor 920 may be designed with a physically small core of a type and number of secondary turns which gives optimum sensitivity during arcing. Either a single conductor (LINE) or both conductors can pass thru the sensor. The arc fault detector detects arcs that are either LINE to GROUND or LINE to NEUTRAL. Sensor 920 feeds two detector/amplifiers 921, 922. Detector/amplifiers 921, 922 are preferably RV4141A (Fairchild Semiconductor) low power ground fault interrupter ICs. Detector/amplifier 921, also referred to as the di/dt stage, has a high pass filter capacitor 911 on its input side, while detector/amplifier 922, also referred to as the 60 Hz or "threshold" stage, uses a low pass filter capacitor 912 in a feedback stage. The 60 Hz threshold detector 922 controls the level at which an arcing condition is to be detected, e.g., at a 75 Ampere or greater load current.

Figure 31:
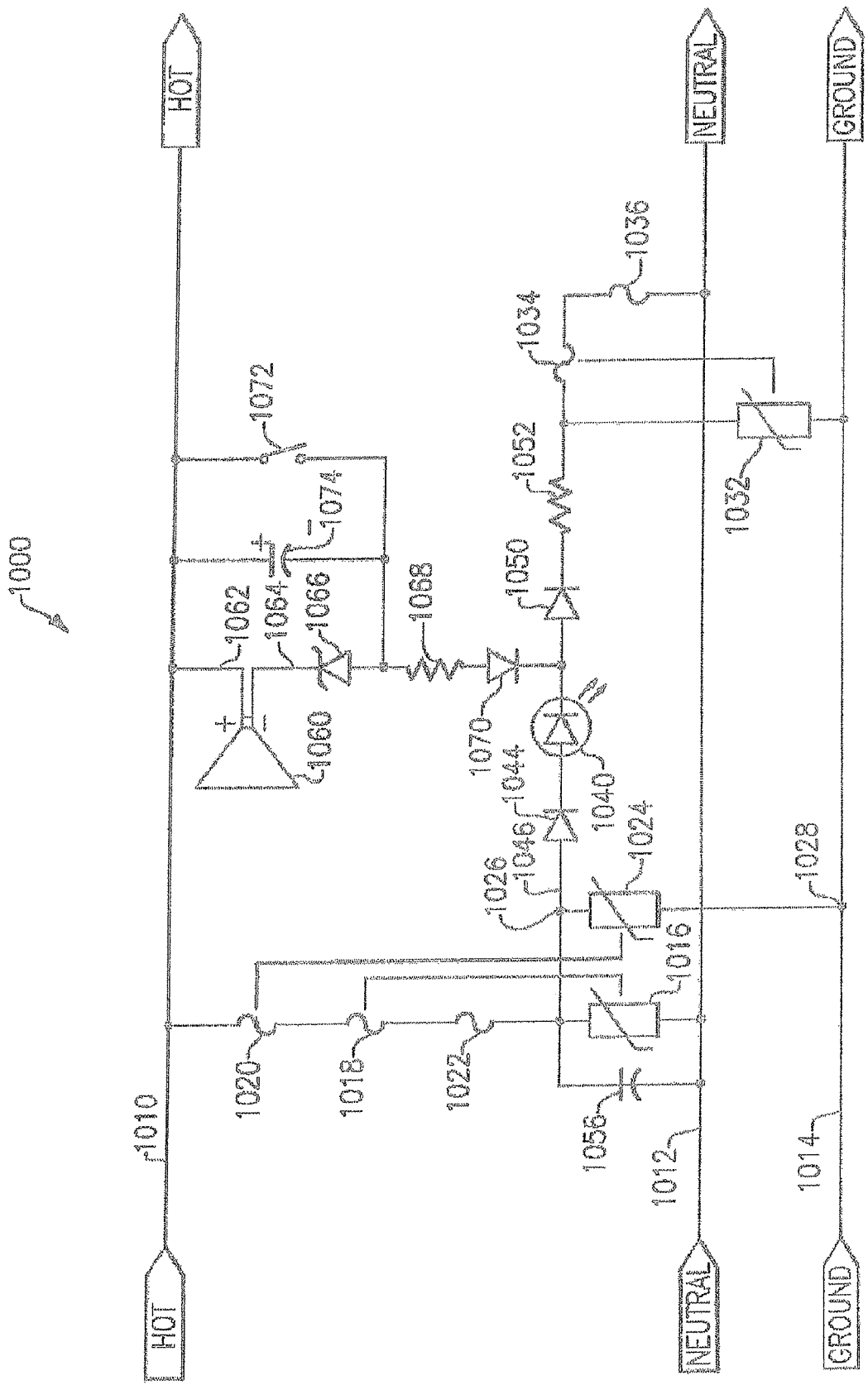
FIG. 31 is a schematic of a transient voltage surge suppressor (TVSS) in accordance with the present invention.

Referring now to FIG. 31, a schematic of a transient voltage surge suppressor (TVSS) in accordance with the present invention is shown. A TVSS, also known as a surge protective device (SPD), protects wiring or a load from overvoltages such as occurs during lightning storms. TVSS 1000 is configured to protect a low voltage 120 VAC single phase electrical circuit. The circuit includes three conductors that for convenience are referred to herein as the hot 1010, neutral 1012, and ground 1014 conductors. Transient voltages are known to occur between any pair of two of these conductors, and surge suppression devices, such as metal oxide varistors, are arranged to absorb transient voltage surges between any pair of the conductors. Fuses are provided for disconnecting the surge suppression devices from the circuit in the event of failure. Two specific failure modes are provided for, over current failure and temperature failure.

A first metal oxide varistor 1016, such as a 150 volt RMS metal oxide varistor is connected in series with a first thermally responsive fuse 1018, a second thermally responsive fuse 1020, and a conventional over current fuse 1022, and the series combination is connected between the hot conductor 1010 and the neutral conductor 1012. A second varistor 1024 of the same type is connected at one end 1026 in series with three fuses just mentioned, and the other end 1028 is connected to the ground conductor. These two varistors protect the hot-neutral and hot-ground pairs. Each of the thermally responsive fuses 1018, 1020 is positioned physically close to one of the varistors 1016, 1024, so that a rise in temperature of the varistor, as would be caused by a failure, causes the adjacent fuse to open. Since the two thermally responsive fuses 1018, 1020 are connected in series, the thermal failure of either of the varistors will cause the connection of both varistors to the hot conductor to be broken. A third metal oxide varistor 1032 is connected in series with another thermal fuse 1034, and an over current fuse 1036. The combination of the third varistor 1032 and the two fuses 1034, 1036 is connected between the neutral conductor 1012 and the ground conductor 1014. A thermal failure or an impedance failure of the third varistor device 1032 will cause one of the thermal fuse 1034 or the over current fuse 1036 to open, thereby disconnecting the varistor from the neutral-ground circuit.

A visible indicator, such as a light emitting diode 1040, is connected between the hot conductor 1010 and the neutral conductor, 1012 so that the light emitting diode 1040 is illuminated when all three of the varistors 1016, 1024, 1032 are functional, more particularly when none of the fuses 1018, 1020, 1022, 1034, 1036 is blown. A half wave rectifier diode 1044 has its anode 1046 connected to the electrical conductor in series with the two thermal fuses 1018, 1020 and the over current fuse 1022, feeding the first two varistors 1016, 1024. The cathode of the rectifier diode 1044 is connected to one terminal of the light emitting diode 1040. The other terminal of the light emitting diode 1040 is connected through a blocking diode 1050 to a current limiting resistor 1052, arranged in series, and then through the third thermal fuse 1034 and third over current fuse 1036 to the neutral electrical conductor 1012. A decoupling capacitor 1056 is preferably connected between the anode of the diode 1044 and the neutral conductor 1012.

When all of the fuses 1018, 1020, 1022, 1034 and 1036 are intact, that is when no fault has occurred; a circuit is created from the hot-conductor 1010 through the rectifier diode 1044, the light emitting diode 1040, the blocking diode 1050, the current limiting resistor 1052 and thence to the neutral conductor. The light emitting diode provides visible indication. If any of the three thermal fuses 1018, 1020, 1034 or two over current fuses opens 1022, 1036, the circuit is interrupted and the light emitting diode is extinguished, alerting a fault condition.

A TVSS 1010 in accordance with this invention also provides an audible indication of a fault in either of the varistors 1016, 1024 protecting the hot-neutral circuit or the hot-ground circuit respectively. A device, such as a simple buzzer 1060 or a piezoelectric device, has one terminal 1062 connected to the hot conductor 1010, and the other terminal 1064 connected by way of the series combination of a zener diode 1066, a current limiting resistor 1068, a first blocking diode 1070, second blocking diode 1050, second current limiting resistor 1052, the thermal fuse 1034, and the over current fuse 1036 to the neutral conductor 1012. The first and second thermal fuses 1018, 1020 and the first over current fuse 1022 are connected in series with rectifier diode 1044 and the light emitting diode 1040 between the hot electrical conductor 1010 and the junction of the two blocking diodes 1070, 1050 just mentioned, so that in normal operation no significant voltage passes through the buzzer, and the buzzer remains silent. If either of the varistors 1016, 1024 bridging the hot-neutral or hot-ground fails and any of the first and second thermal fuses 1018, 1020 and the first over current fuse 1022 is opened, voltage across the buzzer 1060 will cause it to sound.

In order to allow a user to deactivate the buzzer while awaiting repair, a normally open switch 1072 is connected effectively across the combination of the buzzer 1060 and the zener diode 1066. When the switch 1070 is closed, current through the buzzer 1060 is shunted through the switch and the buzzer is silenced. A capacitor 1074 is provided across the zener/audio alarm network to provide a DC voltage component to improve the audio alarm operating performance.

The buzzer deactivating switch 1072 is a simple normally open electrical switch, rather than a device that permanently deactivates the alarm 1060 or permanently interrupts a circuit trace. The switch 1072, once closed, can be opened at will and the buzzer 1060 reactivated. Accidentally deactivating the buzzer might destroy the audible alarm feature of the device permanently, and require its replacement even before it is installed. The use of a normally open switch in accordance with this invention eliminates this problem, and allows the alarm to be deactivated and reactivated.

Figure 32:
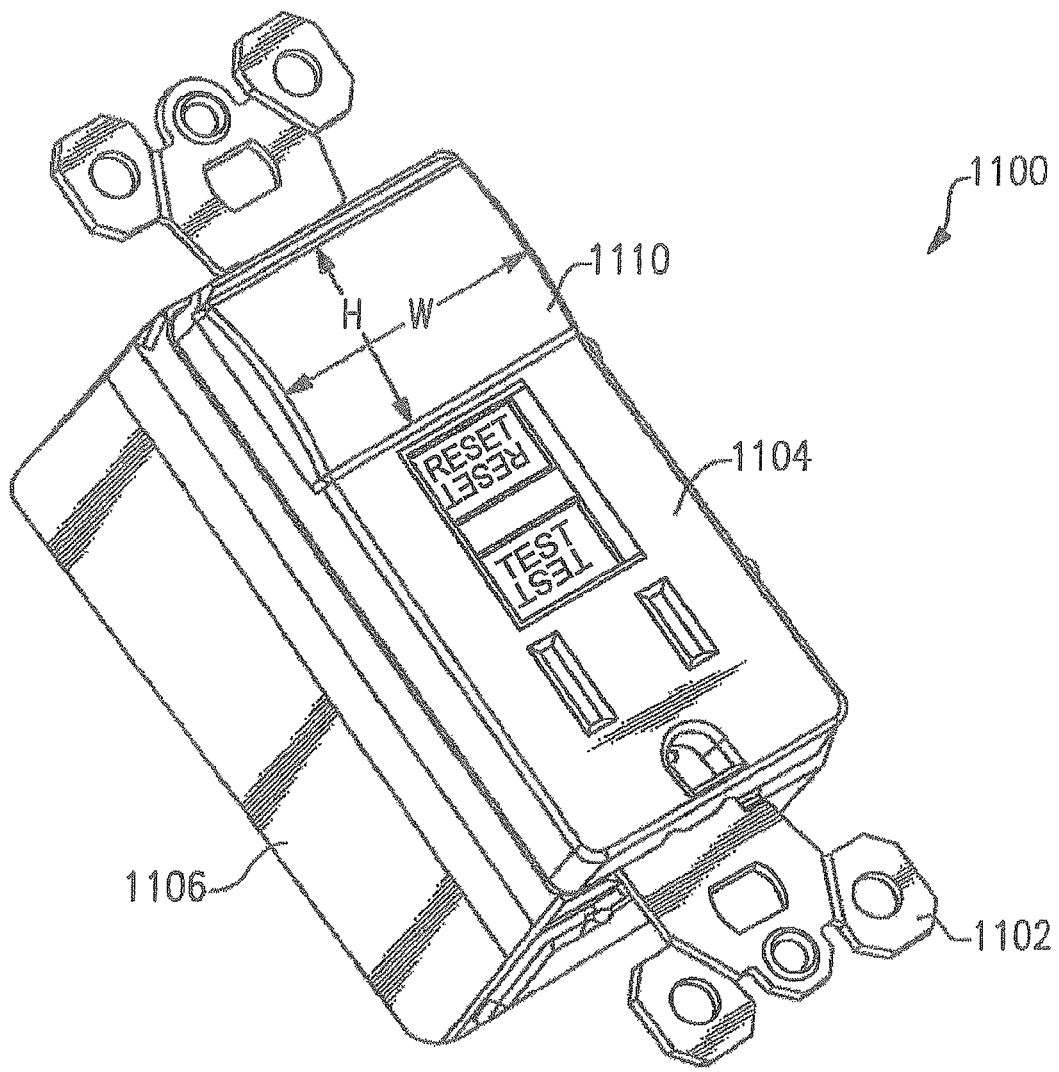
FIG. 32 is a perspective view of a GFCI/Light combination device in accordance with the present invention.

As embodied herein and depicted in FIG. 32, GFCI/Light combination device 1100 is disclosed. The electrical wiring device 1100 includes a cover member 1104 coupled to a rear body portion 1106. The form factor of rear body member 1106 is substantially identical to the rear portion 306 of the wiring device depicted in FIGS. 22-25. Wiring device 1100 includes a GFCI circuit of the type disclosed in FIGS. 22-29, and a light source disposed under lens cover 1110. This may be accomplished by disposing the light source(s) under lens cover on either side of strap member 1102. In an aspect of the embodiment, the light source disposed under lens cover 1110 functions as a pilot light by illuminating the ambient environment surrounding the electrical wiring device. The light source is connected to the line terminal elements in this embodiment. Accordingly, the light source is continuously energized as long as power is being provided to the device.

In another embodiment, the light source functions as a circuit status indicator and is connected to the load terminal elements. The light is, therefore, energized when device 1100 is in the reset state and the light is OFF when the device is tripped. The light source may be implemented using any suitable device, such as an LED. However, the light source may be implemented using a neon source, an incandescent source, etc.

The light source may be implemented using a single-element light source or a multi-element light source. For example, twin LEDs may be disposed under lens cover 1110. Those of ordinary skill in the art will understand that the wavelength of the illumination produced by the light source will depend on the type of source used, and may be selected as a function of the task being performed by the light source; e.g., a night-light, a status indicator, a room illuminator, etc.

Those of ordinary skill in the art will also understand that the lens cover 1110 may be made of a either a clear or a translucent material in accordance with design factors such as the type of light source, the wavelength radiated by the light source, the desired intensity, or softness, of the illumination, the function of the light, and other considerations. The lens cover 1110 may be removable from the housing cover 1104 for access to the light source.

In reference to FIG. 33A-33D, the electrical wiring system 100 of the present invention includes a connector device 50 that has a connector housing having a plurality of connector contacts disposed therein. The plurality of connector contacts are coupled to termination structures configured to couple the one or more upstream AC power conductors and the one or more downstream AC power conductors to corresponding contacts of the plurality of connector contacts. The system 100 also includes an electrical wiring device 10 that has a device housing having a front portion and a rear portion. The front portion includes at least one user-accessible control element disposed thereon. The user-accessible control element is coupled to an electrical switch mechanism disposed in the device housing and coupled to a plurality of device contacts. The plurality of device contacts are accessible by way of a device connection arrangement formed in the rear portion of the device housing. The plurality of device contacts are configured to mate with the plurality of connector contacts when the connector device is coupled to the device connection arrangement.

Accordingly, the present invention may be employed in a number of different ways and configurations. For example, the electrical wiring system of the present invention may be used to implement single pole single throw switch systems, single pole double throw (three-way) switch systems, four way switch systems, electrical wiring systems (such as duplex outlets or GFCIs) having feed-through capabilities. Feed-through, of course, refers to the ability to connect a device or system between line conductors (hot and neutral) and load conductors (hot and neutral).

Figure 33A:
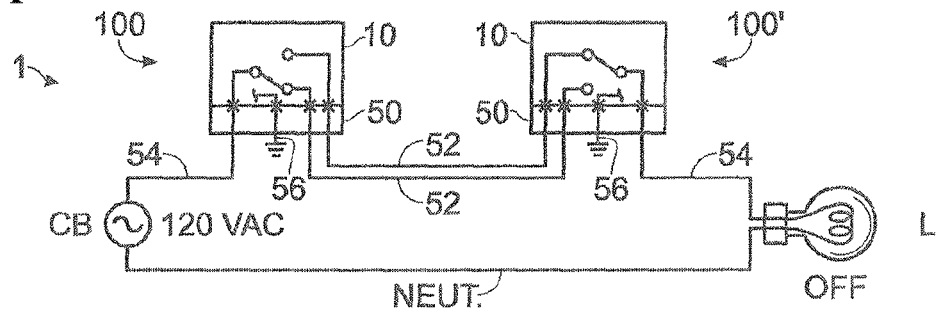
FIGS. 33A-33D are schematic diagrams of the present invention.
Figure 33B:
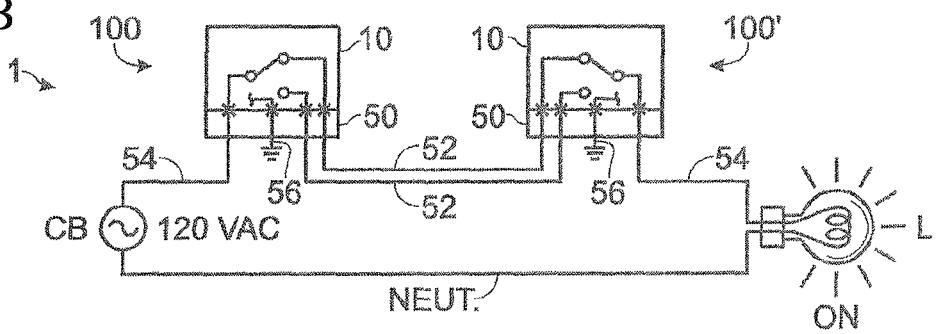
Figure 33C:
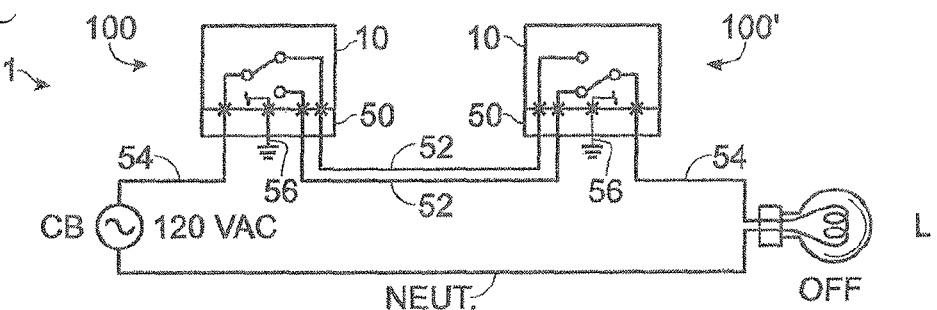
Figure 33D:
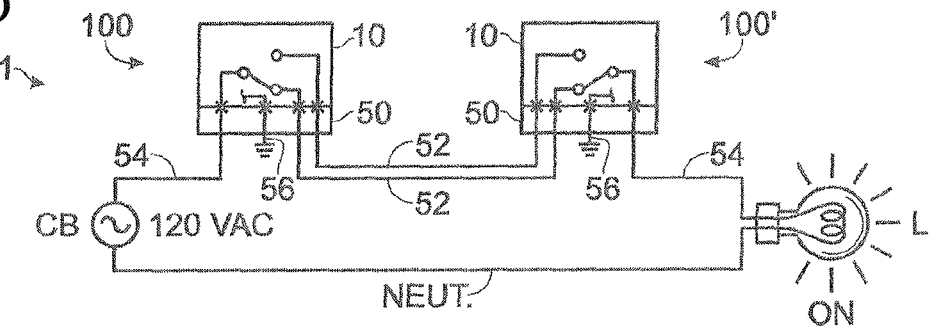

Referring to FIGS. 33A-33D, schematic diagrams in accordance with one exemplary embodiment of the present invention are disclosed. In this example embodiment, the present invention is used to realize a three-way switch 100 that may be employed in an AC branch circuit 1 to control a light from two (or more) locations. A first system 100 is connected to an upstream circuit breaker CB by way of common conductor 54. A ground conductor 56 is show schematically; in practice, it is typically connected to the ground strap in device 10 via the connector device 50. The first system 100 is also connected to two traveler conductors 52 which extend between the first system 100 and the second system 100'. The second system 100' is connected to load L via common conductor 54. The load L is, of course, connected to a neutral conductor that extends back to the circuit breaker CB to complete the circuit. In FIG. 33A, the switch systems 100 and 100' are positioned such that the light L is OFF. In FIG. 33B, switch system 100 is actuated at its location to provide power to light L to turn it ON. In FIG. 33C, switch system 100' is actuated to turn the light OFF. Finally, FIG. 33D shows system 100 being switched to its original position in FIG. 1A, to turn the light L back ON.

Figure 34:
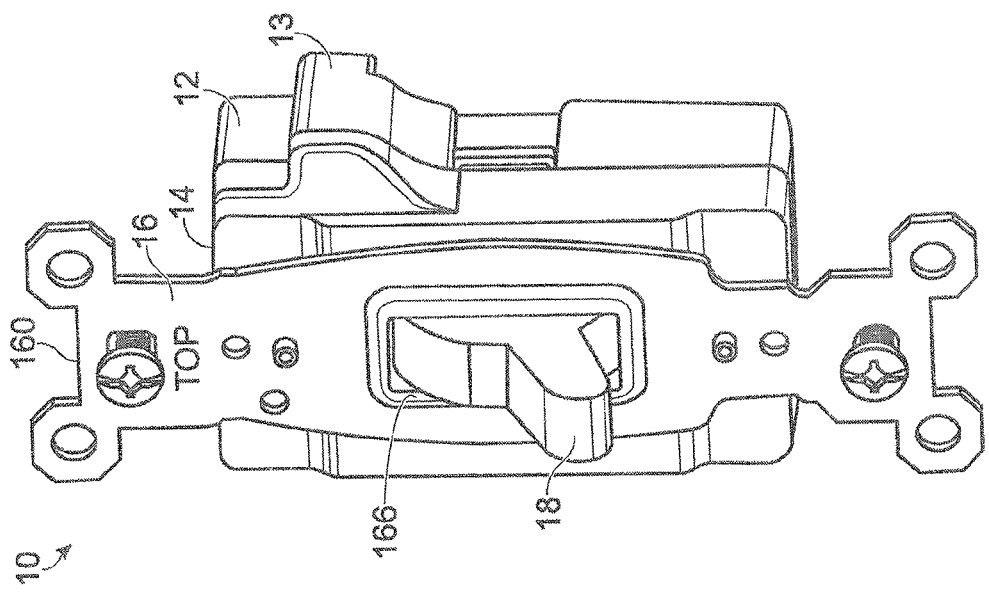
FIG. 34 is a perspective view of a toggle switch device in accordance with an embodiment of the present invention.

As embodied herein, and depicted in FIG. 34, a perspective view of a toggle switch device 10 in accordance with an embodiment of the present invention is disclosed. This embodiment is directed to a three-way switch that may be employed in the scenario provided above with respect to FIGS. 33A-33D. Toggle switch 10 includes a back body member 12 that is connected to a front cover portion 14, which collectively forms the device housing. A ground strap 16 is disposed over the front cover 16. The ground strap 16 includes mounting ears 160 on either end thereof, and a central aperture 166 that accommodates toggle switch mechanism 18. The switch housing is formed to include a winged portion 13 that accommodates various parts of the switch device 10. The winged portion 13, of course, may be eliminated by making the wiring device 10 wider.

Figure 35:
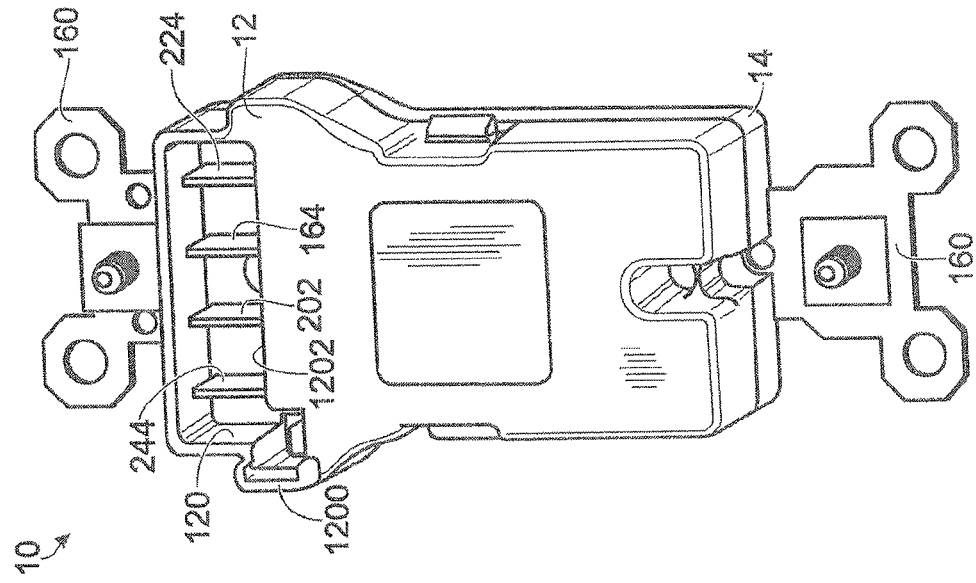
FIG. 35 is a perspective view of a back portion of the toggle switch device shown in FIG. 34.

Referring to FIG. 35, a perspective view of a back portion of the toggle switch device 10 shown in FIG. 34 is disclosed. The back body 12 includes a device connection arrangement 120 formed at one end thereof. In this example, the device connection arrangement is implemented as a rear receptacle 120 that provides access to the device contacts (164, 202, 224, and 244) which are recessed within the receptacle 120. The receptacle 120 also includes a female latching mechanism 1200 formed in one side thereof. The latching mechanism 1200 receives a corresponding male latch member 512 disposed on the connector device (See FIG. 44, for example). In another embodiment of the present invention, the connection arrangement includes various ribbed features formed in the back body 12 in the shape of connector device 50. The device contacts extend from the back of device 10 in this embodiment (not shown).

It should be noted that the receptacle 120 is disposed at one end of the device to ensure that the overall thickness of the wiring device 10 is as small as possible. The device contacts (164, 202, 224, and 244) are separated within receptacle 120 from the switch mechanism by a non-conductive barrier 1202. Of course, it is entirely feasible to position the receptacle 120 in a center portion of the device by increasing the thickness of the back body.

Figure 36:
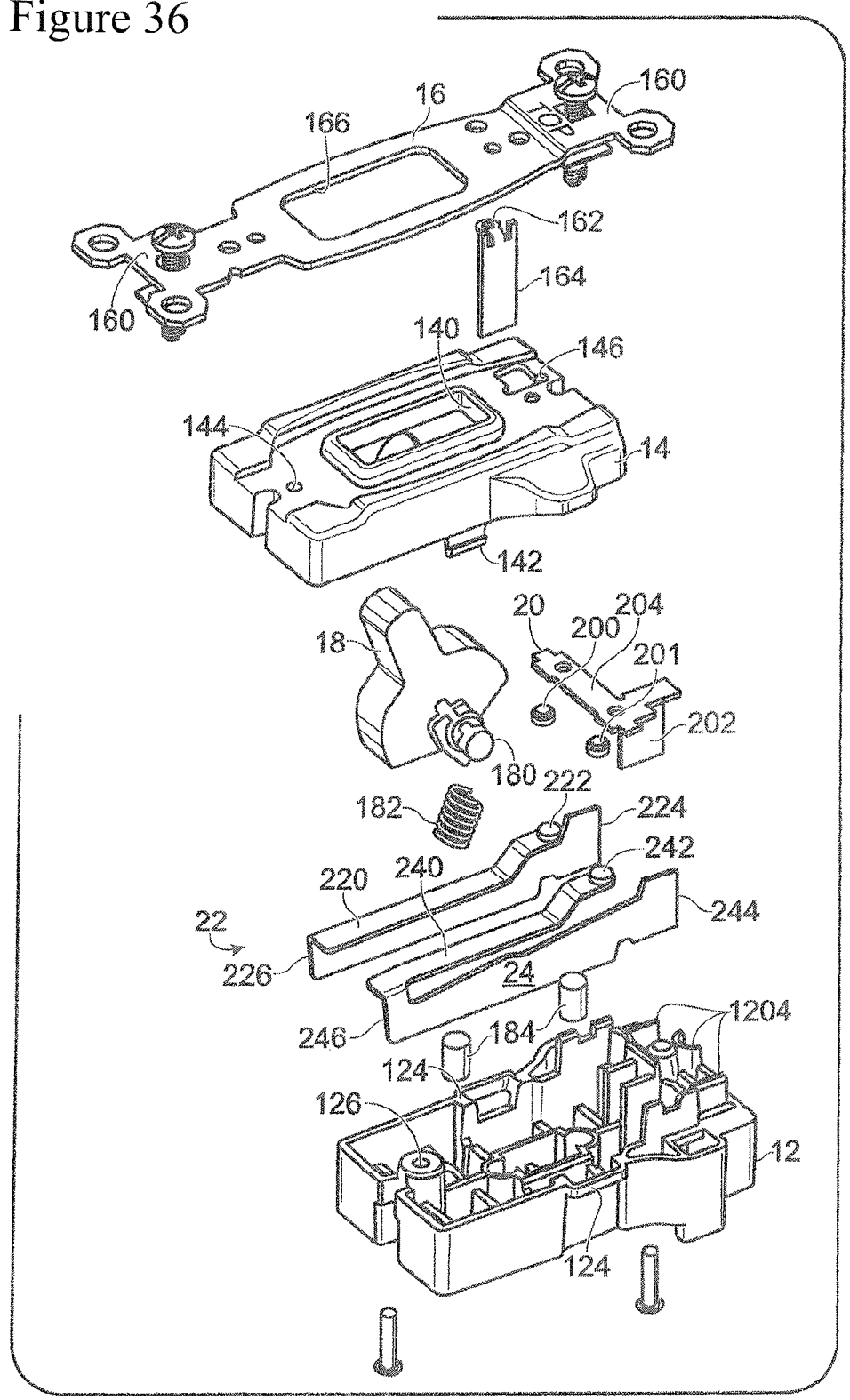
FIG. 36 is an exploded view of the toggle switch device depicted in FIG. 34.

Referring to FIG. 36, an exploded view of the toggle switch device depicted in FIG. 34 is disclosed. The front cover 14 includes a central aperture 140 that accommodates toggle switch actuator 18. A second aperture 146 provides the device ground contact 164 with an egress point into the interior of the housing. Of course, device ground contact 164 is ultimately positioned within the rear receptacle 120 (FIG. 35). The device ground contact is connected to the ground strap 16 by tab 162, which is fastened thereto.

The electrical switch mechanism includes stationary common structure 20, traveler structure 22 and traveler structure 24. The common member 20 includes two fixed contacts 200, 201 disposed on a stationary bridge 204. The stationary bridge 204 is connected to the device common contact 202 which is disposed within the rear receptacle 120 (See FIG. 35). Traveler member 22 includes a stationary side-rail 226 that is connected to a flex arm 220 at one end and a device traveler contact 224 at the other end thereof. The flex arm 220 includes a movable contact 222 disposed at the free cantilevered end of the flex arm 220. The movable contact 222, of course, is aligned with fixed contact 200. This contact pair (200, 222) is opened or closed in accordance with the position of the toggle switch actuator 18. The traveler structure 24 is a mirror image of structure 22. Therefore, no further explanation is required other than to say that movable contact 242 and fixed contact 201 form the second switch pair.

The toggle actuator 18 includes a cammed portion 180 that ensures that only one contact pair (200, 222 or 201, 242) is closed at a time. When the actuator 18 is at the limit of rotation in one direction, the movable contact 222 on traveler 22 mates with stationary contact 200 on the common member 20. When the toggle actuator 18 is at the opposite limit of rotation, the cam 180 on the other side of the actuator 18 causes the movable contact 242 on traveler 24 to mate with stationary contact 201 on the common member 20. Because the cams 180 are staggered relative to each other, only one of the flex arm contacts is connected to the common member at any one time. Finally, please note that the spring 182 disposed under the toggle actuator 18 causes it to "snap" between into position toward one end of device 10 or the other.

Note that in the embodiment depicted in FIG. 36, the siderail is longer than the flex arm. This provides spatial separation between receptacle 120 and the electrical switch mechanism. The device traveler contacts (224, 244) are implemented by blade structures integrally formed at the extended ends of the travelers. The device common contact 202 and the device ground contact 164 are also implemented as blade structures. When the switch 10 is fully assembled, the blades (164, 202, 224, 244) are positioned in the rear receptacle 120 to mate with the connector contacts disposed in the connector device 50. The back body 12 includes plastic walls 1204 that isolate the device contacts (164, 202, 224, and 244) from each other.

One purpose of the rear receptacle 120 is to shelter the blade terminals when the connector device 50 is being inserted. One feature of the present invention is that, unlike devices that feature screw terminals, connector device 50 may be mated with the device contacts in receptacle 120 when the conductors terminated by connection device 50 are electrically live.

Figure 37:
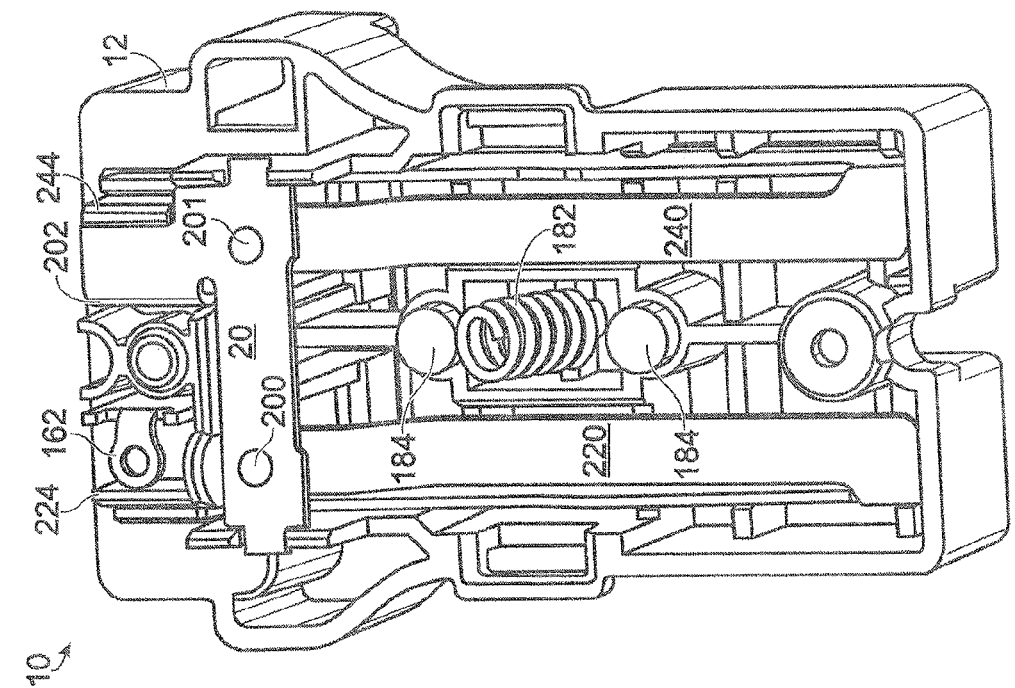
FIG. 37 is a perspective view of the toggle switch device shown in FIG. 34 with the front cover removed.

FIG. 37 is a perspective view of the toggle switch device shown in FIG. 34 with the front cover 14 and toggle switch 18 removed. Referring to the top of the page, the device contacts are arranged within receptacle 120 in the order of device traveler contact 224, device ground contact 162, common contact 202, and device traveler contact 244. Flex arms 220 and 240 are cantilevered leaf springs that are naturally biased upward such that contacts 222 and 242 are engaged with contacts 200 and 201 respectively. The toggle switch 18 position (in this view) is either up or down, such that only one contact pair is closed at a time in the manner previously described. Actuator spring 182 is coupled between actuator 18 and a raised portion of the interior wall of back body 12. Spring 182 is shown as being disposed between pad elements 184. When the toggle switch actuator 18 is snapped into position by spring 182, the pads 184 on either side absorb the energy and prolong the life of the toggle switch actuator 18.

Figure 38:
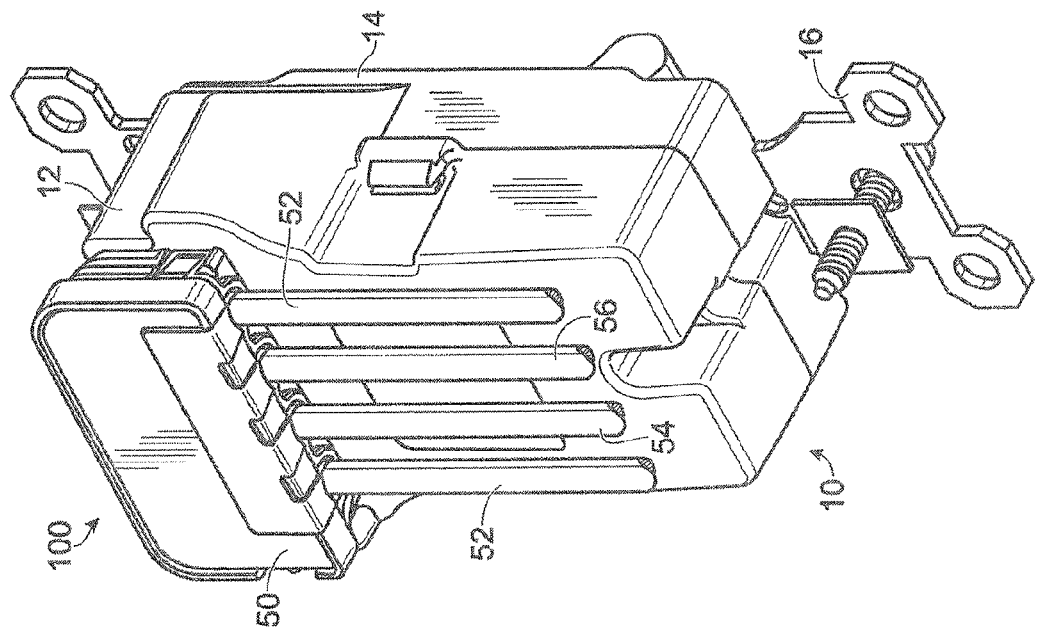
FIG. 38 is a perspective view of an electrical wiring system of the present invention featuring the toggle switch depicted in FIG. 34.

Referring to FIG. 38, a perspective view of an electrical wiring system 100 of the present invention is disclosed. As shown, the connector device 50 is fully inserted into the rear receptacle 120. The connector device 50 terminates AC power wires from the AC branch circuit. This embodiment is fully consistent with the example provided in FIG. 33. Connector device 50 terminates two traveler conductors 52, common conductor 54 and ground conductor 56.

Figures 39, 40:
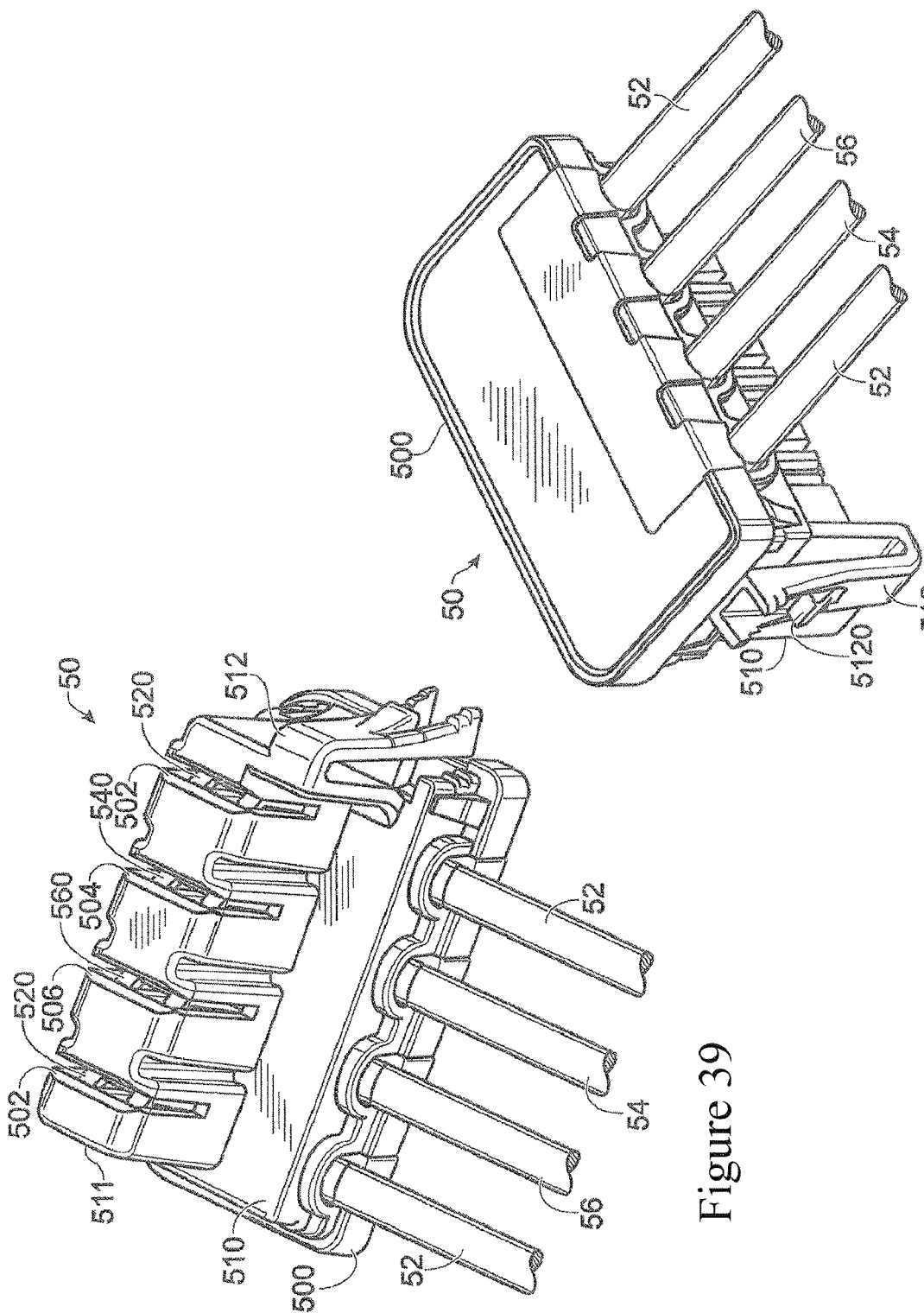
FIG. 39 is a perspective view of a front portion of the connector device shown in FIG. 38.
FIG. 40 is a perspective view of a back portion of the connector device depicted in FIG. 39.

FIG. 39 is a perspective view of a rear portion of the connector device 50 shown in FIG. 38. Connector device 50 includes a front cover 500 which is mated to a back body 510. The back body 510 includes a contact housing portion 511 which, as its name indicates, houses the connector contacts. The contact housing portion 511 includes access slots (502, 504, 506, and 502) which provide access to connector traveler contact 520, connector common contact 540, connector ground contact 560, and the second connector traveler contact 520, respectively. A flexible male latch member 512 is integrally formed into the housing portion 511 and mates with the female latch mechanism 1200 in device receptacle 120 (FIG. 35).

FIG. 40 is a perspective view of a front portion of the plug device depicted in FIG. 38. In this view, the front cover is a planar member which includes indicia that identifies each of the wires terminated by connector device 50. Note that flexible latch member includes a latching tab 5120 that is configured to prevent connector 50 from being pulled out of the receptacle 120. The flexible latch mechanism 512 may be depressed by a user with only one hand when removing the connector 50 from the device 10. Had the flexible part of the mechanism been located on the wiring device, two hands would have been required to disengage the latch. Note also that the latch mechanism 512 is located away from the contacts on the back of the connector, and therefore, do not interfere with the blade openings. The latching mechanism (1200, 512) is configured to withstand a 20 pound pulling force applied for a predetermined period of time such as a minute.

Figure 41:
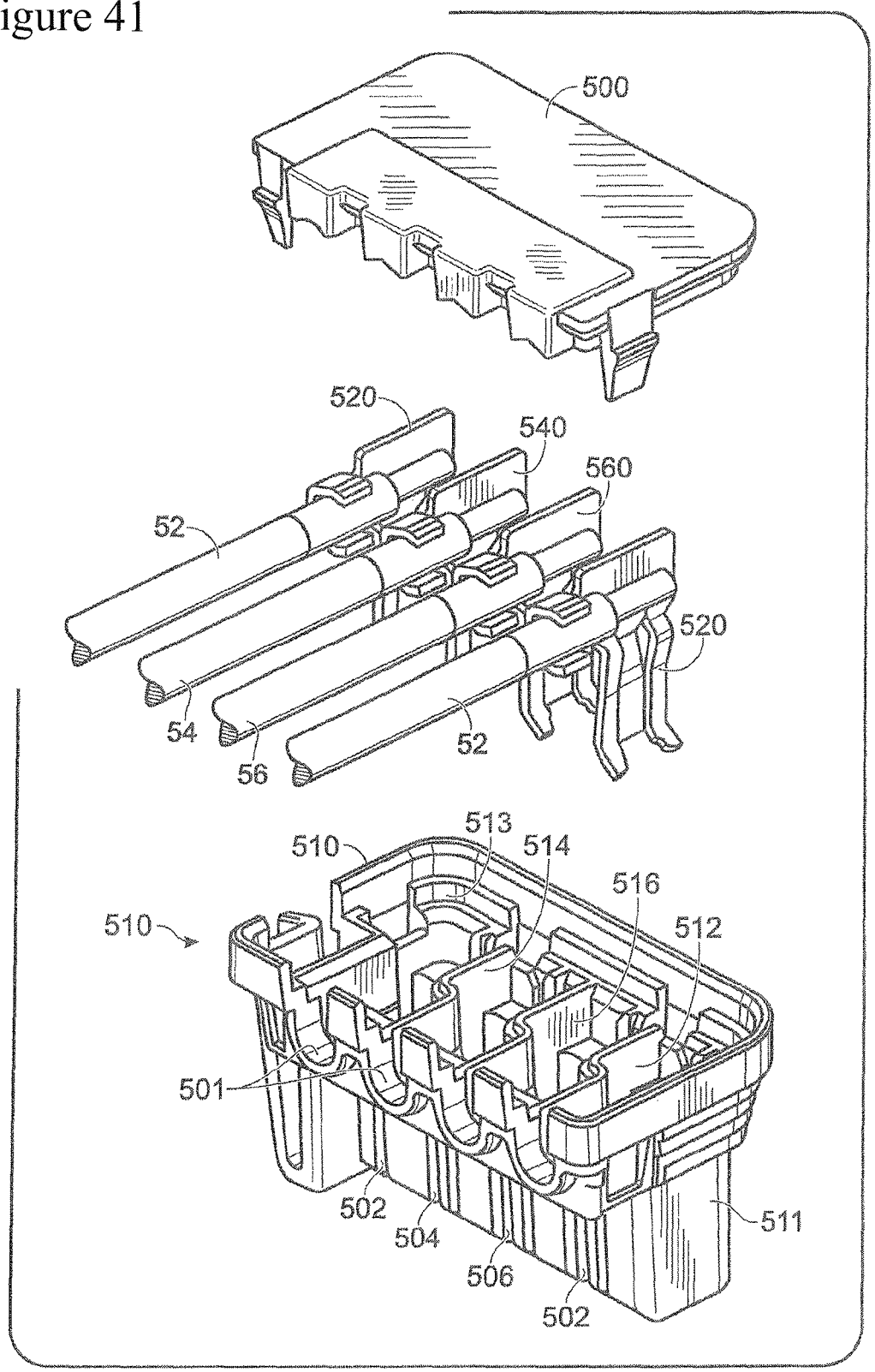
FIG. 41 is an exploded view of the connector device depicted in FIG. 39.

Referring to FIG. 41, an exploded view of the connector device 50 depicted in FIG. 39 is shown. Back body 510 includes wiring egress ports 501 that are configured to accommodate the conductors (502, 504, 506, and 502). The contact housing portion 511 of the back body 510 is divided into four electrically insulated compartments. A compartment 513 is disposed at either end and they accommodate connector traveler contacts 502, which are shown as terminating traveler wires 52. Internal common compartment 514 accommodates connector common contact 540, which terminates common conductor 54. Finally, ground compartment 516 accommodates connector ground contact 560, which terminates ground conductor 56. This design ensures that the connector contacts are substantially in parallel with each other and easily mate with the plurality of device contacts disposed in receptacle 120. Once the contacts are snapped into their respective compartments, the cover member 500 is snapped in place to complete the assembly.

Note that connector device 50 is configured as a "right angled connector." The term right angle refers to the fact that the conductors and the contacts form a right angle relative to each other. One advantage of the right angle connector device 50 is that when the connector is inserted into receptacle 120 as shown in FIG. 38, the distance from the rear surface of the ground strap 16 to the front cover 500 is less than 1.375 inches. While the right angle plug is considered desirable in certain circumstances, the present invention may be employed with a straight connector device (See FIG. 59).

Figure 42:
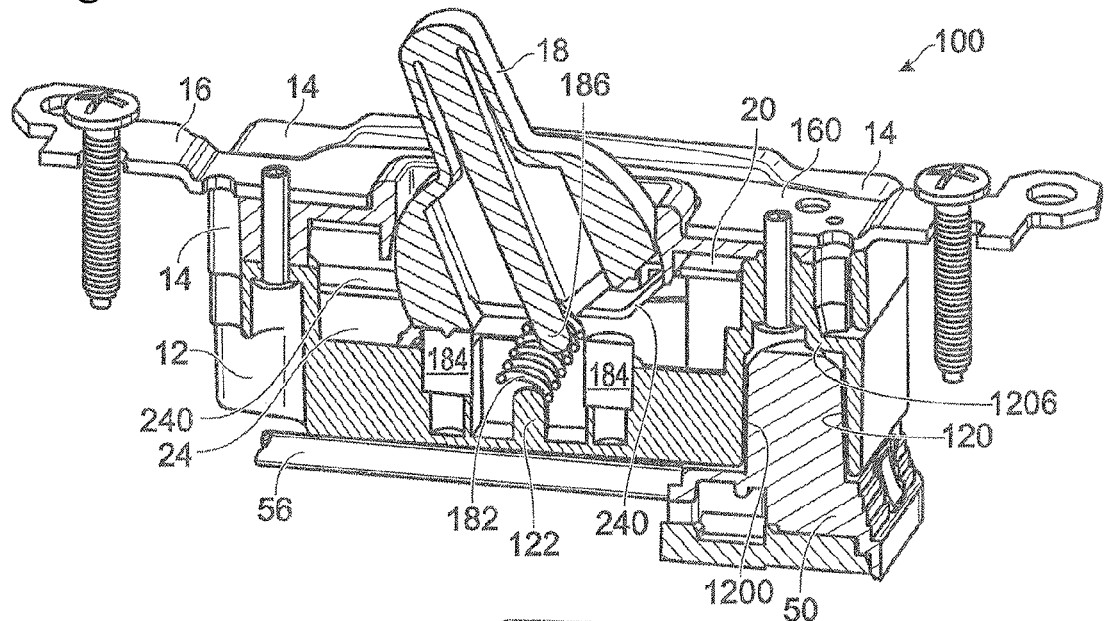
FIG. 42 is a longitudinal cross-section of the system depicted in FIG. 38.

Referring to FIG. 42, a longitudinal cross-section of the system 100 depicted in FIG. 38 is shown. The connector device 50 is fully inserted and latched into receptacle 120. The "nose" of the connector 50 does not abut the strap 16. Receptacle floor 1206 is disposed between the strap 16 and the device contact blades to prevent the blades from shorting out to the strap. In an alternate embodiment, the floor 1206 may be omitted if the strap has one or two side rails instead of being straight-through. The view provided by FIG. 42 clearly shows spring 182 being disposed between toggle actuator tab 186 and back body element 122. Traveler member 24 as well as its flex arm 240 are clearly shown behind toggle switch actuator 18.

Figure 43:
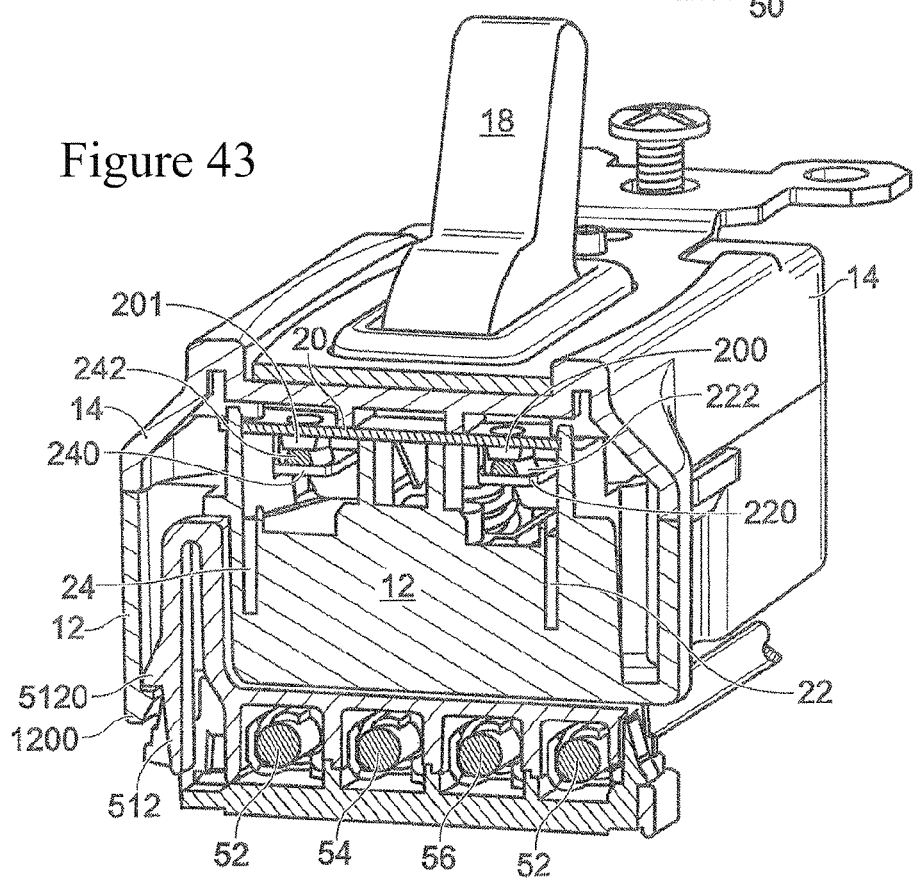
FIG. 43 is a latitudinal cross-section of the system depicted in FIG. 38 at an intermediate portion thereof.

Referring to FIG. 43, a latitudinal cross-section of the system 100 depicted in FIG. 38 at an intermediate portion of device 10 where the wires (52, 54, 56, and 52) enter connector 50. In this toggle switch position, the fixed contact 200 and movable contact 222 are closed and fixed contact 201 and movable contact 242 are open. This view also shows the operation of the latching mechanism quite clearly. Latching tab 5120 disposed on flexible latch member 512 is engaged by a lip formed in the female latch member 1200.

Figure 44:
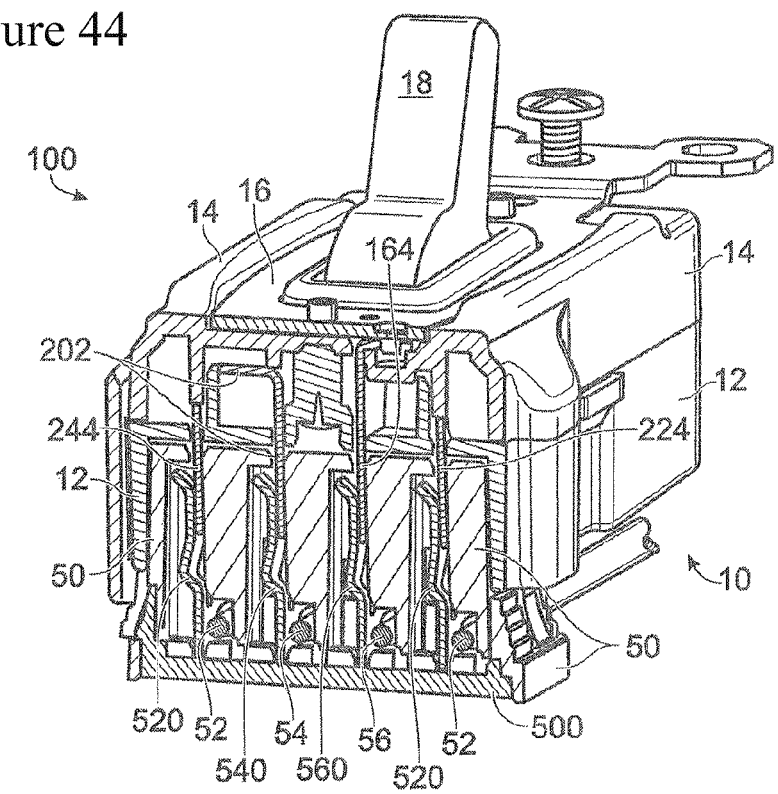
FIG. 44 is a latitudinal cross-section of the system depicted in FIG. 38 at an end thereof.

FIG. 44 is a latitudinal cross-section of the system depicted in FIG. 38 at an end of the device 10. From left to right, the traveler device contact 244 extends downwardly from the floor of the receptacle 120 and is engaged by the traveler connector contact 520 coupled to traveler wire 52. Device common contact 202 extends from the stationary common member 20 into the receptacle 120 and is engaged by common connector contact 540, which in turn, is connected to common wire 54. Device ground contact 164 extends from the ground strap 16 and is engaged by connector ground contact 560. Of course, the connector ground contact 560 is connected to ground wire 56. Finally, at the right end of the drawing, the second device traveler contact 224 is engaged by the second connector traveler contact 520, which is connected to the second traveler wire 52.

Figure 45:
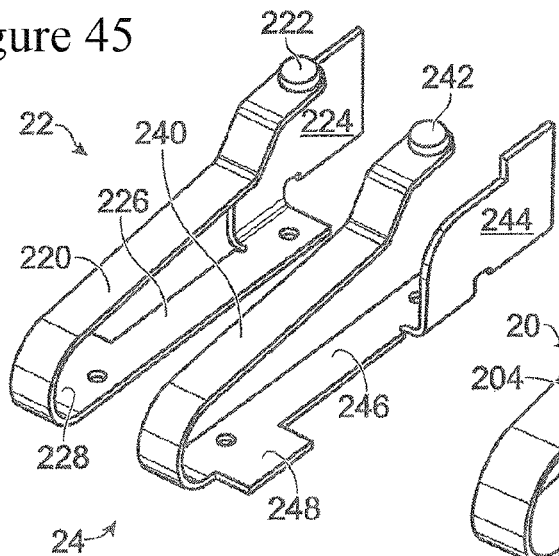
FIG. 45 is a perspective view of an alternative traveler contact structure.

Referring to FIG. 45, a perspective view of an alternative traveler contact structure in accordance with alternate embodiment of the present invention is disclosed. In this embodiment, the side rails of structure 22 and 24 previously disclosed are replaced by base portions 226 and 246, respectively. This structure may be advantageous during fabrication because it has fewer complex bends. Structures 22 and 24 may be fabricated by stamping out a single strip of conductive material having a winged device blade (224, 244) at one end and the flex arm (220, 240) at the other. Subsequently, the flex arm (220, 240) is folded over the rectangular portion (228, 248) in the manner depicted to complete the fabrication of the part.

Figure 46:
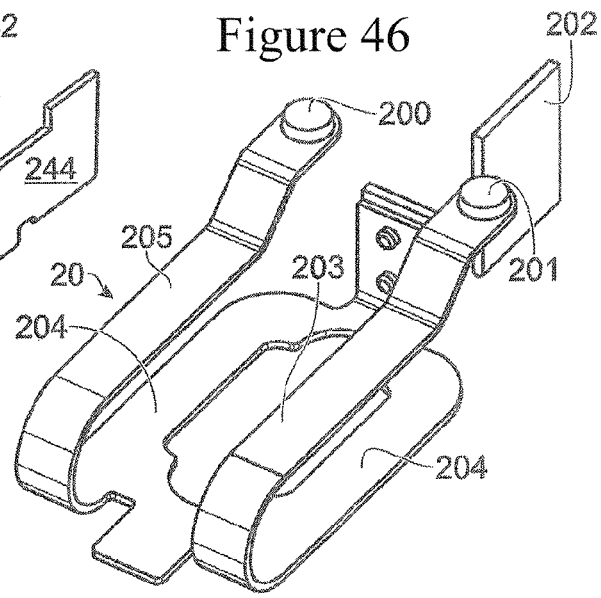
FIG. 46 is a perspective view of an alternative common member contact structure.

Referring to FIG. 46, a perspective view of an alternative common member contact structure 20 in accordance with yet another alternate embodiment of the present invention is disclosed. In this embodiment, the traveler contact structures (22, 24) are fixed within device 10. Common structure 20 includes a base portion 204 which is configured to be seated within the back body 12 of device 10. Flex arms (203, 205) extend from one end portion of base 204 and include movable contacts 201 and 200, respectively. A device common contact 202 extends from the other end of the base portion 204.

As previously noted, the present invention applies to other types of switches. In one embodiment, one of the traveler structures (22 or 24) is omitted to create a single-pole single-throw switch. In another embodiment, the switching structure may be configured as two single pole switches. The common member 20 is split into two members each having a single stationary contact. Each of the common members has a device contact disposed in receptacle 120. The two cams on the toggle actuator are aligned so the movable contacts open and close together, or by replacing the single toggle switch 18 with two switch actuators.

Figure 47:
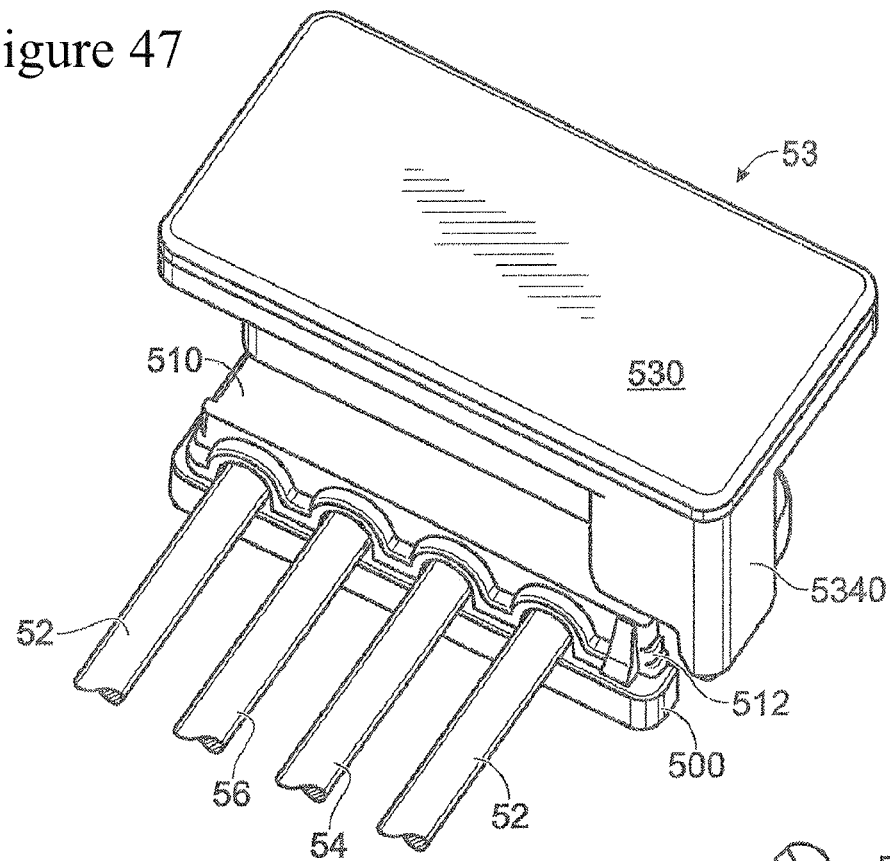
FIG. 47 is a perspective view of a pull switch device in accordance with another embodiment of the present invention.

As embodied herein and depicted in FIG. 47, a perspective view of a pull switch device 53 used in conjunction with connector device 50 is disclosed. A problem arises during the conventional rough-in phase of the installation after the connector 50 has terminated the AC branch wires (52, 54, 56, and 52). While power may be available, it cannot be used because the switch device 10 has not been connected to the lighting device via connector 50 because other construction procedures such as sheet rocking, painting, etc. are being performed. Accordingly, when conventional devices are employed, the contractor must employ portable lighting fixtures during this phase at considerable expense. The pull switch 53 of the present invention remedies this issue by shorting together the two traveler contacts and the common contact. Viewed in conjunction with FIGS. 33A-33D, one of ordinary skill in the art will understand that shorting these contacts together in the connector device will permit the downstream load to be energized.

In FIG. 47, the pull switch 53 is plugged into the connector device 50. The pulls switch includes a front cover 530 and an insert body 534 (not shown) that includes a latch 5340 configured to engage connector latch mechanism 512 to secure the connection.

Figure 48:
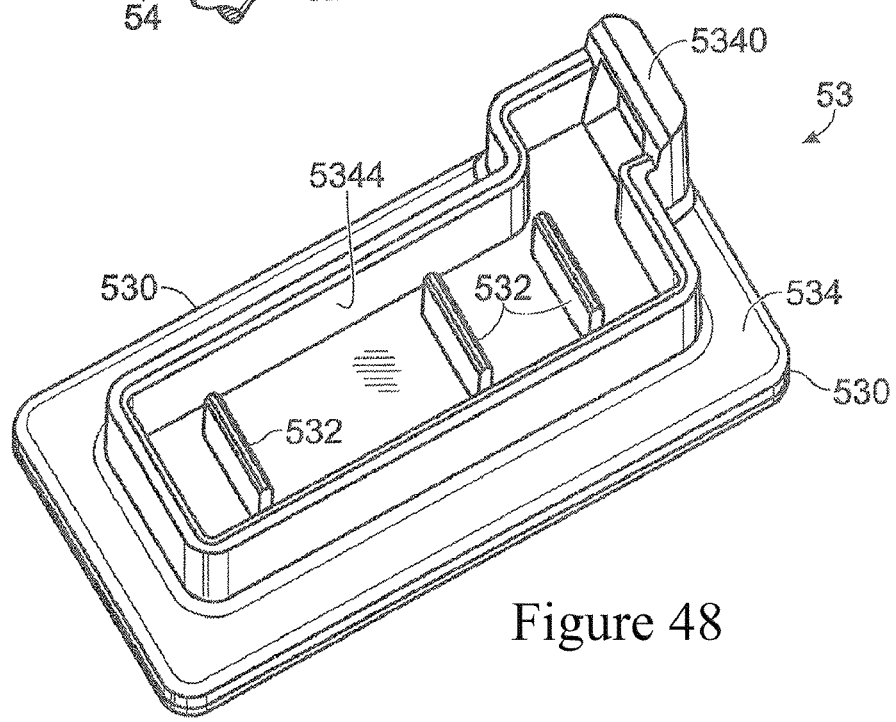
FIG. 48 is a perspective view of a rear portion of the pull switch depicted in FIG. 47.

FIG. 48 is a perspective view of a rear portion of the pull switch depicted in FIG. 47. In this view, internal contacts 532 are disposed within the lip portion 5344 of insert body 534. The internal view of latch member 5340 may also be seen. It includes a hollow lip that is configured to engage the flexible latch 512 of connector device 50.

Figure 49:
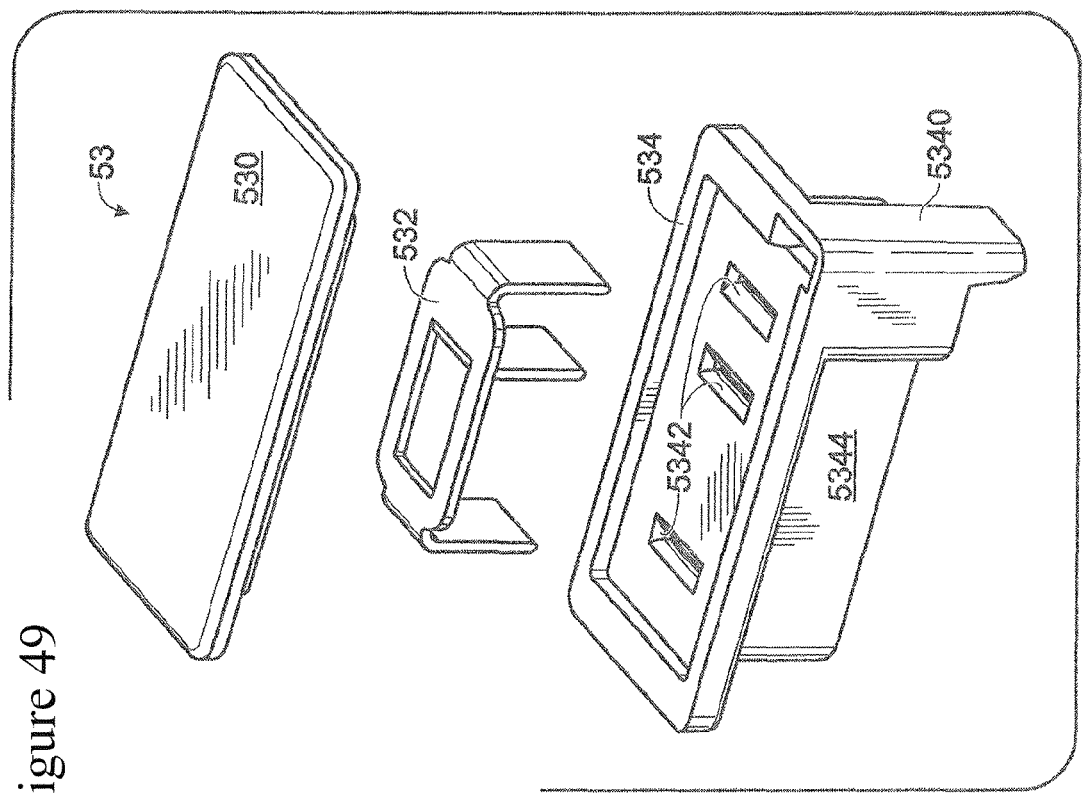
FIG. 49 is an exploded view of the pull switch depicted in FIG. 47.

FIG. 49 is an exploded view of the pull switch depicted in FIG. 47. The contact structure 532 is shown as an integral piece of conductive material that includes three contacts extending therefrom. The three contacts are inserted into the slots 5342 formed in insert member 534 such that they enclosed within lip member 5344. Finally, the cover portion 530 is snapped over insert 534 to complete the pull switch assembly.

Figure 50:
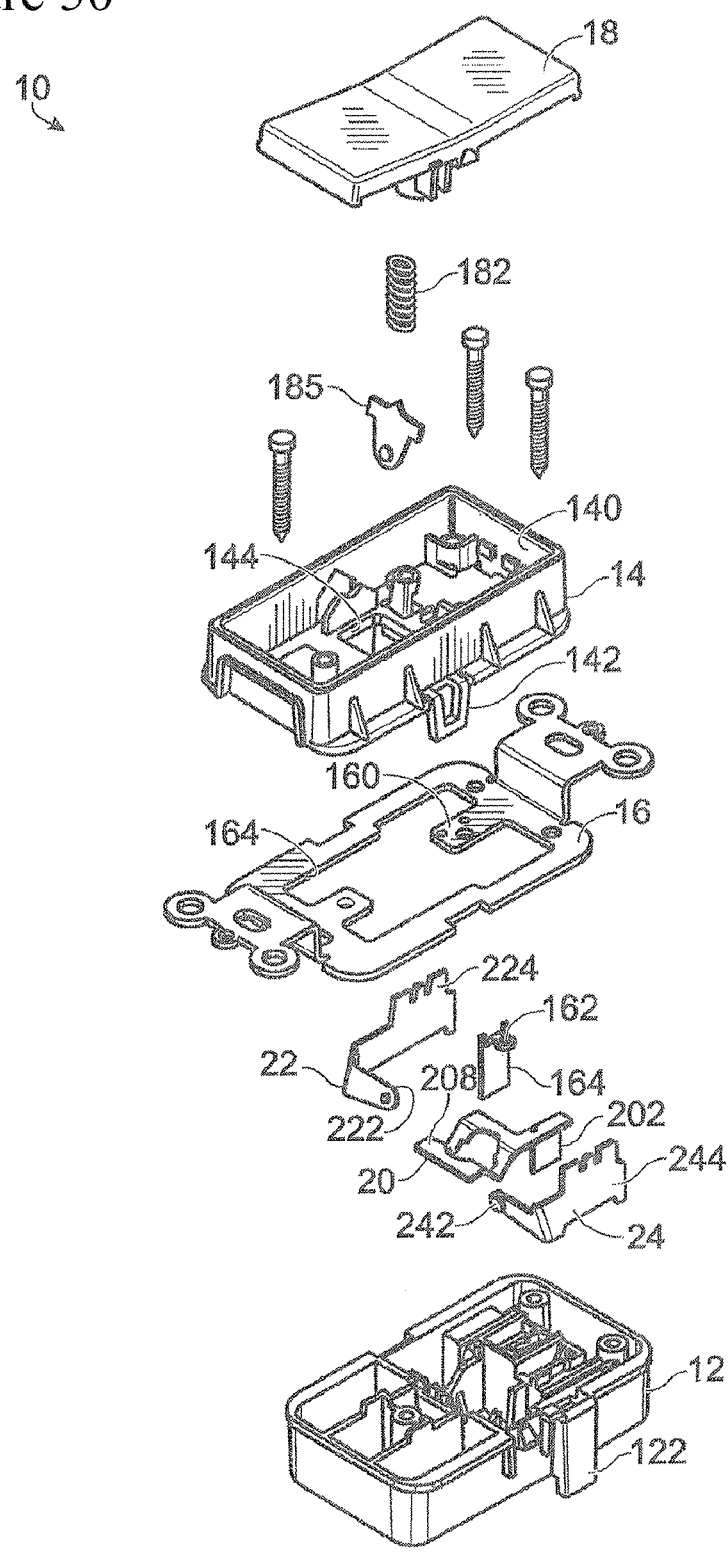
FIG. 50 is an exploded view of a rocker switch device in accordance with an alternate embodiment of the present invention.

As embodied herein and depicted in FIG. 50, an exploded view of a rocker switch device 10 in accordance with an alternate embodiment of the present invention is disclosed. Switch device 10 includes a decorator paddle switch 18 that is disposed within aperture 140 of the cover member 14. The paddle switch 18 is coupled to a spring element 182. The spring element 182 is connected to a pivot contact member 185 which is seated within the cradle portion of common contact structure 20. The pivot member 185 extends through an opening 144 in the cover member 14 and through the central opening 164 formed in ground strap 16.

The ground strap 16 further includes a tab member 160 which extends inwardly into opening 164. The device ground contact 162 extends from tab member 160 into receptacle 120.

The switch device 10 is configured as a three-way switch that includes traveler contact structure 22, common contact structure 20 and traveler contact structure 24. The common structure 20, as alluded to previously, includes an apertured cradle 208 which accommodates pivot contact 185. The common member also includes device common contact 202.

Figure 51:
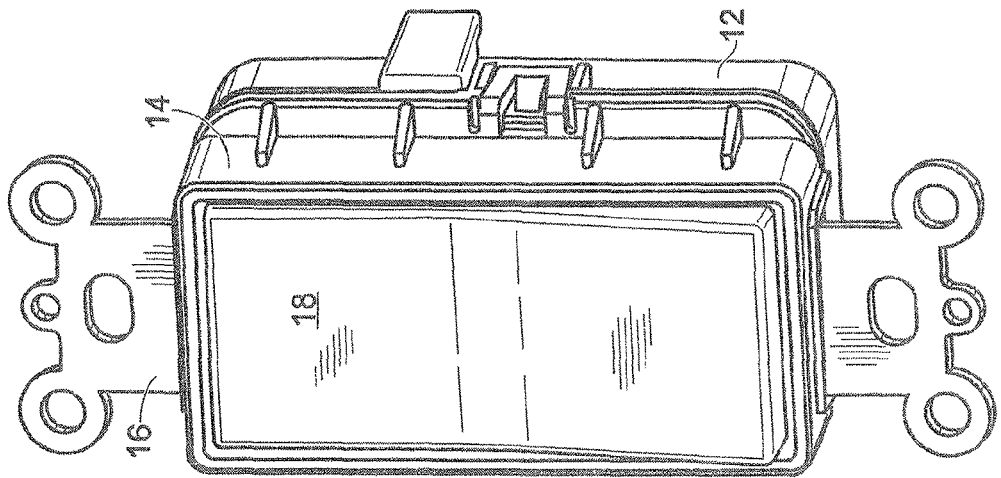
FIG. 51 is a perspective view of the rocker switch device depicted in FIG. 50.

Traveler contact structures 22 and 24 are disposed on either side of the common structure 20 and are mirror images of each other. Traveler structure 22 includes traveler contact 224 on one end thereof and a fixed contact 222 on the opposite end. The fixed contact 222 is disposed on the outboard side of the pivot member. The fixed contact 242 on traveler structure 24 is disposed on the inward side of the pivot contact 185. Of course, the pivot contact 185 is positioned by the paddle switch to engage either contact 222 or contact 242 by way of a double-sided contact. FIG. 51 is a perspective view of the fully assembled rocker switch device 10 depicted in FIG. 50.

Figure 52:
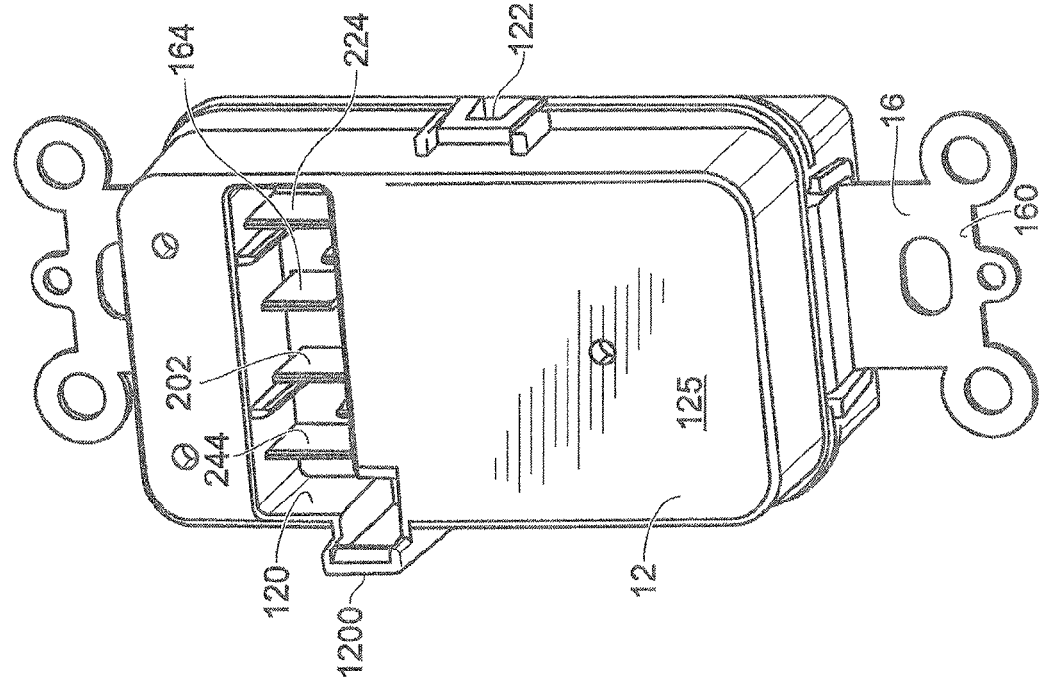
FIG. 52 is a perspective view of the rocker switch device depicted in FIG. 50 with the front cover portion removed.

Referring to FIG. 52, a perspective view of the rocker switch device 10 depicted in FIG. 50 is shown with the front cover portion 14 removed. In this view, the switch mechanism is framed by the central opening of the ground strap 16. Going from left to right and starting at the top left corner, the device contacts are aligned in a row within the receptacle 120 (disposed underneath device 10). Device traveler contact is leftmost, and disposed adjacent the ground contact 164 which is disposed underneath ground tab 160. The device common contact 202 is disposed between the ground contact 164 and the rightmost traveler contact 244. In the center of the device 10, the common contact structure 20 is shown with the pivot contact 185 disposed therein. The pivot contact is rotated in the upward direction to engage traveler contact 222 which is disposed under the common contact structure 20 and is therefore not visible.

Figure 53:
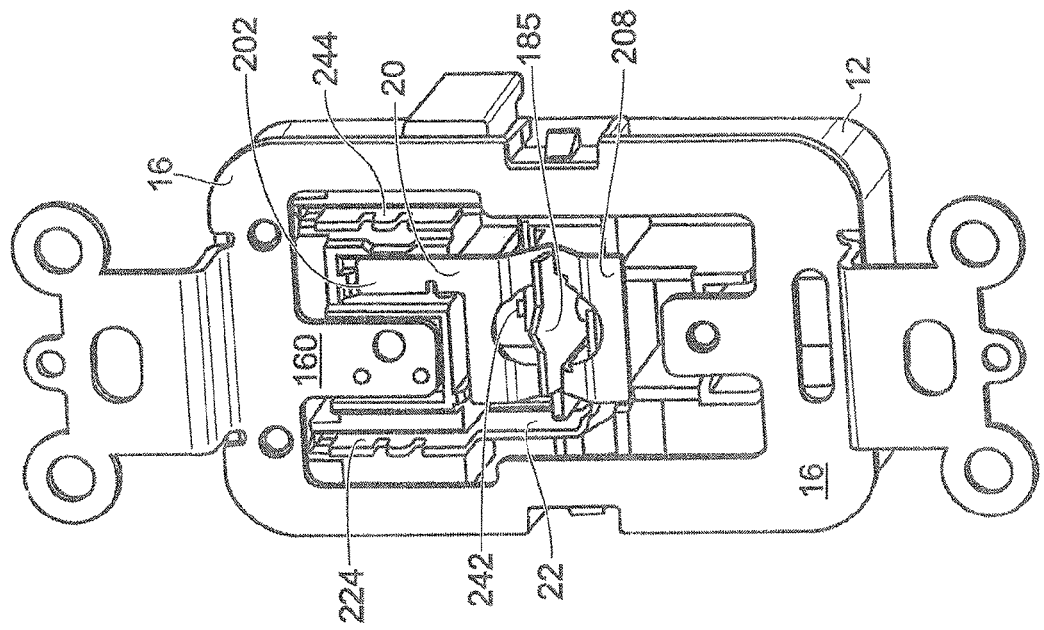
FIG. 53 is a perspective view of a back portion of the rocker switch device depicted in FIG. 50.

Referring to FIG. 53, a perspective view of a back portion of the rocker switch device 10 depicted in FIG. 50 is shown. The receptacle 120 is positioned between the back body centroid and the upper end (in this view) of the back body 12. As before, the device blade contacts (244, 202, 164, and 224) are arranged in row and parallel with each other. As noted before, the device contacts within the connector arrangement 120 may be implemented using any suitable geometry and may be recessed within a receptacle or disposed in a plane above the rear major surface 125 of the back body 12. This embodiment also includes female latch mechanism 1200 which is similar to the one previously described.

FIG. 54 is a perspective view of an electrical wiring system 100 of the present invention featuring the rocker switch depicted in FIG. 50. In this view, the connector device 50 is inserted and latched within receptacle 120 of device 10.

Referring to FIG. 55, a latitudinal cross-section of the system depicted in FIG. 54 is disclosed. From left to right, the traveler device contact 244 extends downwardly from the floor of the receptacle 120 and is engaged by the traveler connector contact 520 coupled to traveler wire 52. Device common contact 202 extends from the stationary common member 20 into the receptacle 120 and is engaged by common connector contact 540, which in turn, is connected to common wire 54. Device ground contact 164 extends from the ground strap 16 and is engaged by connector ground contact 560. Of course, the connector ground contact 560 is connected to ground wire 56. Finally, at the right end of the drawing, the second device traveler contact 224 is engaged by the second connector traveler contact 520, which is connected to the second traveler wire 52.

Figure 56:
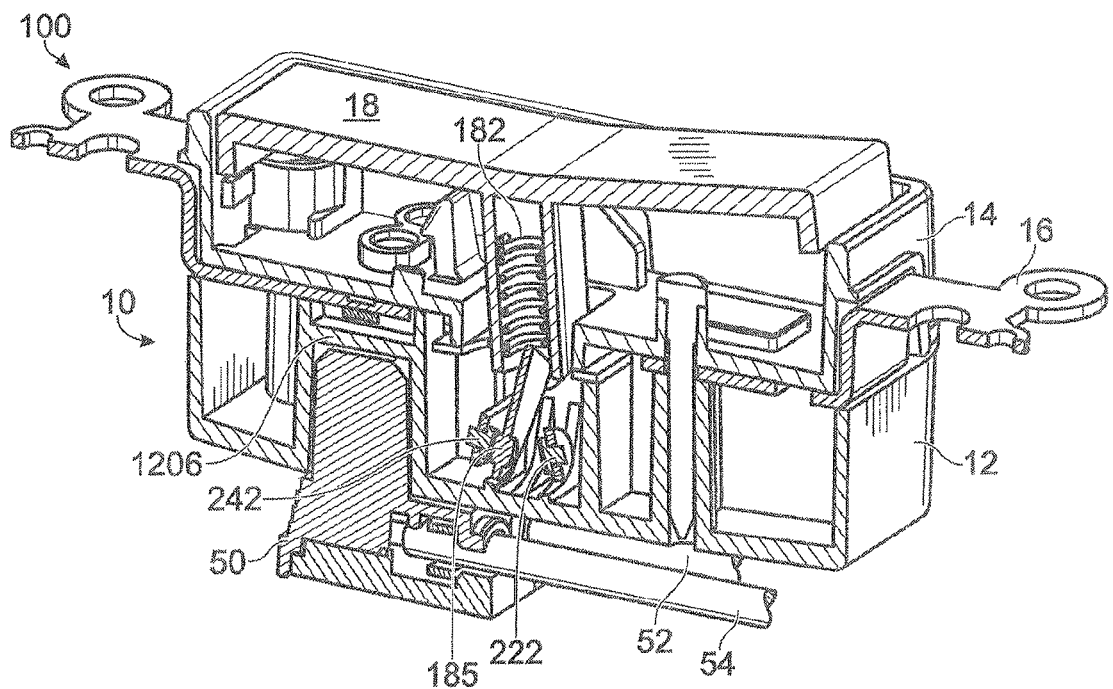
FIG. 56 is a longitudinal cross-section of the system depicted in FIG. 54.

Referring to FIG. 56, a longitudinal cross-section of the system depicted in FIG. 34 is disclosed. Again, the connector device 50 is fully inserted and latched into receptacle 120. The "nose" of the connector 50 does not abut the strap 16. Receptacle floor 1206 is disposed between the strap 16 and the device contact blades to prevent the blades from shorting out to the strap. In an alternate embodiment, the floor 1206 may be omitted if the strap has one or two side rails instead of being straight-through. The view provided by FIG. 42 clearly shows spring 182 being disposed between paddle switch 18 and pivot contact 185 which is engaged with traveler contact 242.

Figure 57:
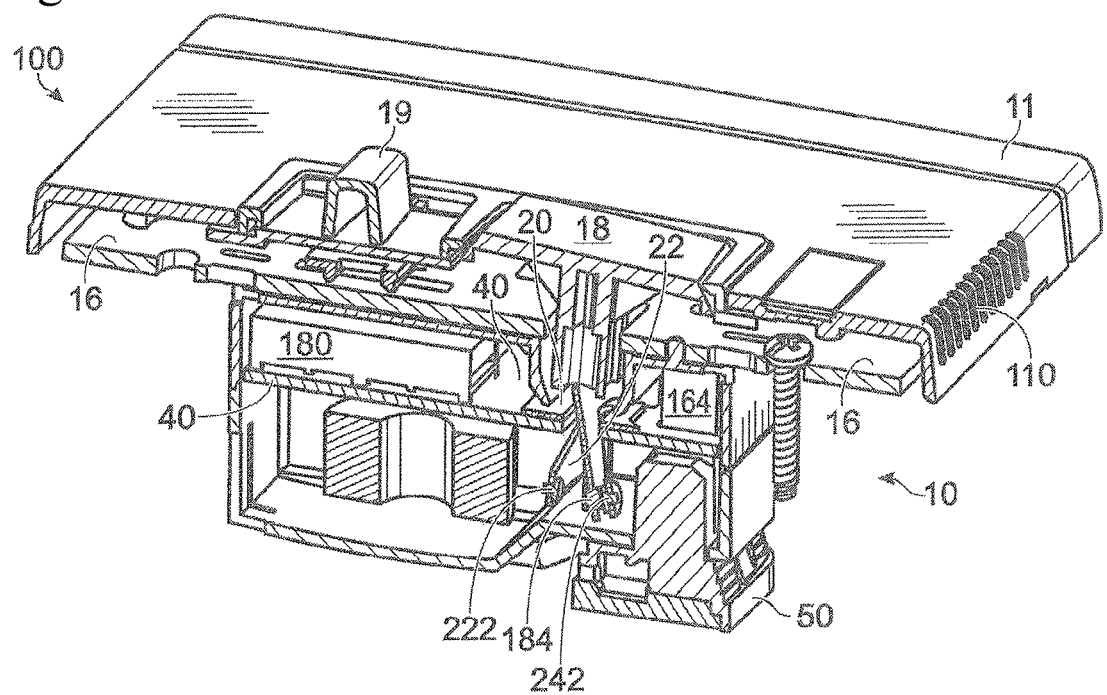
FIG. 57 is a longitudinal cross-section view of a dimmer switch device in accordance with another alternate embodiment of the present invention.

As embodied herein and depicted in FIG. 57, a longitudinal cross-section view of a dimmer switch device 10 in accordance with another alternate embodiment of the present invention is disclosed. In this embodiment, a cover plate 11 is disposed over a heat sink/ground plate 16. The cover plate includes vents 110 disposed at either end thereof. A preset switch 18 and a dimmer control 19 are disposed within a central aperture of the cover plate 11. The dimmer control is coupled to a dimmer control circuit 180 disposed on printed circuit board 40. The preset switch 18 is a three-way switch. The pivot contact 185 is shown as being engaged with traveler contact 242 and not engaged with traveler contact 222. Reference is made to U.S. patent application Ser. No. 11/343, 102, now U.S. Pat. No. 7,497,582, which is incorporated herein by reference as though fully set forth in its entirety, for a more detailed explanation of a dimmer switch.

Referring to FIG. 58, a perspective view of a connector device contact for an alternative embodiment of connector device depicted in FIG. 41. As noted previously, the connector device shown in FIG. 41 and elsewhere in this disclosure is directed to a right angle connector. The contact 540 shown in FIG. 58 is for a straight or 180° connector whereby the common wire 54, for example, is essentially perpendicular to the rear major surface of the back body 12 when the connector 50 is inserted and latched into the receptacle 120 in accordance with the teachings of the present invention.

Figure 59:
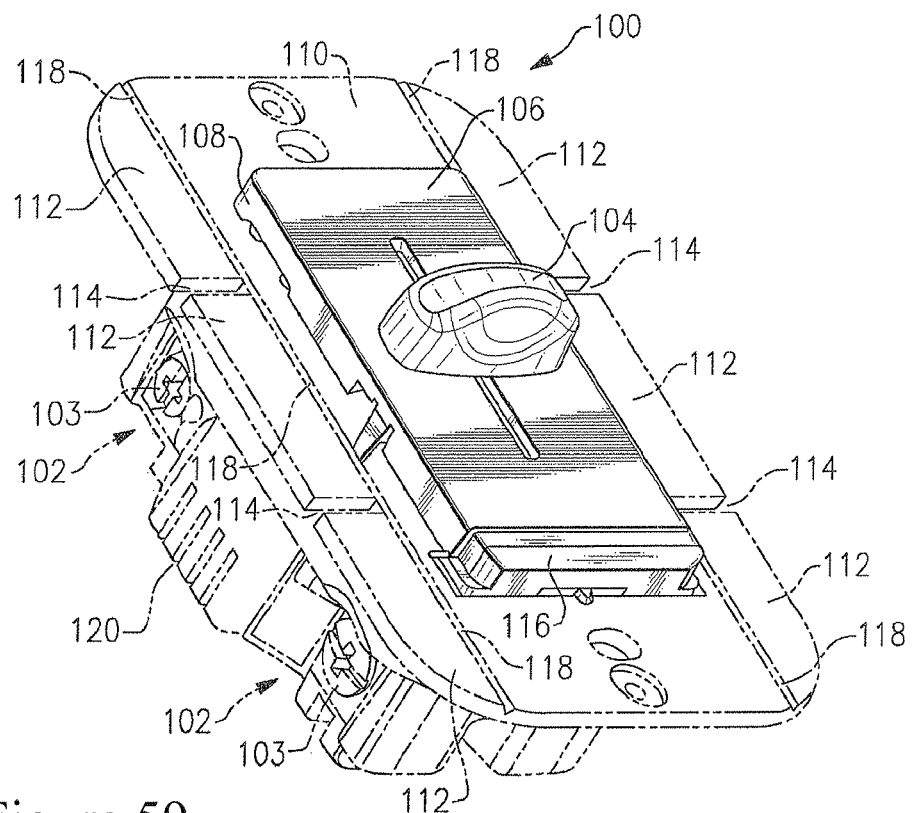
FIG. 59 is a perspective view of a power control device in accordance with a first embodiment of the present invention.

As embodied herein and depicted in FIG. 59, a perspective view of a first embodiment of the power control device is shown. Device 100 includes a mounting strap 110, which functions as the device heat sink, coupled between a user accessible front cover portion 106 and device body member 120. A light module 116 is disposed between cover member 106 and an end portion of front cover portion 106. Device 100 includes screw terminals 102 which are provided to connect device 100 to both the voltage source and the load. A control knob 104 is disposed on the user accessible cover member 106 and is employed to adjust the power delivered to the load.

Power control device 100 may include a light module 116. Light module 116 may be configured to emit light when the control knob 104 is in the full OFF position. In this embodiment, lamp 116 operates as a locator for power control device 100 such that device 100 may be located by a user in a darkened room. In an alternate embodiment, lamp 116 serves as a pilot light, emitting light when power control device 100 is not in the fully OFF position. A pilot light allows the user to identify the power control device that is in use. Lamp module 116 includes a circuit that results in a steady light emission or, alternatively, that results in a blinking light emission, occurring during an intended circumstance for light emission such as has been described. In another embodiment of the present invention, lamp 116 is a removable lamp module.

In yet another embodiment, the removable lamp module may be replaced by a blank member. The blank member allows the power control device 100 to be reconfigurable from an illuminated device to a non-illuminated device, and vice-versa, in accordance with the user's requirements.

Figure 60:
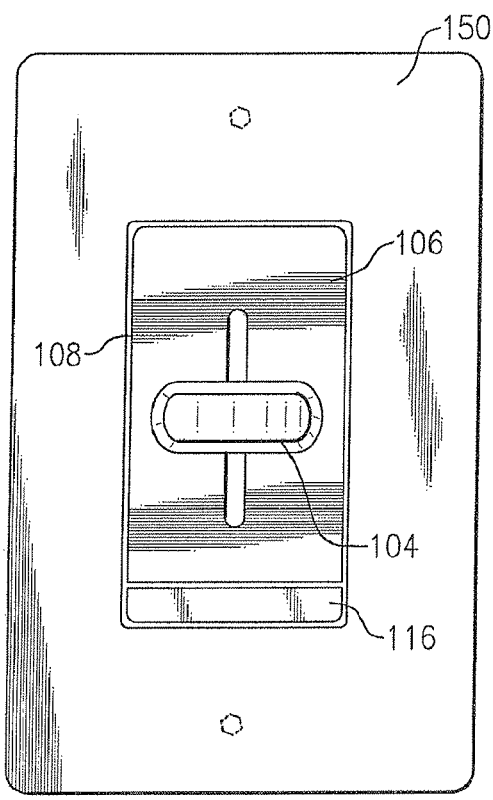
FIG. 60 is a plan view of the power control device depicted in FIG. 59 disposed in a standard wall plate.

FIG. 60 is a plan view of the power control device depicted in FIG. 59 disposed in a standard wall plate 150. In particular, the frameless front cover member 106 has a raised rectangular form factor, as evidenced by raised edge 108, which substantially corresponds to the standard wall plate opening and extends therethrough. The transverse dimension of frameless front cover member 106 is substantially equal to the transverse dimension of the standard wall plate opening. The gap between wall plate 150 and cover member 106 is slightly exaggerated in FIG. 60. The planar surface of member 106 is approximately flush with the exposed surface of the wall plate. Accordingly, the cover plate cannot interfere with actuation of control knob 104. Furthermore, there are no inaccessible crevices or recessed surfaces that inhibit cleaning. The term "standard wall plate" is defined herein as a wall plate that conforms to the dimensions provided by the ANSI/ NEMA WD6 standard.

Figure 61:
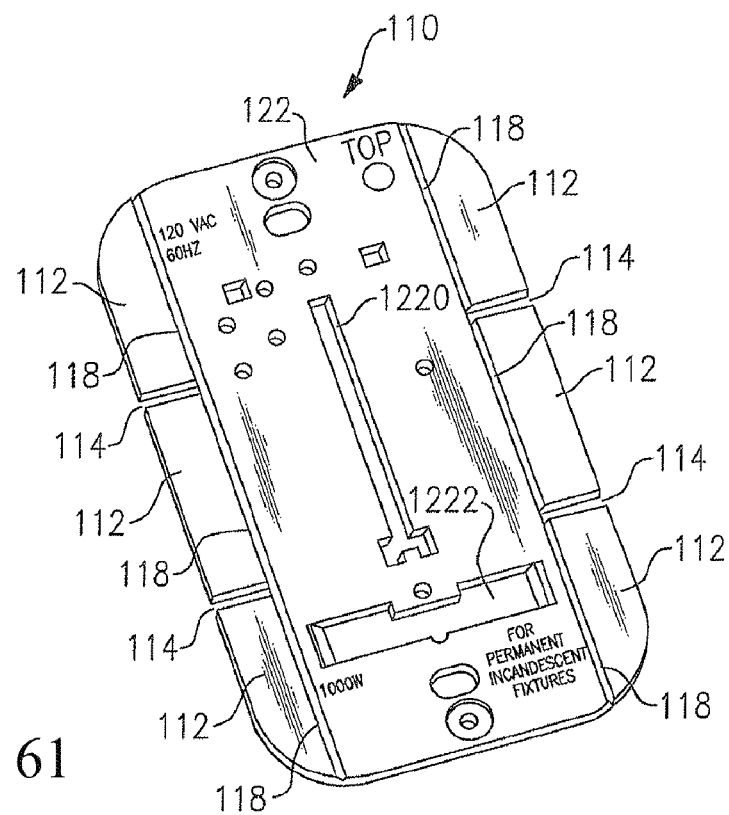
FIG. 61 is a top view of a heat sink mounting strap depicted in FIG. 59.

Referring to FIG. 61, a top view of a heat sink mounting strap 110 depicted in FIG. 59 is shown. Heat sink 110 is planar, avoiding the disadvantages associated with certain conventional heat sinks. Heat sink 110 includes a plurality of removable tab members 112 connected to a central heat sink portion 122. Central portion 122 includes a control knob aperture 1220 and a lamp assembly aperture 1222. An upset line 118 extends along each longitudinal side of heat sink 110 separating interior portion 122 from removable tabs 112. Upsets 118 may be implemented using scored lines, perforations, notches, and/or similar features. Tabs 112 are segmented by forming linear gaps 114 extending between the longitudinal edges of the heat sink and upset lines 118. Because the arrangement does not include any longitudinal gaps between central portion 122 and tabs 112, thermal conductivity is only marginally impacted. At the same time, the design allows the tabs 112 to be easily removed when tab removal is a necessity. Of course, those of ordinary skill in the art will understand that the heat generated by solid state devices, such as a triac, is more readily dissipated if the tabs 112 are not removed.

The conventional heat sink shown in FIG. 2 of U.S. Pat. No. 7,497,582 is non-planar and is characterized by a thickness that is approximately equal to 0.062 inches. Those of ordinary skill in the art understand that thermal conductivity is a function of both the cross-sectional thickness of the heat sink, as well as the material used to implement the heat sink. Thinner heat sinks may result in hot spots during operation that must be isolated from device components. The depth of the conventional device from the heat sink to a major rear surface of the device is typically greater than 1.40 inches to provide the necessary isolation. On the other hand, the heat sink 110 of the present invention has a thickness within an approximate range between 0.080 and 0.10 inches. The combination of the increased cross-sectional area, i.e., thickness, the planar heat sink configuration, and the increased planar surface area provided by the tab 112 arrangement, contributes to a heat sink that exhibits a surface temperature that is more evenly distributed and peak temperatures that are less severe. Accordingly, the air space required to thermally isolate device components may be reduced. Also, the planar heat sink of the present invention does not have a downwardly stepped interior portion. This translates to a reduction in the distance required between the heat sink 110 and the interior rear surface of the housing 120 to approximately 1.20 inches.

Figure 62:
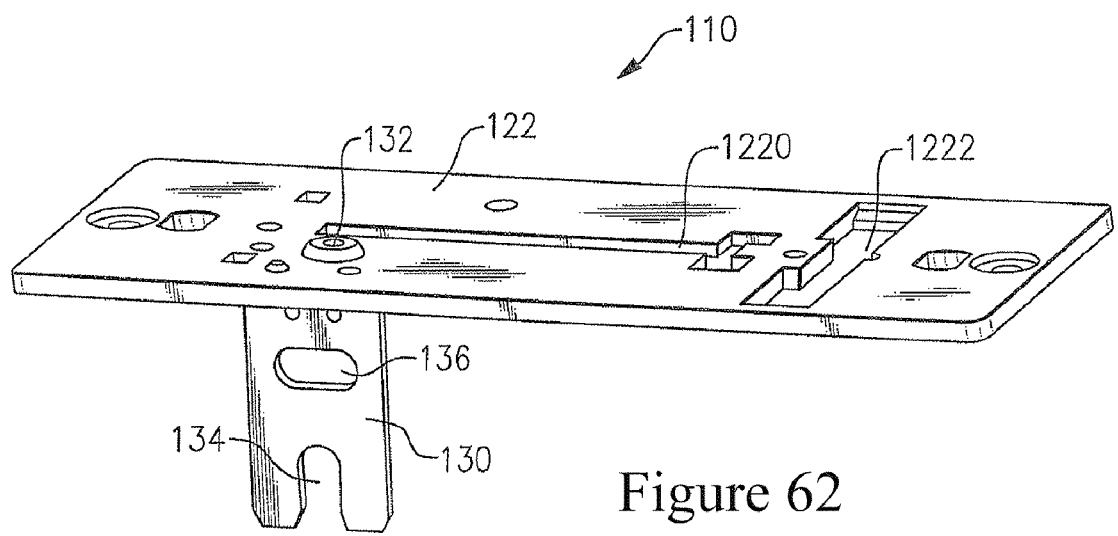
FIG. 62 is a side perspective view of the heat sink assembly depicted in FIG. 61.

Referring to FIG. 62, a side perspective view of the heat sink assembly 110 depicted in FIG. 61 is shown. In this view, tabs 112 are shown as being removed for clarity of illustration. Heat sink assembly 110 includes a ground tab 130 connected to the planar heat sink 122 by a rivet 132. Ground tab 130 includes a terminal region 134 configured to accommodate a ground screw. As noted previously, limitations associated with conventional devices often result in the ground terminal connection becoming excessively hot. Ground tab 130 addresses the drawbacks associated with the conventional designs in several ways.

As noted above, in some conventional designs, a section of an end portion 28 is bent downwardly to form a screw terminal The drawback associated with this approach relates to the fact that a tab 22 must be removed. Consequently the over-all surface area used for device cooling is reduced. The inclusion of ground tab 130 in the present invention eliminates this drawback. The two-piece-construction of ground tab 130 also eliminates the amount of heat transmitted to the ground terminal by reducing the thermal conductivity of the ground tab 130 relative to the heat sink 122 itself.

Ground tab 130 may have a lower thermal conductivity by reducing the cross-sectional area of the ground tab. Thus, while the material employed to fabricate heat sink 122 and ground tab 130 may have identical, or similar, heat conduction properties, the reduction in cross-sectional area will result in lower thermal conductivity. The cross-sectional area may also be reduced by the inclusion of slot 136 in ground tab 130. On the other hand, a similar result may be obtained by selecting a ground tab material that has a comparatively greater thermal resistivity than the heat sink material. The use of dissimilar materials will also prevent excessive thermal energy from being conducted to the ground wire. In one embodiment, ground tab 130 is made out of steel whereas heat sink 122 is made out of aluminum. Accordingly, the heat sink 122 may operate at a maximum temperature of approximately 80° C., whereas the ground tab's thermal resistance limits the ground terminal temperature to about 60° C. This arrangement prevents the temperature applied to the ground wire insulation from exceeding a safe level.

Those of ordinary skill in the art will understand that heat sink 122 may be connected to ground tab 130 by any suitable means including, but not limited to, welding, braising, soldering, gluing, interference fitting, and press-fitting.

Figure 63:
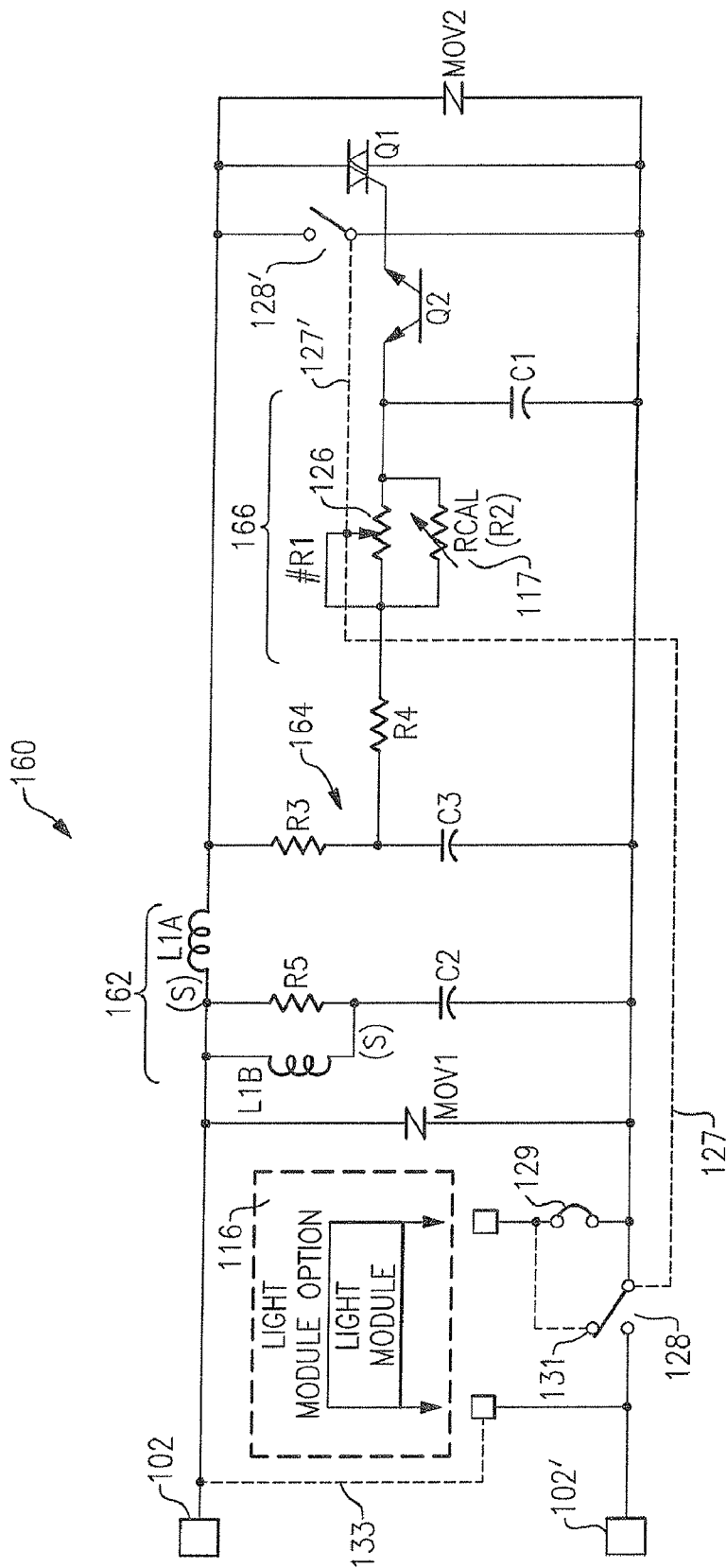
FIG. 63 is a schematic diagram of the power control device shown in FIG. 59.

As embodied herein and depicted in FIG. 63, a schematic diagram for the power control device depicted in FIG. 59 is shown. The device is connected to the electrical distribution system by connecting the load between the hot line and terminal 102. Terminal 102' is connected to the return line. Light module 116 is configured to visibly display an operative condition of the power control device. As is shown by way of example in FIG. 59, lamp module 116 is connected in series with terminal 102'. Lamp module 116 is disposed in series with the series pass element 161 and in parallel with control switch 128. Control switch 128 is operatively coupled to adjustable element R1. The coupling is denoted by dotted line 127. Of course, light module 116 is OFF when switch 128 is in the closed position and ON when switch 128 is in the open position. Control switch 128 is configured to close when adjustable element R1 is adjusted for maximum (or near maximum) current through series pass element Q1. This type of switch is known as a "full-on switch" or "full-on bypass switch." A purpose of the full-on switch is to operate the light module as a nightlight as will be explained.

In an alternate embodiment control switch 128 is configured to open when the reset element is adjusted for minimum (or near minimum) current through series pass element Q1. This type of switch is known as an air gap switch or a slide-to-off switch. An air gap switch ensures that there is little or no electrical current to the load that could shock someone when they are changing a light included in the load. Preferably this current level is less than 0.5 mA. This current level is too low to activate the load. The term "control switch" as used herein, is a switch that is disposed in series with the power control load that operates in response to the adjustment of the variable control mechanism.

Contact 131 of control switch 128 can be omitted to simplify or reduce the cost of assembly by employing jumper 129. Jumper 129 may be implemented using any suitable means, such as a solder bridge, removable conductor, attachable conductor, or as an insertable conductor. In one embodiment, jumper 129 is an electrically conductive material inserted in the hole of a printed circuit board. The insertion connects circuitry together disposed on either side of the board. In other embodiments of the invention to be described, jumper 129 is omitted and the control switch functions as a single-pole double-throw switch.

In another embodiment, light module 116 is coupled across switching element Q1 as shown by dotted line 133. The amount of light emitted by light module 116 is in inverse relation to the power level to the load. Given the inverse relationship, the lamp module serves as a locating aid for helping to locate the power control device in an otherwise darkened room.

Power control device 100 may be susceptible to damage when an overvoltage condition exceeds about a 1,000 Volts. As those of ordinary skill in the art will appreciate, overvoltages may be caused by switching transients that occur when a load on the electric circuit is turned ON or OFF. Overvoltage conditions may also be generated by lightning induced transients. Accordingly, a metal oxide varistor MOV1 is disposed between terminal 102 and terminal 102' to protect device 100 from such overvoltage conditions that may occur from time to time. MOV 1 protects the device 100 by clamping the transient voltage to a safe level, i.e., less than about 500 Volts.

Device 100 also includes an RFI filter block 162 that is configured to eliminate high frequency noise generated by series pass element Q1. RFI filter 162 includes inductors L1A, L1B, resistor R5, and capacitor C2. The functionality of filter 164 will become clearer in the discussion provided below. RC filter circuit 164 strips off random high frequency transients that are propagating in the electrical circuit. Filtering is implemented by resistor R3, R4, and C3. RC circuit 164 also phase shifts the input signal by a predetermined phase angle.

The power applied to series pass element Q1 is regulated by the variable control mechanism 166, which is implemented using potentiometer 126 (R1), trim adjustment resistor 117 (R2), resistor R4 and capacitor C1. The variable control mechanism 166 is adjusted by the user by way of the control knob switch 104 (See FIG. 59). Of course, potentiometer 126 is the adjustable element R1 in circuit 166. An RC circuit, such as the one implemented by potentiometer 126, resistor R4, and C1, may be characterized by a time constant ($\tau$). In this case, time constant t corresponds to a delay between the zero-crossing of the AC signal and the firing angle of the circuit. In other words, circuit 166 is configured to turn transistor Q2 ON at a predetermined point during the AC cycle. Transistor Q2 works in concert with capacitors C1 and/or C3 in providing triac Q1 with a current high enough to turn triac Q1 ON. Thus, circuit 166 is configured to drive Q1 to cycle the power to the load ON and OFF a predetermined number of times during each AC cycle.

Trim adjustment resistor 117 is discussed in greater detail in the embodiment depicted in FIG. 63. Suffice it to say at this point that trim resistor 117 may be used to calibrate device 100 to a fan motor or adjust the minimum light intensity provided by the dimmer.

Referring back to light module 116, those of ordinary skill in the art will understand that module circuit 116 may be configured such that the amount of light emitted by the lamp assembly is either unaffected by, or related to the percentage of time that current is being supplied by the power control device to the load. The relationship may be either a direct relationship or an inverse relationship. If there is a direct relationship, the lamp module serves to indicate the amount of power being provided to the load. If there is an inverse relationship, the lamp module serves as a locating aid for helping to locate the power device in an otherwise darkened room.

The functionality of MOV 1 was discussed above. MOV 1 may be of any suitable type, but there is shown by way of example a movistor that is about 12 mm in diameter, or larger. A movistor of this size is capable of absorbing the energy levels described previously. Other surge suppression devices, such as spark gaps, gas discharge devices, capacitors, and/or zener diodes may be used in combination with MOV 1. In alternate embodiments, the aforementioned other surge suppression devices may replace MOV 1 altogether.

In an alternate embodiment of the present invention, MOV 1 is omitted and MOV 2 is disposed across the series pass element. MOV 2 protects the series pass element and other components from overvoltage conditions. MOV 2 is in series with the RFI filter (L1A, L1B, C2, and R5). Of course, with all things being equal, the amount of current propagating through MOV 2 is typically not as great as the current through MOV 1 due to the series impedance of the RFI filter. Since MOV 2 does not have to dissipate as much energy as MOV 1 due to the reduced current, MOV 2 may be a comparatively smaller than MOV 1. Accordingly, MOV 2 may be about 7 mm in diameter.

In yet another alternate embodiment, MOV 2 and MOV 1 may be used in combination. In this arrangement, MOV 2 protects the series pass element Q1 and other components, while MOV 1 protects components such as the RFI circuit.

Figure 64:
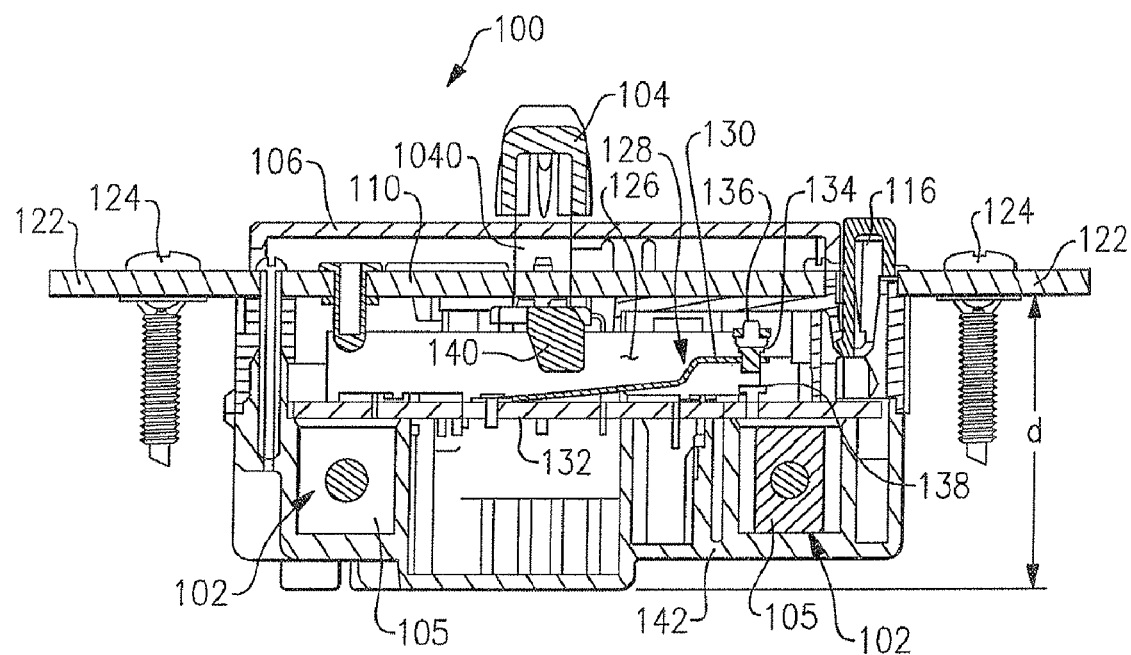
FIG. 64 is a cross-sectional side view of the power control device depicted in FIG. 59.

Referring to FIG. 64, a cross-sectional view of the power control device depicted in FIG. 59 is shown. Dimmer control knob 104 is connected to a rectangular stem member 1040 that extends through a slot 124 formed in mounting strap/heat sink 110. The non-accessible end of the slide member 1040 is connected to switch actuator 140. Switch actuator 140 is configured to slide within potentiometer 126 to vary the displacement of slide switch 128. Control switch (slide switch) 128 includes cantilever beam 130 which is electrically connected to a printed circuit board 132. Slide switch 128 also includes contact 134 and fixed contacts 136 or 138. Fixed contacts 136, 138 are alternate embodiments that are discussed below.

If contact 136 is employed, cantilever beam 130 is pre-biased such that there is electrical connectivity between the cantilever beam and contact 136. When the user moves control knob 104 to the right, actuator 140 will eventually cause contacts 134 and 136 to separate. On the other hand, if the switch may employ contact 138. In this case, as control knob 104 is moved to the right, actuator 140 urges cantilever beam 130 to deflect toward contact 138 to establish electrical connectivity.

In an alternate embodiment, a second control switch (not shown) is disposed in device 100. The second control (slide) switch 128' is similar in structure to slide switch 128 except that it is oriented in the opposite direction. Whereas cantilever beam 130 deflects when actuator 140 is moved to the right, the cantilever beam included in control switch 128' deflects when actuator 140 moves to the left. The control switches serve to provide a full-on capability at one end of the potentiometer adjustment and full-off capability at the other end of the potentiometer adjustment. Switch 128' is coupled across switching element Q1 (see FIG. 63). Switch 128' is shown as coupled to adjustable element R1 by dotted line 127'.

The depth behind the mounting strap, represented by dimension "d" is the distance between the mounting strap and a rearward surface of rear body member 122. The dimension "d" is typically less than or equal to approximately 1.20 inches.

The cross-sectional view provided by FIG. 64 reveals that wiring terminals 102 may include screw terminals 103 (FIG. 59) as well as pressure plates 105. Thus, device 100 may be connected to the electrical circuit by fastening the electrical wiring to terminals 102 by wrapping the wire around the shank of a terminal screw 103 and tightening the screw. Alternatively, the wire may be inserted between pressure plate 105 and the head of the terminal screw. Again, the screw is subsequently tightened causing the wire to be clamped by the plate and the screw head. Terminals 102 may also include a clip into which a wire is inserted. After inserted, the clip closes to fasten the wire to the terminal. Regardless of the method of connecting the electrical wiring to device 100, after the wiring is connected to the terminals 102, installation is completed by inserting fasteners 124 into apertures formed in the end portions 122 of strap 110.

Figure 65:
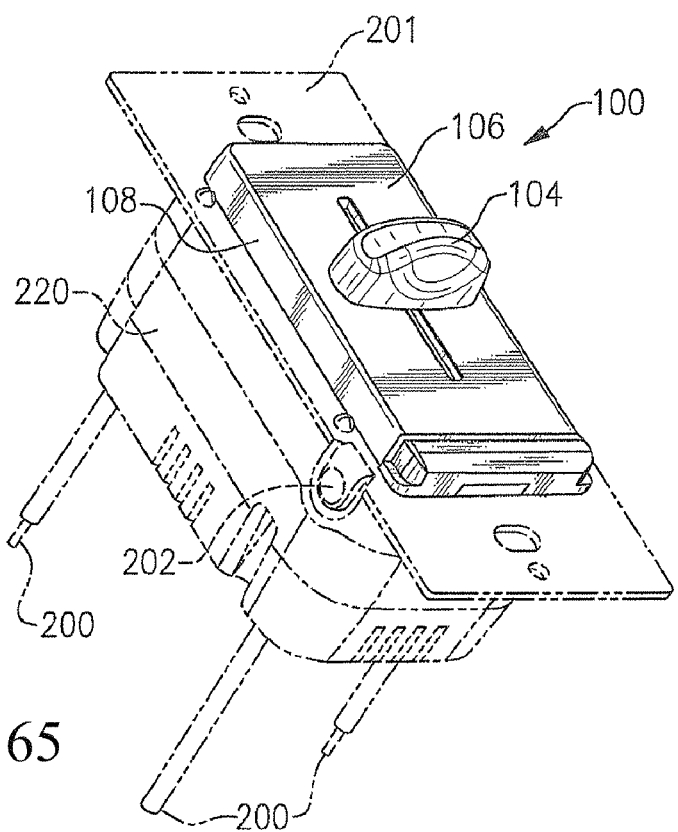
FIG. 65 is a perspective view of a power control device in accordance with a second embodiment of the present invention.

As embodied herein and depicted in FIG. 65, a perspective view of a second embodiment of the power control device 100 is shown. This embodiment is directed to a multi-position fan speed control device. Control knob 104 allows the user to select five discrete positions including OFF, LOW, MEDIUM, HIGH, and MAXIMUM. The body member 220 includes a greater interior volume than the body member 120 employed in FIG. 61. Note also that device 100 employs wire terminals 200 instead of the screw terminals provided in the first embodiment. The additional volume is required to accommodate the capacitors employed in the switching circuit (not shown). The mounting strap 201 employed in the second embodiment is similar to the heat sink 110 shown in FIG. 61. One notable exception is that mounting strap 201 does not include any removable tabs. A ground terminal 202 coupled to mounting strap 201 and disposed at an exterior location on body member 220 permits mounting strap 201 to be electrically connected to a ground wire. Since removable tabs 112 are not provided in this embodiment, ground terminal 202 may be disposed along any of the edges of mounting strap 201.

Figure 66:
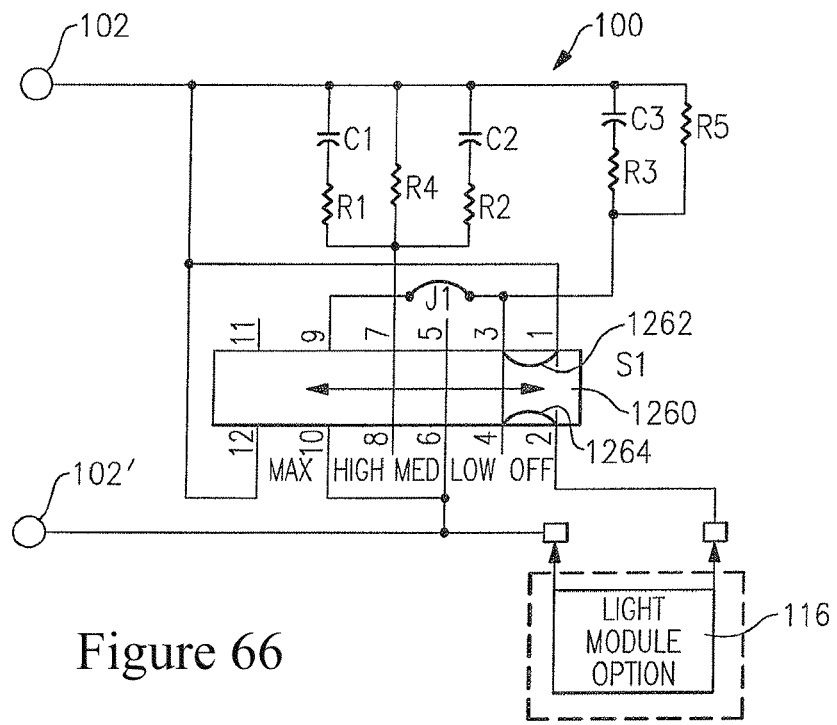
FIG. 66 is a schematic diagram of a fan speed control circuit in accordance with the embodiment depicted in FIG. 65.

Referring to FIG. 66, a schematic diagram of the multi-position fan speed control device depicted in FIG. 65 is shown. The device 100 is connected to the electrical distribution system via terminals (wires) 200. The fan motor load is coupled in series with device 100 to the source voltage of the electrical distribution system. The basis of this embodiment is discrete step switch element 1260 which is coupled to the control knob 104. Thus, control knob 104 may be employed by a user to select between any one of five positions including OFF, LOW, MED, HIGH, and MAX. As those of ordinary skill in the art will appreciate, switch element 1260 is the functional equivalent of the variable control circuit and is coupled to the series pass element. The series pass element is implemented by an RC circuit that includes capacitors C1, C2, C3.

The second embodiment of the present invention also includes a light module 116. Again, the light module 116 functions as a locator light. When switch 1260 is placed in the OFF position, current is applied to the light module 116. Light is thus emitted when device 100 is turned OFF. Thus, a person entering a darkened room may easily locate the control because the light emitted by module 116 functions as a location beacon.

Switch 1260 operates as follows. Control knob 104 is shown in the OFF position. In the OFF position, switch contacts 1 and 3 are shorted together by shorting structure 1262 and contacts 2 and 4 are shorted together by shorting structure 1264. As the switch is stepped from the OFF position to the MAX position, the bridging structures advance each time to short the next pair of adjacent terminals. When knob 104 is stepped all the way to the MAX position, contacts 9 and 11 are shorted together and contacts 10 and 12 are shorted together. At the MAX position, there is little or no impedance between terminals 200.

In an alternate embodiment, light module 116 is disposed across contacts 11 and 12 (not shown). When light module 116 is not emitting light, the user realizes that the fan is fully activated.

Figure 67:
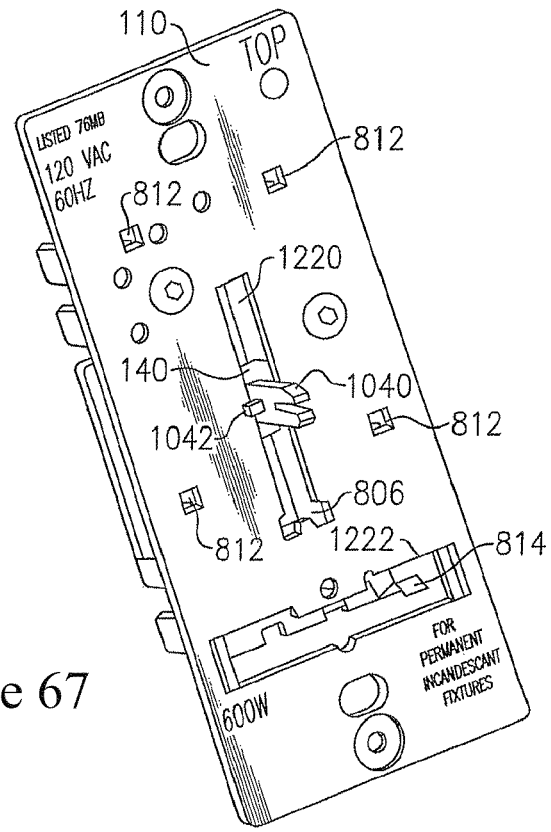
FIG. 67 is a perspective view of the mounting strap and control actuator interface depicted in FIG. 65.

Referring to FIG. 67, a detail view of the mounting strap and control actuator interface suitable for FIGS. 59-66 is shown. The user adjusts the amount of power delivered to the load by manipulating control knob 104. Control knob stem 1040 extends through slot 1220 to connect with switch actuator 140. Stabilizer element 1042 is disposed in a transverse direction relative to stem portion 1040. The stabilizer element 1042 facilitates the movement of actuator 140 along the longitudinal axis of slot 804. Stabilizer 1042 and switch actuator 140 limit the torquing motion when the control knob 104 is manipulated by the user. In the continuously variable embodiments of the present invention, a portion of actuator 140 slides within potentiometer 126. In the step-wise adjustable embodiment, control stem 1040 moves between the discrete positions provided by switch 1260.

Slot 1220 has an enlarged region 806 that permits switch actuator 140 and strap 110 to be assembled. A subsequent assembly step may add a barrier (not shown) that prevents switch actuator 140 from re-entering the enlarged region. In an alternate embodiment, the enlarged region may be omitted if the switch actuator 140 is disposed on one side of the mounting strap 110 and stabilizer 1042 is included.

Strap 110 also includes an opening 1222 that is configured to accommodate light module 116. Contact mechanism 814 is configured to engage the light module contact mechanism. If the user employs a blank module instead of a light module, contact mechanism 814 is covered by the blank module and not accessible to a user. The mounting strap 110 also includes holes 812 that accommodate the front cover snaps that are used to connect front cover 106 to the strap 110.

Figure 68:
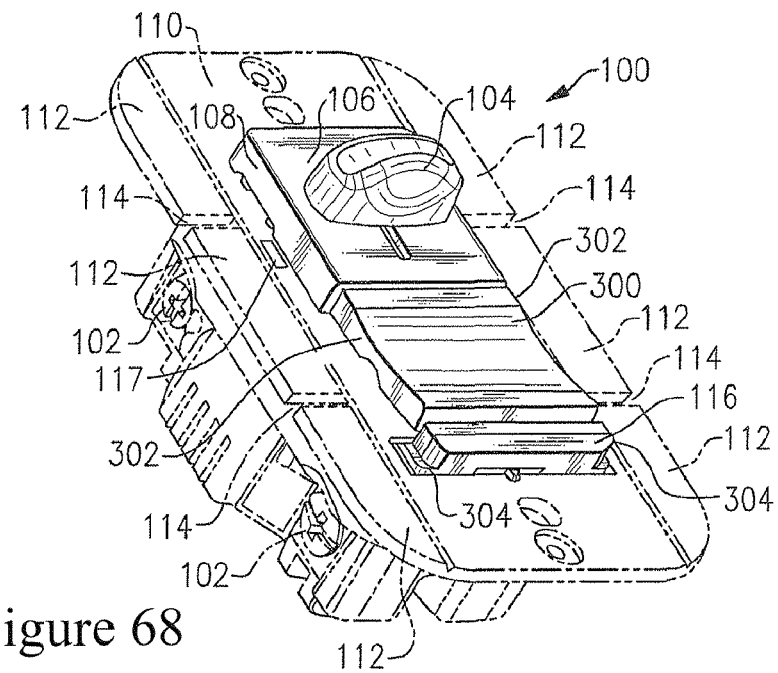
FIG. 68 is a perspective view of a power control device in accordance with a third embodiment of the present invention.

As embodied herein and depicted in FIG. 68, a perspective view of a power control device 110 in accordance with a third embodiment of the present invention is shown. In this embodiment, the self-aligning front cover member includes the dimmer switch front portion 106 and a switch element 300. Of course, the light module 116 is disposed under the switch element 300. Each of these elements (106, 300, and 116) has a raised rectangular form factor that corresponds to a standard wall plate opening. Switch 300 also includes raised edges 302 that are configured to align with the raised edge of dimmer cover member 106 and light module 116. Raised edges 302, light module 116, and dimmer cover member 106 are configured to be flush, or slightly raised, relative to the surface of the cover plate 150.

Those of ordinary skill in the art will understand that control knob 104 may be coupled to either a continuously variable dimmer control or a variable speed fan control disposed in body member 120. Thus, switch control 106 may also be implemented as a multi-positional switch, such as a three way switch. The three-way switch may be configured to switch between an OFF position, an intermediate position, and a full ON position. The three way switch may be operatively coupled to the series pass element in the device and to a remote switch.

Switch 300 may be configured as a preset switch that is disposed in series with the variable speed dimmer or fan control. The preset switch provides device 100 with an ON/OFF control. The preset switch turns the dimmer ON at the last selected brightness level, or at a predetermined brightness level, eliminating the need for the user to find the desired setting every time the device is switched ON and OFF. This allows a user to keep control knob 104 in a desired position such that the user need only actuate switch 300 to cause device 100 to operate as it did during the last operation.

In another embodiment, switch 300 may be configured to provide ON/OFF control to a separate electrical load. Those skilled in the art understand that general purpose switches of this type that are typically employed in residential environments should be rated at either 15 Amperes or 20 Amperes, depending on the application. As shown, switch 300 toggles between positions disposed along the longitudinal axis of device 100. The directionality of switch toggling is advantageous because it avoids interference with any switches that may be disposed nearby. Alternatively, switch 300 may be configured to toggle in the transverse direction.

Device 100 includes a user accessible trim adjuster 117. Trim adjuster 117 is accessible to the user when the cover plate is removed. As noted previously, trim adjuster 117 provides a low end voltage adjustment that allows the user to set the minimum light intensity, or the minimum fan motor speed. Those of ordinary skill in the art will understand that certain electric motors tend to stall below a certain operating speed. Accordingly, trim adjuster 117 allows the user to calibrate device 100 to the fan motor. This feature may also be useful to adjust the minimum light intensity provided by the dimmer.

Figure 69:
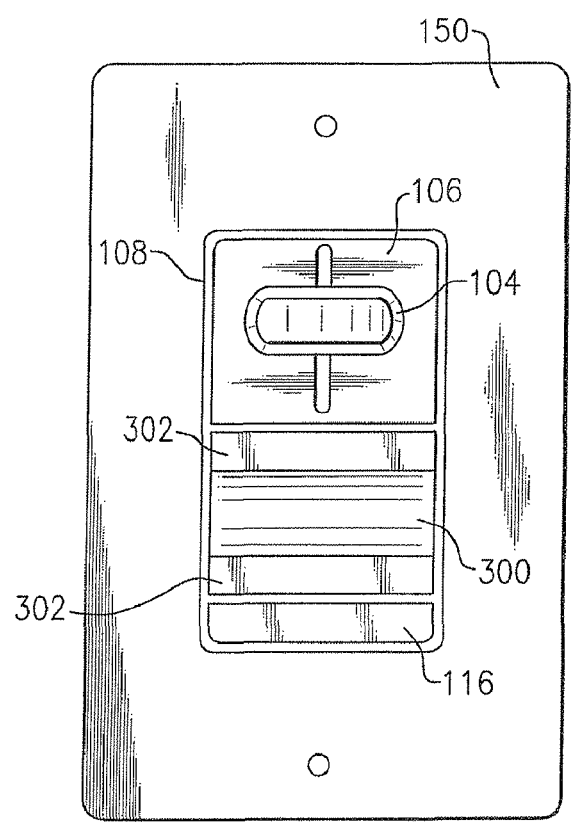
FIG. 69 is a plan view of the power control device depicted in FIG. 68 disposed in a standard wall plate.

FIG. 69 is a plan view of the power control device depicted in FIG. 68 disposed in a standard wall plate 150. Again, the frameless front cover assembly has a raised rectangular form factor that closely fits into the cover plate 150 opening. The self-aligning front cover member includes the dimmer switch front portion 106 and a switch element 300. Each of these elements (106, 300, and 116) has a raised rectangular form factor that corresponds to a standard wall plate opening. In other words, each of the aforementioned elements has a transverse dimension substantially equal to the transverse dimension of the standard wall plate opening.

The gap between wall plate 150 and cover member 106 is slightly exaggerated in FIG. 69. The planar surface of member 106 and the raised portions 302 are flush with the exposed surface of the wall plate. Accordingly, the cover plate cannot interfere with the actuation of the control knob 104 or switch member 300. Furthermore, there are no inaccessible crevices or recessed surfaces that inhibit cleaning. Again, the term "standard wall plate" is defined herein as a wall plate that conforms to the dimensions provided by the ANSI/NEMA WD6 standard.

Figure 70:
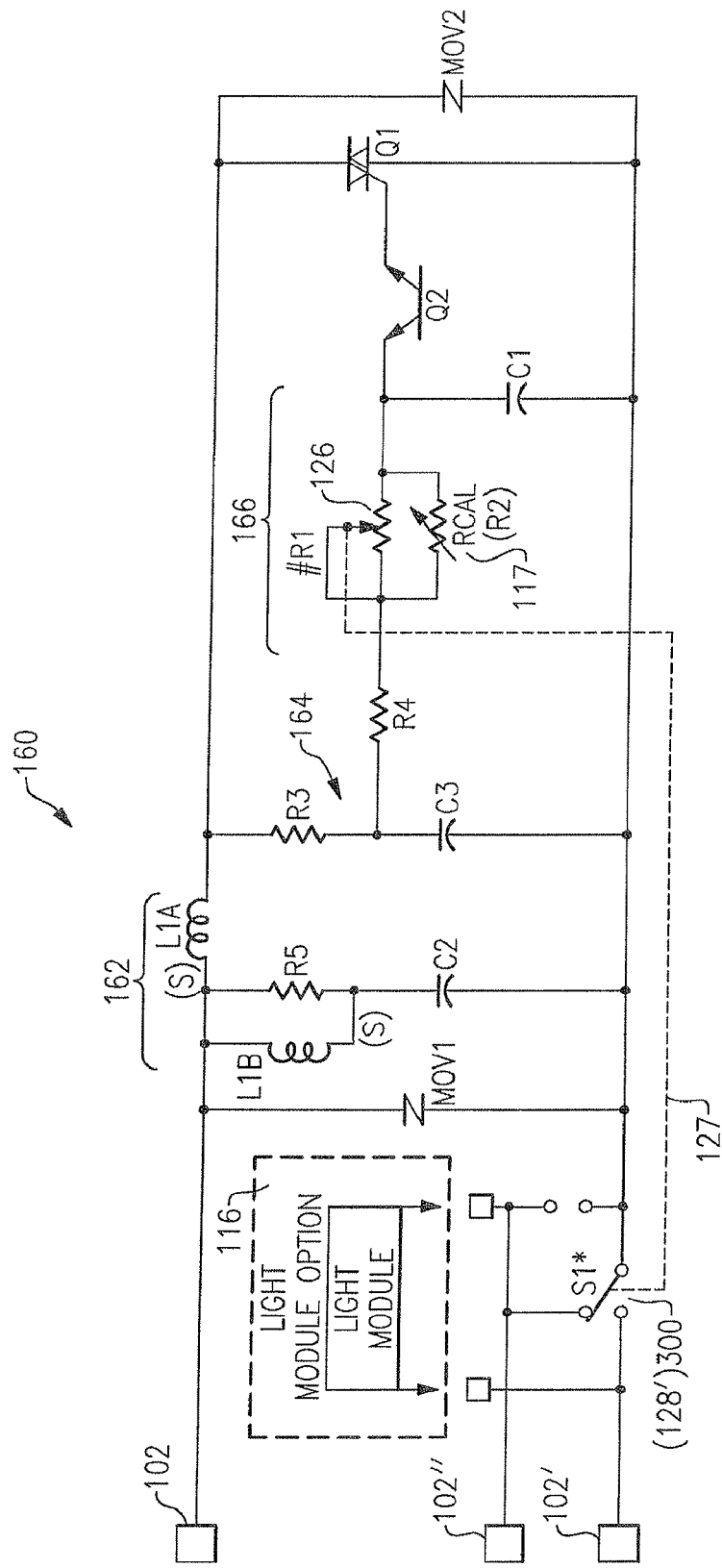
FIG. 70 is a schematic diagram of the power control device shown in FIG. 68.

As embodied herein and depicted in FIG. 70, a schematic diagram for the power control device depicted in FIG. 68 is shown. The schematic diagram of FIG. 70 is almost identical to the diagram shown in FIG. 63. The exception is that a single-pole double-throw is included. In one embodiment, the single-pole double-throw switch is a control switch 128'. Control switch 128' is operatively coupled to adjustable element R1. The coupling is denoted by dotted line 127. Terminals 102' and 102" are electrically connected to fixed contacts 136 and 138. Also, terminals 102' and 102" are connected to like terminals in a remotely located switch. The two switches are interconnected to allow power to the load to be switched OFF and ON by either switch. This is commonly referred to as a three-way switching scheme. Light module 116 is coupled to switch 128' so as to emit light whenever power is not being provided to the load.

In an alternate embodiment, the single-pole double-pole switch is the preset switch 300. Of course, preset switch 300 and the adjustable element are independently operable, (dotted line 127 is omitted in this embodiment.)

The load is coupled to the source voltage by way of terminal 102 and one of terminals 102', 102" which are selected by operation of preset switch 300 (S1). In contrast to a control switch, a preset switch is not coupled to adjustable element R1. Dashed line 304 illustrates the connection between the preset switch 300 and potentiometer 126. Switch 300 is configured to turn the power control circuit 160 ON or OFF. Light module 116 functions as a locator light element. When preset switch 300 is OFF the light module 116 is energized. If preset switch 300 is ON, the circuit is energized and light module 116 does not emit light.

Figure 71:
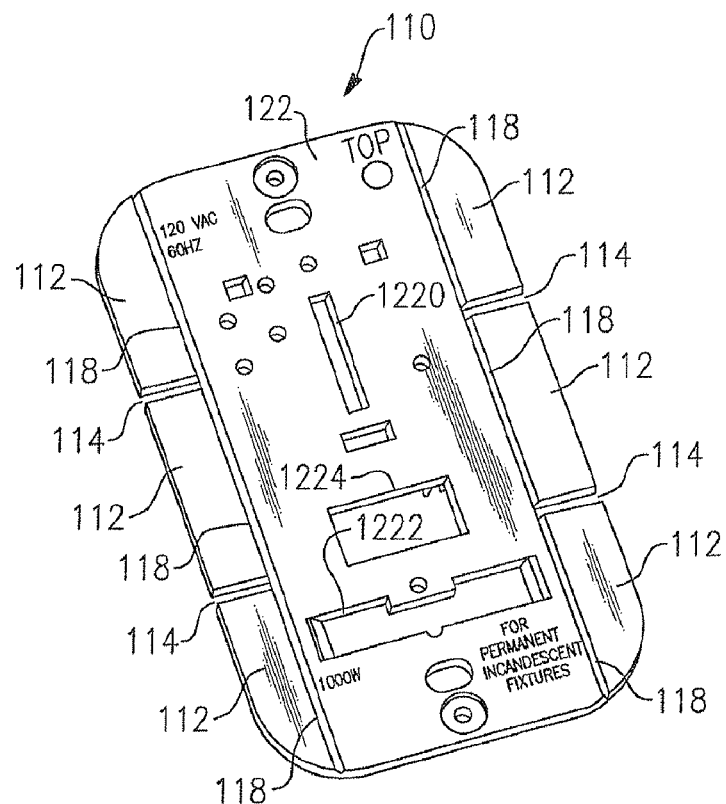
FIG. 71 is a top view of the heat sink mounting strap depicted in FIG. 68.

As embodied herein and depicted in FIG. 71, a plan view of the heat sink 110 depicted in FIGS. 68-69 is shown. Like the heat sink member shown in FIGS. 61-62, all of the elements of heat sink 110 are disposed in a single plane. Heat sink 110 includes a central portion 122 that includes several apertures 1220, 1222, and 1224 that are formed to accommodate the control knob stem 1040, switch 300, and light module 1116, respectively. An upset line 118 extends along each longitudinal side of heat sink 110 separating interior portion 122 from removable tabs 112. Tabs 112 are segmented by forming linear gaps 114 extending between the longitudinal edges of the heat sink and upset lines 118. Upsets 118 may be implemented using scored lines, perforations, notches, and/or similar features. Unlike conventional designs, there are no gaps along the longitudinal axis between heat sink 110 and tabs 112. The innovation results in superior thermal conductivity between portion 122 and tabs 112.

The segmented break-off tabs are easier to remove than a single tab disposed along the longitudinal edge of heat sink 110. Further, the segmented tabs allow for the removal of a single tab in the event that it is necessary to only remove a single tab from proper device installation. Accordingly, the remaining tabs are left in place to provide optimal heat-sinking functionality.

It will be apparent to those of ordinary skill in the pertinent art that modifications and variations can be made to strap/heat sink 110 of the present invention depending on cost, manufacturability, and heat conduction characteristics. Accordingly, heat sink 110 may be fabricated using a conductive material such as aluminum or steel. The material may be plated, anodized, black anodized, or similarly processed.

Figure 72:
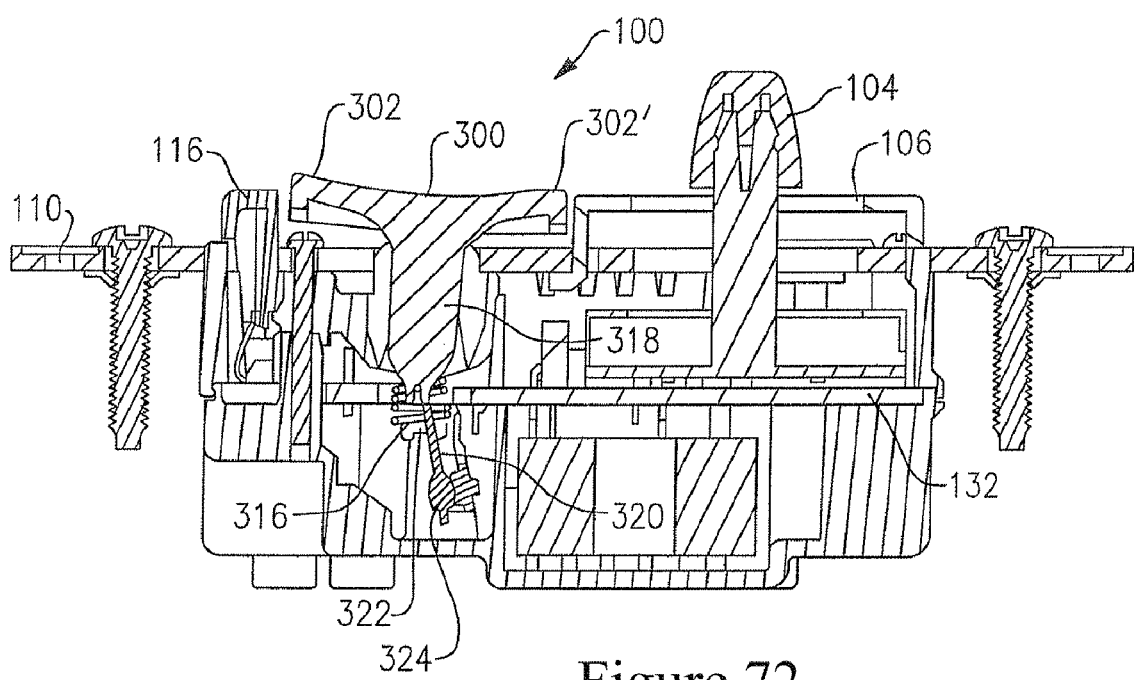
FIG. 72 is a side perspective view of the heat sink depicted in FIG. 71.

Referring to FIG. 72, a cross-sectional view of the device 100 depicted in FIG. 68 is shown. The dimmer portion 106 disposed adjacent to the switch button 300 is a smaller version of the dimmer switch fully described above.

The preset switch 300 toggles between an ON position and an OFF position represented by raised surfaces 302, 302'. Raised surfaces 302, 302' are used to actuate the switch between the two positions. Those of ordinary skill in the art will understand that switch 300 may be implemented using any suitable form factor that provides the user with the ability to toggle between the two positions. For example, switch 300 may be in the shape of a lever (not shown) wherein the two tactile surfaces are disposed on opposite sides of the lever. Switch 310 may be a push button switch. In this embodiment, each depression of the push button toggles the switch from one position into the other.

Switch 300 includes an actuator arm 318 that extends into the interior of device 100. A center bias spring 316 applies force to actuator arm 318 such that a snapping action occurs when switch 310 is toggled between the ON and OFF switch positions. Actuator arm 318 is also coupled to pivot member 320. Pivot member 320 rotates in cradle member 322 under the guidance of actuator arm 318.

Figure 73:
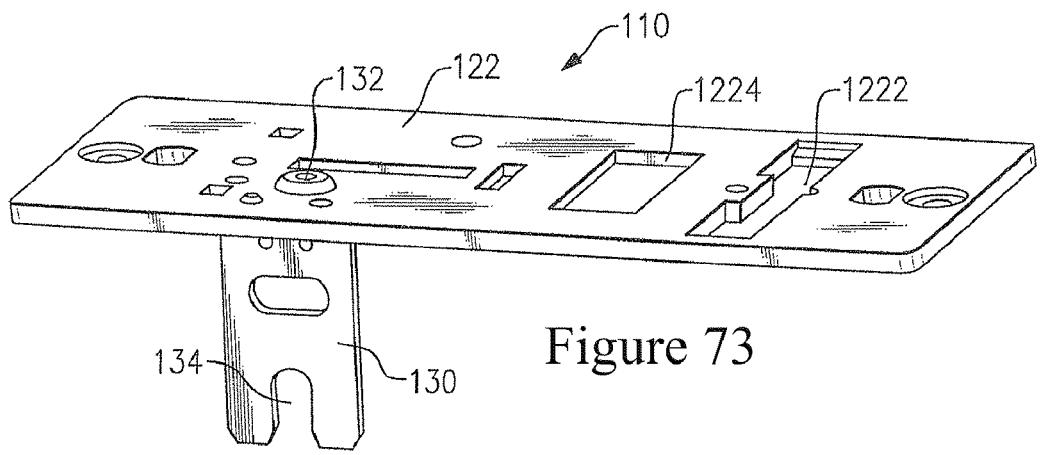
FIG. 73 is a cross-sectional view of the device shown in FIG. 68.

Referring to FIG. 73, a side perspective view of the heat sink assembly 110 depicted in FIGS. 68-69 is shown. With the exception of aperture 1224, this embodiment is identical to the embodiment depicted in FIG. 61.

Figure 74:
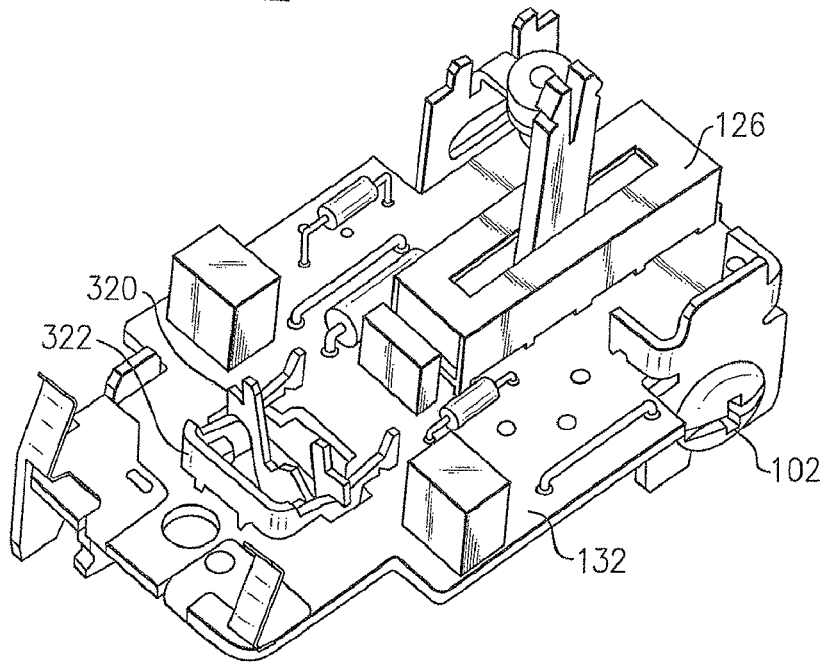
FIG. 74 is a perspective view of a portion of the printed circuit board assembly depicted in FIG. 63.

Referring to FIG. 74, a detail perspective view of the printed circuit board assembly employed in the embodiment of FIG. 68. FIG. 74 shows in pivot member 320 disposed in the cradle member 322. Cradle member 322 is fastened to printed circuit board 132. Cradle member 322 allows pivot member 320 to rotate the switch between the ON/OFF positions. Pivot member 320 and cradle member 322 are electrically conductive. The terminal 102 may be connected to the cradle by way of a printed circuit board trace.

The printed circuit board 132 also accommodates most of the other electrically active components in device 100 including potentiometer 126, switch 128, the series pass element Q1, and electrical components coupled to the series pass element. Other electrical components mounted to the circuit board 132 include surface mount components disposed on one or both sides of printed circuit board 132, and/or leaded (through hole) components.

Figure 75:
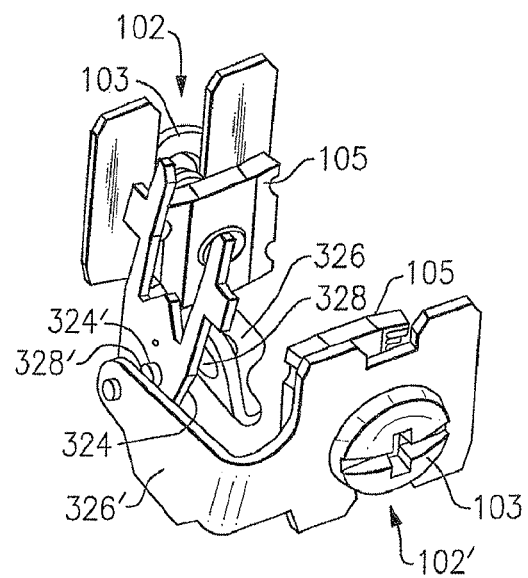
FIG. 75 is a detail view of the paddle switch mechanism depicted in FIG. 63.

FIG. 75 is a detail view of the paddle switch mechanism shown in FIG. 74 is disclosed. In particular, FIG. 75 shows the connectivity between pivot member 320 and the terminals 102, 102'. While pivot 320 is disposed within the device body, the terminal members 102, 102' and/or pressure plates 105 are disposed on either side of device 100 and accessible to the user. Each of the terminals 102, 102' include arms 326, 326' that extend perpendicularly into the interior of device 100. Each arm 326, 326' includes a fixed contact 328, 328' that is aligned with a movable contact 324, 324' disposed on pivot member 320. Of course, contact 324 is hidden behind member 320 in the view provided by FIG. 75. Pivot member 320 rotates between arm 326 and arm 326' depending on which raised surface 302, 302' on switch 300 is depressed.

Electrical contacts (324, 328) may not be necessary for pre-set switches since they are typically rated about 8 Amperes or less. Electrical connectivity between the common terminal and one or the other of the stationary terminals relies on contact between a surface of one or the other arm 326 and pivot member 322. Such surfaces may be plated surfaces, e.g. plated silver surfaces.

Figure 76:
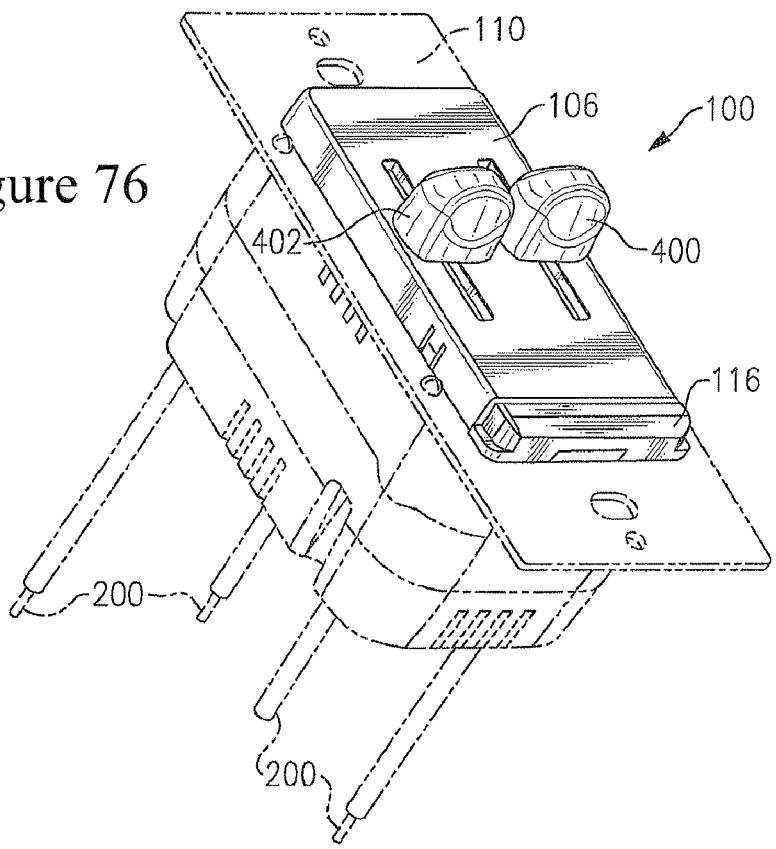
FIG. 76 is a perspective view of a power control device in accordance with a fourth embodiment of the present invention.

As embodied herein and depicted in FIG. 76, a perspective view of a fourth embodiment of the present invention is shown. Device 100 includes two independently operable control knobs 400, 402. Thus, power control device 100 may be employed to operate two dimmers, a fan speed control and a dimmer, a heating control and a dimmer, among other combinations. Device 100 may be equipped with two triacs thermally coupled to heat sink 110.

Figure 77:
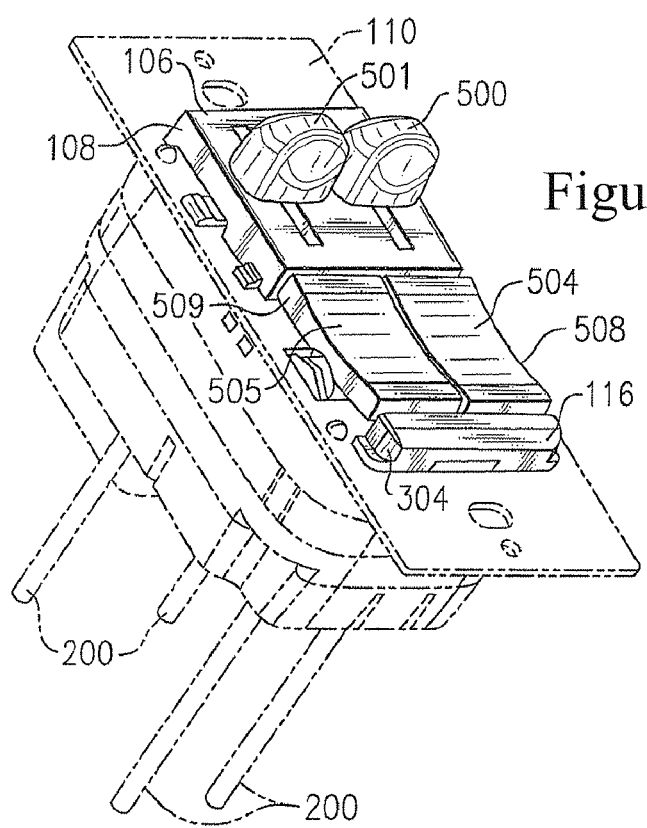
FIG. 77 is a perspective view of a power control device in accordance with a fifth embodiment of the present invention.

As embodied herein and depicted in FIG. 77, a perspective view of a fifth embodiment of the present invention is shown. In this embodiment, device 100 includes two sets of power controls. The first set includes adjustable control knob 500 and its corresponding preset switch 504. The second combination includes control knob 501 and its corresponding preset switch 505. In one embodiment, control knob 500 is configured as be actuated between multiple discrete positions. For example, control knob 500 may be moved between three fan speeds. Of course, those of ordinary skill in the art will understand that switch 500 may also be configured as a five speed control mechanism. Paddle switch 504 is the preset switch and is actuated between the ON and the OFF position. Control knob 501 may be employed as a control mechanism for a continuously variable dimmer switch. Corresponding paddle switch 505 is also a preset switch and turns the dimmer circuit ON/OFF. Those of ordinary skill in the art will understand that device 100 may be suitable for controlling two dimmers, a fan speed control and a dimmer, a heating control and a dimmer, or other such device combinations and pairings. In one embodiment, device 100 is equipped with two triacs thermally coupled to heat sink 110.

In another embodiment of the present invention, paddle switches 504 and 505 are decoupled from control knobs 500 and 501, respectively. Thus, device 100 may be configured to control two, three, or four individual electrical loads depending on whether the paddles switches (504, 505) are placed in series with their corresponding variably adjustable switch (500, 501). As used herein, the term "general purpose switch" is used to describe a switch that is coupled to an electrical load that is not coupled to the power controller. A power control device may include one or more of general purpose switches, preset switches, or control switches. These switch types may also be employed in combination as required.

This embodiment is also equipped with a light module, a removable light module, or a blank member, each designated as reference element 116 in the Figures. The raised form factor of module 116, switches 504, 505, and switch cover 106 are configured to provide an alignment during cover plate installation in the manner previously described.

Figure 78:
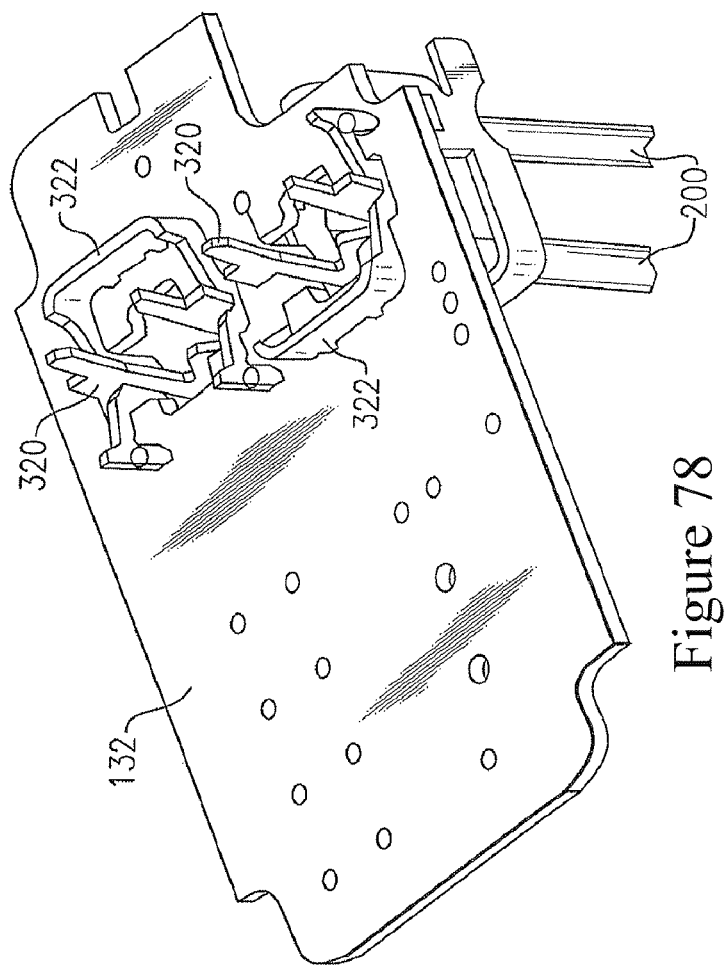
FIG. 78 is a perspective view of a portion of the printed circuit board assembly of the device depicted in FIG. 77.
Figure 79:
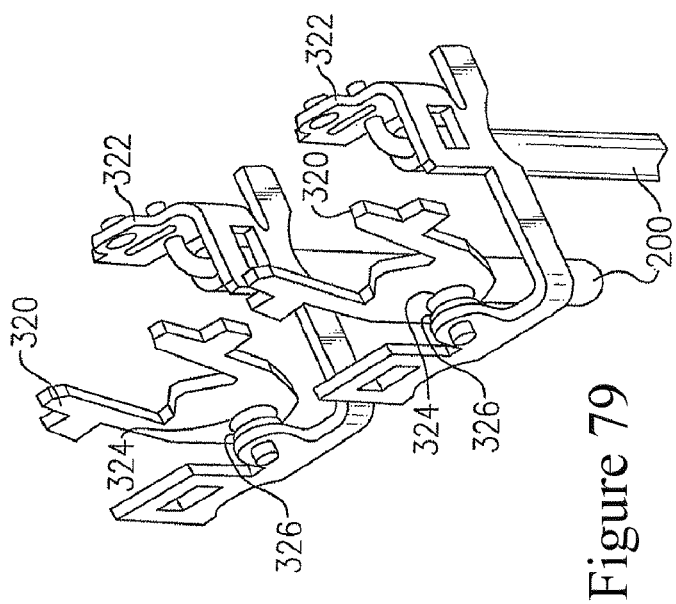
FIG. 79 is a detail view of the paddle switch mechanism depicted in FIG. 78.

FIGS. 78-79 are detail views of the dual switch embodiment depicted in FIG. 77. FIG. 78 depicts the printed circuit board detail whereas FIG. 79 shows the dual switch details. In this embodiment there is only a single stationary terminal associated with each switch, i.e., both switches are on-off (single pole-single throw) switches. The switch is connected to a circuit during installation by way of wire leads 200 instead of by way of screw terminals. In an alternate embodiment (not shown) pivot members 320 are disposed within a single, unified cradle 322'. The terminal connected to the unified cradle is common to the two switches. In an alternate embodiment, at least one of the switches is a three-way switch.

Figure 80:
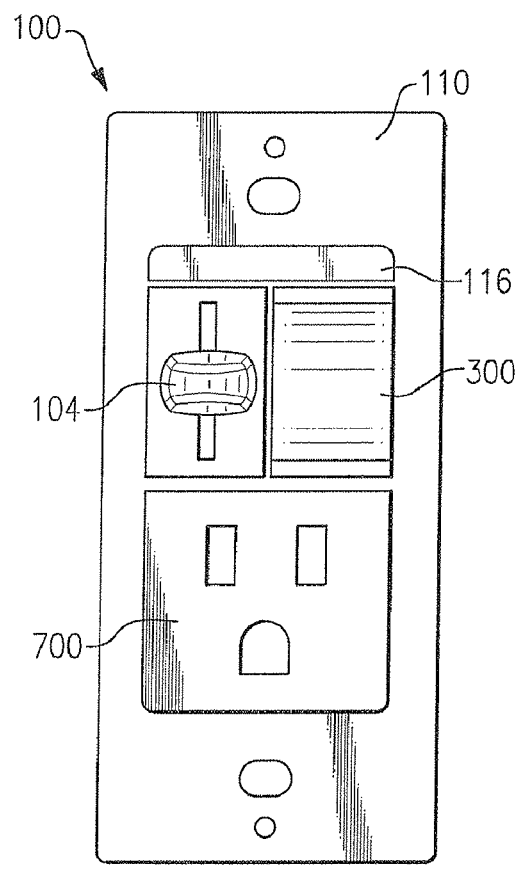
FIG. 80 is a plan view of a power control device in accordance with a sixth embodiment of the of the present invention.

As embodied herein and depicted in FIG. 80, a plan view of a sixth embodiment of the power control device of the present invention is shown. This embodiment is similar to previous embodiments, except that a receptacle outlet 700 is included in the lower portion of the device 100. Receptacle outlet 700 is coupled to the source voltage. Receptacle outlet 700 includes electrical contacts configured to permit electrical engagement of a plug by a user that in turn provides power to a user attachable load. Switch 300 may be wired as a preset switch, a switch wired to an independent load, or as a switch in series with the receptacle outlet 700. Modular lamp assembly 116 is included in device 100. As mentioned above, module 116 may be configured as a pilot light, a locator light, a night light, or to perform any of the other previously described light module functions.

Figure 81:
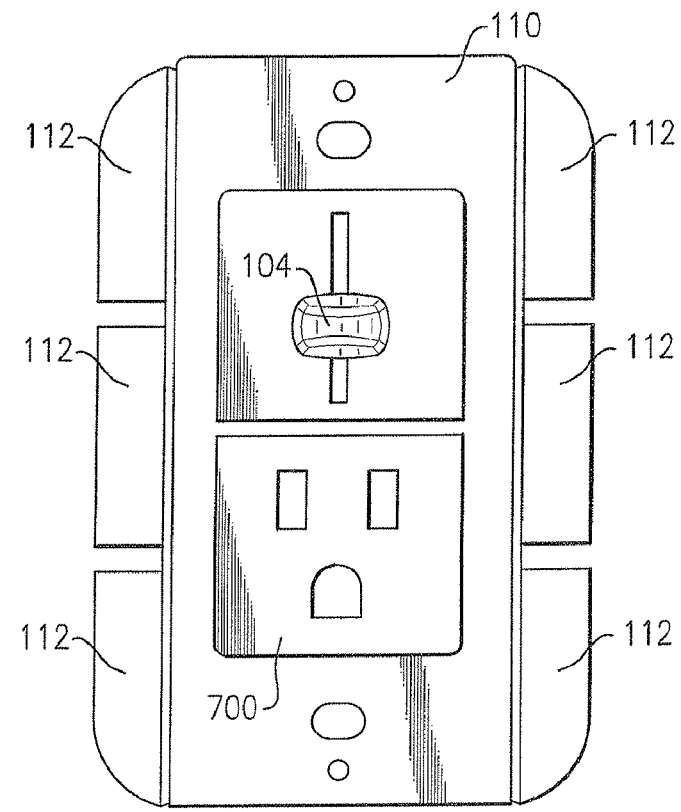
FIG. 81 is a plan view of a power control device in accordance with a seventh embodiment of the present invention.

Referring to FIG. 81, a plan view of a seventh embodiment of the power control device of the present invention is shown. This embodiment is similar to the embodiment shown in FIG. 76 except that switch 300 and modular lamp assembly 116 have been omitted and heat sink tabs 112 have been included.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electrical wiring system configured to be connected to a plurality of AC electric power conducting wires disposed between an AC power distribution point and a device box, the plurality of AC electric power conducting wires being accessible from an open front face of the device box after a rough-in installation phase, the system comprising:

a plug connector assembly including a connector housing having a predetermined form factor, the plug connector housing including a plurality of plug connector contacts connected to a plurality of termination wire segments, each termination wire segment of the plurality of termination wire segments including a first wire segment portion coupled to a corresponding plug contact of the plurality of plug contacts and a second unterminated wire segment portion extending from the connector housing, each second unterminated wire segment portion of the plurality of termination wire segments being configured to be terminated to a corresponding one of the plurality of AC electric power transmitting wires after the rough-in installation phase; and an electrical wiring device comprising, a device housing including a cover member and at least one back body member, the cover member including a front major surface having at least one set of receptacle openings disposed therein, the at least one back body member including a rear major surface having an opening disposed in a portion thereof to form a power input receptacle configured to accommodate the plug connector housing, the at least one back body member also including a seating portion such that a planar region is substantially disposed between the seating portion and the rear major surface, the planar region being substantially parallel to the rear major surface, the at least one back body member further including at least one AC circuit compartment substantially disposed in planar region, a ground strap assembly including a mounting portion configured for attachment of the electrical wiring device to the device box, the seating portion accommodating at least a portion of the mounting portion, the ground strap assembly further comprising at least one output ground contact and an input ground contact, and an AC circuit assembly being substantially disposed in the at least one AC circuit compartment and configured to detect at least one fault condition, the AC circuit assembly being coupled to a plurality of input contacts including the input ground contact being disposed in the power input receptacle and a plurality of output contacts including the at least one output ground contact being accessible via the at least one set of receptacle openings, the plurality of power input contacts being configured to mate with the plurality of plug connector contacts when the connector housing is inserted into the power input receptacle such that electrical continuity is established between the AC power distribution point and the plurality of output contacts in a first state, the electrical continuity being interrupted in a second state.

2. The system of claim 1, wherein the AC circuit assembly is configured to detect a ground fault, an arc fault or a grounded neutral condition.

3. The system of claim 1, wherein the front major surface includes a test button, a reset button and an indicator element disposed in a recessed region adjacent the at least one set of receptacle openings.

4. The system of claim 1, wherein the AC circuit assembly further comprises:

a toroidal sensor assembly coupled to the plurality of input contacts, the toroidal sensor being configured to generate a sensor signal indicative of a ground fault or a grounded neutral condition;

a fault detection circuit coupled to the toroidal sensor assembly, the fault detection circuit being configured to generate a fault detection signal when the sensor signal exceeds a predetermined threshold;

an actuator assembly configured to generate an actuator output in response to the fault detection signal; and a circuit interrupter configured to provide electrical continuity between the plurality of input contacts and the plurality of output contacts in the first state and interrupt electrical continuity between the plurality of power input contacts and the plurality of output contacts in the second state, the circuit interrupter being driven into the second state in response to the actuator output.

5. The system of claim 1, wherein the at least one back body member further includes at least one electrically isolating wall, the electrically isolating wall comprising a portion of the AC circuit compartment.

6. The system of claim 5, wherein the at least one electrically isolating wall electrically isolates the AC circuit assembly from the ground strap assembly.

7. The system of claim 5, wherein the at least one electrically isolating wall electrically isolates the AC circuit assembly from the power input receptacle.

8. The system of claim 1, wherein a portion of the AC circuit assembly is disposed on a printed circuit board, the printed circuit board being disposed in the planar region, the planar region also being intersected by the plurality of input contacts.

9. The system of claim 8, wherein the portion of the AC circuit assembly includes a fault detection circuit, a solenoid assembly, and at least a portion of a circuit interrupter mounted thereon, the plurality of input contacts being disposed adjacent the printed circuit board.

10. The system of claim 1, wherein the plurality of termination wire segments are substantially parallel to the rear major surface when the connector housing is inserted into the power input receptacle.

11. The system of claim 1, wherein the at least one back body member includes a separator member, the seating portion being formed in the separator member.

12. An electrical wiring system configured to be connected to a plurality of AC electric power conducting wires disposed between an AC power distribution point and a device box, the plurality of AC electric power conducting wires being accessible from an open front face of the device box after a rough-in installation phase, the system comprising:
a plug connector assembly including a connector housing having a predetermined form factor, the plug connector housing including a plurality of plug connector contacts connected to a plurality of termination wire segments, each termination wire segment of the plurality of termination wire segments including a first wire segment portion coupled to a corresponding plug contact of the plurality of plug contacts and a second unterminated wire segment portion extending from the connector housing, each second unterminated wire segment portion of the plurality of termination wire segments being configured to be terminated to a corresponding one of the plurality of AC electric power transmitting wires after the rough-in installation phase; and
an electrical wiring device comprising,
a device housing including a cover member and at least one back body member, the cover member including a front major surface having at least one set of receptacle openings disposed therein, the at least one back body member including a rear major surface having a portion thereof arranged to form a power input receptacle in accordance with the predetermined form factor and configured to accommodate the plug connector housing, the at least one back body member also including a seating portion such that a planar region is substantially disposed between the seating portion and the rear major surface, the planar region being substantially parallel to the rear major surface, the at least one back body member further including at least one AC circuit compartment substantially disposed in the planar region,
a ground strap assembly including a mounting portion configured for attachment of the electrical wiring device to the device box, the seating portion accommodating at least a portion of the mounting portion, the ground strap assembly further comprising at least one output ground contact and an input ground contact, and
an AC circuit assembly substantially disposed in the at least one AC circuit compartment, the AC circuit assembly being coupled to a plurality of input contacts including the input ground contact being disposed in the power input receptacle and a plurality of output contacts including the at least one output ground contact being accessible via the at least one set of receptacle openings, the plurality of input contacts and the plurality of output contacts being substantially disposed in the planar region, the plurality of power input contacts being configured to mate with the plurality of plug connector contacts when the connector housing is inserted into the power input receptacle such that electrical continuity is established between the AC power distribution point and the plurality of output contacts in a first state and AC power is propagated from the plurality of power input contacts to the plurality of power output contacts, the electrical continuity being interrupted in a second state.

13. The system of claim 12, wherein the AC circuit assembly is configured to detect a ground fault, an arc fault or a grounded neutral condition.

14. The system of claim 12, wherein the front major surface includes a test button and a reset button adjacent the at least one set of receptacle openings.

15. The system of claim 12, wherein the AC circuit assembly further comprises:
a toroidal sensor assembly coupled to the plurality of input contacts, the toroidal sensor being configured to generate a sensor signal indicative of a ground fault or a grounded neutral condition;
a fault detection circuit coupled to the toroidal sensor assembly, the fault detection circuit being configured to generate a fault detection signal when the sensor signal exceeds a predetermined threshold;
an actuator assembly configured to generate an actuator output in response to the fault detection signal; and
a circuit interrupter configured to provide electrical continuity between the plurality of input contacts and the plurality of output contacts in the first state and interrupt electrical continuity between the plurality of input contacts and the plurality of output contacts in the second state, the circuit interrupter being driven into the second state in response to the actuator output.

16. The system of claim 12, wherein a portion of the AC circuit assembly is disposed on a printed circuit board, the printed circuit board being disposed in the planar region, the planar region also being intersected by the plurality of input contacts.

17. The system of claim 12, wherein the plurality of termination wire segments are substantially parallel to the rear major surface when the connector housing is inserted into the power input receptacle.

18. The system of claim 12, wherein the electrical continuity is interrupted when the connector housing is removed from the power input receptacle.

19. The system of claim 12, wherein the AC circuit assembly, a portion of the plurality of input contacts and a portion of the plurality of output contacts comprise a plurality of integrally formed conductive elements.

20. The system of claim 19, wherein the plurality of integrally formed conductive elements includes a hot integrally formed conductive element and a neutral integrally formed conductive element.

21. The system of claim 19, wherein each of the plurality of integrally formed conductive elements includes an output contact of the plurality of output contacts and an input contact of the plurality of input contacts.

22. The system of claim 12, wherein the ground strap assembly includes an interior ground strap portion that is electrically insulated relative to the AC electric circuit assembly.

23. The system of claim 22, wherein a portion of the ground strap assembly is adjacent the rear major surface.

24. An electrical wiring system configured to be connected to a plurality of AC electric power conducting wires disposed between an AC power distribution point and a device box, the plurality of AC electric power conducting wires being accessible from an open front face of the device box after a rough-in installation phase, the system comprising:

a connector assembly including a connector housing having a predetermined form factor, the connector housing including a plurality of connector contacts connected to a plurality of termination wire segments, each termination wire segment of the plurality of termination wire segments including a first wire segment portion coupled to a corresponding plug contact of the plurality of connector contacts and a second unterminated wire segment portion extending from the connector housing, each second unterminated wire segment portion of the plurality of termination wire segments being configured to be terminated to a corresponding one of the plurality of AC electric power transmitting wires after the rough-in installation phase; and an electrical wiring device comprising, a device housing including a cover member and at least one back body member, the cover member including a front major surface having at least one set of receptacle openings disposed therein, the at least one back body member including a rear major surface having a portion thereof arranged in accordance with the predetermined form factor to form a power input receptor to mate with the connector housing, the at least one back body member also including a seating portion such that a planar region is substantially disposed between the seating portion and the rear major surface, the planar region being substantially parallel to the rear major surface, the at least one back body member further including at least one AC circuit compartment substantially disposed in the planar region, a ground strap assembly including a mounting portion configured to attach the electrical wiring device to the device box, the seating portion accommodating at least a portion of the ground strap assembly, the ground strap assembly further comprising at least one output ground contact and an input ground contact, and an AC circuit assembly being substantially disposed in the at least one AC circuit compartment and configured to detect at least one fault condition, the AC circuit assembly being coupled to a plurality of input contacts including the input ground contact being disposed in the power input receptacle and a plurality of output contacts including the at least one output ground contact being accessible via the at least one set of receptacle openings, the plurality of input contacts being configured to mate with the plurality of plug connector contacts when the connector housing is mated with the power input receptor such that electrical continuity is established between the AC power distribution point and the plurality of output contacts in a reset state, the electrical continuity being interrupted in a tripped state.

25. The system of claim 24, wherein the AC circuit assembly is configured to detect a ground fault, an arc fault or a grounded neutral condition.

26. The system of claim 24, wherein the AC circuit assembly further comprises:
 a toroidal sensor assembly coupled to the plurality of input contacts;
 a fault detection circuit coupled to the toroidal sensor assembly;
 an actuator assembly coupled to the fault detection circuit; and
 a circuit interrupter responsive to the actuator assembly.

27. The system of claim 24, wherein a portion of the AC circuit assembly is disposed on a printed circuit board, the printed circuit board being disposed in the planar region, the planar region also being intersected by the plurality of input contacts.

28. The system of claim 24, wherein the plurality of termination wire segments are substantially parallel to the rear major surface when the connector housing is inserted into the power input receptor.

29. The system of claim 24, wherein the at least one back body member includes a separator portion that includes at least a portion of the seating portion.

30. The system of claim 29, wherein a portion of the ground strap assembly extends between the cover member and the separator portion such that the seating portion accommodates the ground strap assembly along a central longitudinal axis of the electrical wiring device.

31. The system of claim 24, wherein the at least one back body member further includes at least one electrically isolating wall, the electrically isolating wall comprising a portion of the AC circuit compartment.

32. The system of claim 31, wherein the at least one electrically isolating wall electrically isolates the AC circuit assembly from the ground strap assembly.

33. The system of claim 31, wherein the at least one electrically isolating wall electrically isolates the AC circuit assembly from the power input receptor.

34. The system of claim 24, wherein a portion of the AC circuit assembly is disposed on a printed circuit board, the printed circuit board being disposed in the planar region, the planar region also being intersected by the plurality of input contacts.

35. The system of claim 24, wherein the input ground contact is substantially aligned with at least one central major axis of the device housing.

36. The system of claim 24, wherein the unterminated wire segment portions exit the connector housing in a direction substantially parallel to the rear major surface of the back body member when the connector housing is inserted into the power input receptor.

* * * * *